United States Patent
Wang et al.

(10) Patent No.: US 7,075,186 B1
(45) Date of Patent: *Jul. 11, 2006

(54) SEMICONDUCTOR CHIP ASSEMBLY WITH INTERLOCKED CONTACT TERMINAL

(75) Inventors: Chia-Chung Wang, Hsinchu (TW); Charles W. C. Lin, Singapore (SG)

(73) Assignee: Bridge Semiconductor Corporation, Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/137,960

(22) Filed: May 26, 2005

Related U.S. Application Data

(60) Continuation-in-part of application No. 10/994,604, filed on Nov. 22, 2004, which is a continuation-in-part of application No. 10/922,280, filed on Aug. 19, 2004, which is a continuation-in-part of application No. 10/307,218, filed on Nov. 29, 2002, now Pat. No. 6,809,414, which is a division of application No. 09/997,973, filed on Nov. 29, 2001, now Pat. No. 6,492,252, which is a continuation-in-part of application No. 09/917,339, filed on Jul. 27, 2001, now Pat. No. 6,537,851, which is a continuation-in-part of application No. 09/878,626, filed on Jun. 11, 2001, now Pat. No. 6,653,217, which is a continuation-in-part of application No. 09/687,619, filed on Oct. 13, 2000, now Pat. No. 6,440,835, said application No. 10/994,604 , said application No. 10/922,280.

(60) Provisional application No. 60/523,566, filed on Nov. 20, 2003, provisional application No. 60/497,672, filed on Aug. 25, 2003, provisional application No. 60/497,425, filed on Aug. 22, 2003.

(51) Int. Cl.
*H01L 23/48* (2006.01)

(52) U.S. Cl. ............... 257/779; 257/780; 257/787
(58) Field of Classification Search ........ 257/734–738, 257/772–787
See application file for complete search history.

(56) References Cited

U.S. PATENT DOCUMENTS

| | | | |
|---|---|---|---|
| 4,442,967 A | 4/1984 | van de Pas et al. | 228/159 |
| 4,661,192 A | 4/1987 | McShane | 156/292 |
| 4,717,066 A | 1/1988 | Goldenberg et al. | 228/179 |
| 4,750,666 A | 6/1988 | Neugebauer et al. | 228/160 |
| 4,807,021 A | 2/1989 | Okumura | 357/75 |
| 4,925,083 A | 5/1990 | Farassat et al. | 228/102 |
| 4,937,653 A | 6/1990 | Blonder et al. | 357/68 |
| 4,955,523 A | 9/1990 | Calomagno et al. | 228/179 |
| 4,970,571 A | 11/1990 | Yamakawa et al. | 357/71 |

(Continued)

FOREIGN PATENT DOCUMENTS

EP    0 718 882 A1    6/1996

(Continued)

OTHER PUBLICATIONS

Markstein et al., "Controlling the Variables in Stencil Printing," Electronic Packaging & Production, Feb. 1997, pp. 48-56.

(Continued)

*Primary Examiner*—David Nelms
*Assistant Examiner*—Quoc Hoang
(74) *Attorney, Agent, or Firm*—David M. Sigmond

(57) ABSTRACT

A semiconductor chip assembly includes a semiconductor chip that includes a conductive pad, a conductive trace that includes a routing line, a metal pillar and a contact terminal, a connection joint that electrically connects the routing line and the pad, and an encapsulant. The contact terminal includes a body and a flange that contact the metal pillar and are spaced from the routing line.

60 Claims, 43 Drawing Sheets

U.S. PATENT DOCUMENTS

| | | | |
|---|---|---|---|
| 4,984,358 A | 1/1991 | Nelson | 29/830 |
| 5,014,111 A | 5/1991 | Tsuda et al. | 357/68 |
| 5,060,843 A | 10/1991 | Yasuzato et al. | 228/179 |
| 5,074,947 A | 12/1991 | Estes et al. | 156/307.3 |
| 5,090,119 A | 2/1992 | Tsuda et al. | 29/843 |
| 5,106,461 A | 4/1992 | Volfson et al. | 205/125 |
| 5,116,463 A | 5/1992 | Lin et al. | 156/653 |
| 5,137,845 A | 8/1992 | Lochon et al. | 437/183 |
| 5,167,992 A | 12/1992 | Lin et al. | 427/437 |
| 5,172,851 A | 12/1992 | Matsushita et al. | 228/179 |
| 5,196,371 A | 3/1993 | Kulesza et al. | 437/183 |
| 5,209,817 A | 5/1993 | Ahmad et al. | 156/643 |
| 5,237,130 A | 8/1993 | Kulesza et al. | 174/260 |
| 5,260,234 A | 11/1993 | Long | 437/203 |
| 5,261,593 A | 11/1993 | Casson et al. | 228/180.22 |
| 5,275,330 A | 1/1994 | Issacs et al. | 228/180.2 |
| 5,284,796 A | 2/1994 | Nakanishi et al. | 437/183 |
| 5,293,067 A | 3/1994 | Thompson et al. | 257/668 |
| 5,294,038 A | 3/1994 | Nakano et al. | 228/179.1 |
| 5,327,010 A | 7/1994 | Uenaka et al. | 257/679 |
| 5,334,804 A | 8/1994 | Love et al. | 174/267 |
| 5,346,750 A | 9/1994 | Hatakeyama et al. | 428/209 |
| 5,355,283 A | 10/1994 | Marrs et al. | 361/760 |
| 5,358,621 A | 10/1994 | Oyama | 205/123 |
| 5,364,004 A | 11/1994 | Davidson | 228/1.1 |
| 5,397,921 A | 3/1995 | Karnezos | 257/779 |
| 5,407,864 A | 4/1995 | Kim | 437/203 |
| 5,424,245 A | 6/1995 | Gurtler et al. | 437/183 |
| 5,438,477 A | 8/1995 | Pasch | 361/689 |
| 5,439,162 A | 8/1995 | George et al. | 228/180.22 |
| 5,447,886 A | 9/1995 | Rai | 437/183 |
| 5,454,161 A | 10/1995 | Beilin et al. | 29/852 |
| 5,454,928 A | 10/1995 | Rogers et al. | 205/125 |
| 5,475,236 A | 12/1995 | Yoshizaki | 257/48 |
| 5,477,933 A | 12/1995 | Nguyen | 174/262 |
| 5,478,007 A | 12/1995 | Marrs | 228/180.22 |
| 5,483,421 A | 1/1996 | Gedney et al. | 361/771 |
| 5,484,647 A | 1/1996 | Nakatani et al. | 428/209 |
| 5,485,949 A | 1/1996 | Tomura et al. | 228/180.5 |
| 5,487,218 A | 1/1996 | Bhatt et al. | 29/852 |
| 5,489,804 A | 2/1996 | Pasch | 257/778 |
| 5,493,096 A | 2/1996 | Koh | 219/121.71 |
| 5,508,229 A | 4/1996 | Baker | 437/183 |
| 5,525,065 A | 6/1996 | Sobhani | 439/67 |
| 5,536,973 A | 7/1996 | Yamaji | 257/737 |
| 5,542,601 A | 8/1996 | Fallon et al. | 228/119 |
| 5,547,740 A | 8/1996 | Higdon et al. | 428/209 |
| 5,556,810 A | 9/1996 | Fujitsu | 437/209 |
| 5,556,814 A | 9/1996 | Inoue et al. | 437/230 |
| 5,564,181 A | 10/1996 | Dineen et al. | 29/841 |
| 5,572,069 A | 11/1996 | Schneider | 257/690 |
| 5,576,052 A | 11/1996 | Arledge et al. | 427/98 |
| 5,583,073 A | 12/1996 | Lin et al. | 439/183 |
| 5,595,943 A | 1/1997 | Itabashi et al. | 437/230 |
| 5,599,744 A | 2/1997 | Koh et al. | 437/195 |
| 5,611,140 A | 3/1997 | Kulesza et al. | 29/832 |
| 5,611,884 A | 3/1997 | Bearinger et al. | 156/325 |
| 5,613,296 A | 3/1997 | Kurino et al. | 29/852 |
| 5,614,114 A | 3/1997 | Owen | 219/121.66 |
| 5,615,477 A | 4/1997 | Sweitzer | 29/840 |
| 5,619,791 A | 4/1997 | Lambrecht, Jr. et al. | 29/852 |
| 5,627,405 A | 5/1997 | Chillara | 257/668 |
| 5,627,406 A | 5/1997 | Pace | 257/700 |
| 5,633,204 A | 5/1997 | Tago et al. | 438/614 |
| 5,637,920 A | 6/1997 | Loo | 257/700 |
| 5,641,113 A | 6/1997 | Somaki et al. | 228/180.22 |
| 5,645,628 A | 7/1997 | Endo et al. | 106/1.23 |
| 5,646,067 A | 7/1997 | Gaul | 437/180 |
| 5,648,686 A | 7/1997 | Hirano et al. | 257/778 |
| 5,654,584 A | 8/1997 | Fujitsu | 257/666 |
| 5,656,858 A | 8/1997 | Kondo et al. | 257/737 |
| 5,663,598 A | 9/1997 | Lake et al. | 257/737 |
| 5,665,652 A | 9/1997 | Shimizu | 438/127 |
| 5,666,008 A | 9/1997 | Tomita et al. | 257/778 |
| 5,669,545 A | 9/1997 | Pham et al. | 228/1.1 |
| 5,674,785 A | 10/1997 | Akram et al. | 437/217 |
| 5,674,787 A | 10/1997 | Zhao et al. | 437/230 |
| 5,677,566 A | 10/1997 | King et al. | 257/666 |
| 5,682,061 A | 10/1997 | Khandros et al. | 257/666 |
| 5,686,353 A | 11/1997 | Yagi et al. | 437/183 |
| 5,691,041 A | 11/1997 | Frankeny et al. | 428/209 |
| 5,722,162 A | 3/1998 | Chou et al. | 29/852 |
| 5,723,369 A | 3/1998 | Barber | 438/106 |
| 5,731,223 A | 3/1998 | Padmanabhan | 437/183 |
| 5,736,456 A | 4/1998 | Akram | 438/614 |
| 5,739,585 A | 4/1998 | Akram et al. | 257/698 |
| 5,744,827 A | 4/1998 | Jeong et al. | 257/686 |
| 5,744,859 A | 4/1998 | Ouchida | 257/668 |
| 5,757,071 A | 5/1998 | Bhansali | 257/697 |
| 5,757,081 A | 5/1998 | Chang et al. | 257/778 |
| 5,764,486 A | 6/1998 | Pendse | 361/774 |
| 5,774,340 A | 6/1998 | Chang et al. | 361/771 |
| 5,789,271 A | 8/1998 | Akram | 438/18 |
| 5,798,285 A | 8/1998 | Bentlage et al. | 438/108 |
| 5,801,072 A | 9/1998 | Barber | 438/107 |
| 5,801,447 A | 9/1998 | Hirano et al. | 257/778 |
| 5,803,340 A | 9/1998 | Yeh et al. | 228/56.3 |
| 5,804,771 A | 9/1998 | McMahon et al. | 174/255 |
| 5,808,360 A | 9/1998 | Akram | 257/738 |
| 5,811,879 A | 9/1998 | Akram | 257/723 |
| 5,813,115 A | 9/1998 | Misawa et al. | 29/832 |
| 5,817,541 A | 10/1998 | Averkiou et al. | 438/107 |
| 5,822,856 A | 10/1998 | Bhatt et al. | 29/832 |
| 5,834,844 A | 11/1998 | Akagawa et al. | 257/734 |
| 5,854,507 A | 12/1998 | Miremadi et al. | 257/686 |
| 5,861,666 A | 1/1999 | Bellar | 257/686 |
| 5,863,816 A | 1/1999 | Cho | 438/123 |
| 5,870,289 A | 2/1999 | Tokuda et al. | 361/779 |
| 5,872,399 A | 2/1999 | Lee | 257/738 |
| 5,883,435 A | 3/1999 | Geffken et al. | 257/758 |
| 5,925,931 A | 7/1999 | Yamamoto | 257/737 |
| 5,973,393 A | 10/1999 | Chia et al. | 257/690 |
| 5,994,222 A | 11/1999 | Smith et al. | 438/689 |
| 6,001,671 A | 12/1999 | Fjelstad | 438/112 |
| 6,012,224 A | 1/2000 | DiStefano et al. | 29/840 |
| 6,013,877 A | 1/2000 | Degani et al. | 174/264 |
| 6,017,812 A | 1/2000 | Yonezawa et al. | 438/613 |
| 6,018,196 A | 1/2000 | Noddin | 257/777 |
| 6,020,561 A | 2/2000 | Ishida et al. | 174/261 |
| 6,025,650 A | 2/2000 | Tsuji et al. | 257/786 |
| 6,037,665 A | 3/2000 | Miyazaki | 257/773 |
| 6,046,909 A | 4/2000 | Joy | 361/748 |
| 6,072,233 A | 6/2000 | Corisis et al. | 257/686 |
| 6,084,297 A | 7/2000 | Brooks et al. | 257/698 |
| 6,084,781 A | 7/2000 | Klein | 361/771 |
| 6,088,236 A | 7/2000 | Tomura et al. | 361/783 |
| 6,103,552 A | 8/2000 | Lin | 438/113 |
| 6,103,992 A | 8/2000 | Noddin | 219/121.71 |
| 6,127,204 A | 10/2000 | Isaacs et al. | 438/106 |
| 6,159,770 A | 12/2000 | Tetaka et al. | 438/112 |
| 6,180,881 B1 | 1/2001 | Isaak | 174/52.4 |
| 6,188,127 B1 | 2/2001 | Senba et al. | 257/686 |
| 6,218,728 B1 | 4/2001 | Kimura | 257/693 |
| 6,281,568 B1 | 8/2001 | Glenn et al. | 257/684 |
| 6,297,543 B1 | 10/2001 | Hong et al. | 257/666 |
| 6,303,997 B1 | 10/2001 | Lee | 257/778 |
| 6,468,836 B1 | 10/2002 | Destefano et al. | 438/128 |
| 6,483,718 B1 | 11/2002 | Hashimoto | 361/803 |
| 6,492,252 B1 | 12/2002 | Lin et al. | 438/612 |
| 6,504,241 B1 | 1/2003 | Yanagida | 257/686 |
| 6,576,539 B1 | 6/2003 | Lin | 438/611 |
| 6,608,371 B1 | 8/2003 | Kurashima et al. | 257/686 |
| 6,653,217 B1 | 11/2003 | Lin | 438/612 |

FOREIGN PATENT DOCUMENTS

WO WO 97/38563 10/1997
WO WO 99/57762 11/1999

OTHER PUBLICATIONS

Elenius, "Choosing a Flip Chip Bumping Supplier—Technology an IC Package contractor should look for," Advanced Packaging, Mar./Apr. 1998, pp. 70-73.

Erickson, "Wafer Bumping: The Missing Link for DCA," Electronic Packaging & Production, Jul. 1998, pp. 43-46.

Kuchenmeister et al., "Film Chip Interconnection Systems Prepared By Wet Chemical Metallization," IEEE publication 0-7803-4526, Jun. 1998, 5 pages.

Ghaffarian, "Long Time BGA Assembly Reliability," Advancing Microelectronics, vol. 25, No. 6, Sep./Oct. 1998, pp. 20-23.

U.S. Appl. No. 09/465,024, filed Dec. 16, 1999, entitled "Bumpless Flip Chip Assembly With Solder Via".

U.S. Appl. No. 09/464,562, filed Dec. 16, 1999, entitled "Bumpless Flip Chip Assembly With Strips and Via-Fill".

U.S. Appl. No. 09/464,561, filed Dec. 16, 1999, entitled "Bumpless Flip Chip Assembly With Strips-In-Via And Plating".

U.S. Appl. No. 09/120,408, filed Jul. 22, 1998, entitled "Flip Chip Assembly With Via Interconnection".

U.S. Appl. No. 09/643,212, filed Aug. 22, 2000, entitled "Semiconductor Chip Assembly With Simultaneously Electroplated Contact Terminal and Connection Joint".

U.S. Appl. No. 09/643,214, filed Aug. 22, 2000, entitled "Semiconductor Chip Assembly with Simultaneously Electrolessly Plated Contact Terminal and Connection Joint".

U.S. Appl. No. 09/643,213, filed Aug. 22, 2000, entitled "Method Of Making A Support Circuit For A Semiconductor Chip Assembly".

U.S. Appl. No. 09/643,445, filed Aug. 22, 2000, entitled "Method Of Making A Semiconductor Chip Assembly".

U.S. Appl. No. 09/665,928, filed Sep. 20, 2000, entitled "Semiconductor Chip Assembly With Ball Bond Connection Joint".

U.S. Appl. No. 09/665,931, filed Sep. 20, 2000, entitled "Method Of Making A Support Circuit With A Tapered Through-Hole For A Semiconductor Chip Assembly".

U.S. Appl. No. 09/677,207, filed Oct. 2, 2000, entitled "Method Of Making A Semiconductor Chip Assembly With A Conductive Trace Subtractively Formed Before And After Chip Attachment".

U.S. Appl. No. 09/865,367, filed May 24, 2001, entitled "Semiconductor Chip Assembly With Simultaneously Electroplated Contact Terminal and Connection Joint".

U.S. Appl. No. 09/864,555, filed May 24, 2001, entitled "Semiconductor Chip Assembly with Simultaneously Electrolessly Plated Contact Terminal and Connection Joint".

U.S. Appl. No. 09/864,773, filed May 24, 2001, entitled "Semiconductor Chip Assembly With Ball Bond Connection Joint".

U.S. Appl. No. 10/714,794, filed Nov. 17, 2003, entitled "Semiconductor Chip Assembly With Embedded Metal Pillar".

U.S. Appl. No. 10/356,800, filed Feb. 1, 2003, entitled "Method of Connecting an Additively and Subtractively Formed Conductive Trace and an Insulative Base to a Semiconductor Chip".

U.S. Appl. No. 10/403,736, filed Mar. 31, 2003, entitled "Method of Making a Semiconductor Chip Assembly with Simultaneously Formed Interconnect and Connection Joint".

U.S. Appl. No. 10/889,368, filed Jul. 8, 2004, entitled "Method of Making a Semiconductor Chip Assembly With a Pillar and a Routing Line using Multiple Etch Steps".

SEMICONDUCTOR CHIP ASSEMBLY WITH INTERLOCKED CONTACT TERMINAL

CROSS-REFERENCE TO RELATED APPLICATIONS

This application is a continuation-in-part of U.S. application Ser. No. 10/994,604 filed Nov. 22, 2004, which is a continuation-in-part of U.S. application Ser. No. 10/922,280 filed Aug. 19, 2004, which is a continuation-in-part of U.S. application Ser. No. 10/307,218 filed Nov. 29, 2002 now U.S. Pat. No. 6,809,414, which is a divisional of U.S. application Ser. No. 09/997,973 filed Nov. 29, 2001 now U.S. Pat. No. 6,492,252, which is a continuation-in-part of U.S. application Ser. No. 09/917,339 filed Jul. 27, 2001 now U.S. Pat. No. 6,537,851, which is a continuation-in-part of U.S. application Ser. No. 09/878,626 filed Jun. 11, 2001 now U.S. Pat. No. 6,653,217, which is a continuation-in-part of U.S. application Ser. No. 09/687,619 filed Oct. 13, 2000 now U.S. Pat. No. 6,440,835, each of which is incorporated by reference.

U.S. application Ser. No. 10/994,604 filed Nov. 22, 2004 also claims the benefit of U.S. Provisional Application Ser. No. 60/523,566 filed Nov. 20, 2003, which is incorporated by reference.

U.S. application Ser. No. 10/922,280 filed Aug. 19, 2004 also claims the benefit of U.S. Provisional Application Ser. No. 60/497,672 filed Aug. 25, 2003, and U.S. Provisional Application Ser. No. 60/497,425 filed Aug. 22, 2003, each of which is incorporated by reference.

BACKGROUND OF THE INVENTION

1. Field of the Invention

The present invention relates to a semiconductor chip assembly, and more particularly to a semiconductor chip assembly with a contact terminal and its method of manufacture.

2. Description of the Related Art

Semiconductor chips have input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flip-chip bonding.

The semiconductor chip assembly is subsequently connected to another circuit such as a printed circuit board (PCB) or mother board during next level assembly. Different semiconductor assemblies are connected to the next level assembly in different ways. For instance, ball grid array (BGA) packages contain an array of solder balls, and land grid array (LGA) packages contain an array of metal pads that receive corresponding solder traces on the PCB.

BGA packages typically have the solder balls fused on land metal elements such as nickel terminals. Since the solder balls are contact terminals to the next level assembly, the BGA package becomes degraded or inoperative when the solder balls separate from the land metal elements.

Conventional solder ball attachment techniques focus on allowing the solder ball to be easily fused on the land metal element. For instance, sequentially plating nickel and gold films on a smooth and flat surface of a land metal element allows the solder ball to be easily fused to the land metal element, however this does not avoid the solder ball separation problem.

Conventional solder ball attachment techniques also focus on contacting an insulator such as bismaleimide triazine epoxy to the solder ball in order to enhance the mechanical attachment of the solder ball. However, the solder ball easily separates from the epoxy as well as the land metal element.

In view of the various development stages and limitations in currently available semiconductor chip assemblies, there is a need for a semiconductor chip assembly that is cost-effective, reliable, manufacturable, versatile, provides a contact terminal with excellent mechanical and electrical properties, and makes advantageous use the particular connection joint technique best suited for a given application.

SUMMARY OF THE INVENTION

An object of the present invention is to provide a semiconductor chip assembly with a chip and a contact terminal that provides a low cost, high performance, high reliability package.

Another object of the present invention is to provide a convenient, cost-effective method for manufacturing a semiconductor chip assembly.

Generally speaking, the present invention provides a semiconductor chip assembly that includes a semiconductor chip that includes a conductive pad, a conductive trace that includes a routing line, a metal pillar and a contact terminal, a connection joint that electrically connects the routing line and the pad, and an encapsulant. The contact terminal includes a body and a flange that contact the metal pillar and are spaced from the routing line.

Generally speaking, the present invention also provides a method of making a semiconductor chip assembly that includes providing a metal base, a routing line and a pillar etch mask that extends into a trench, mechanically attaching a semiconductor chip to the routing line, forming a connection joint that electrically connects the routing line and the pad, etching the metal base to form a metal pillar with a tip adjacent to the trench, and providing a contact terminal that includes the pillar etch mask and is a permanent part of the assembly.

In accordance with an aspect of the invention, a semiconductor chip assembly includes (1) a semiconductor chip that includes first and second opposing surfaces, wherein the first surface of the chip includes a conductive pad, (2) a conductive trace that includes a routing line, a metal pillar and a contact terminal, wherein (A) the routing line extends laterally beyond the metal pillar and the contact terminal, (B) the metal pillar includes first and second opposing surfaces and sidewalls therebetween, the first surface of the metal pillar faces in a first direction and contacts and is non-integral with the routing line, the second surface of the metal pillar faces in a second direction opposite the first direction, is spaced from the routing line and contacts and is non-integral with the contact terminal, the sidewalls include first and second sidewall portions that are adjacent to one another, the first sidewall portion is adjacent to the first surface of the metal pillar, is spaced from the second surface of the metal pillar and extends vertically beyond the second sidewall portion in the first direction, and the second sidewall portion is adjacent to the second surface of the metal pillar, is spaced from the first surface of the metal pillar and extends vertically beyond the first sidewall portion in the second direction, and (C) the contact terminal includes a body and a flange and is spaced from the routing line, the first surface of the metal pillar and the first sidewall portion, the body contacts the second surface of the metal pillar, is spaced from the second sidewall portion, is adjacent to the flange, covers and extends vertically beyond the second surface of the metal pillar and the flange in the second direction and includes a solder surface that faces in the second direction, and the flange extends vertically beyond the body in the first direction, contacts and extends laterally beyond the second sidewall portion, is spaced from the second surface of the metal pillar and includes solder, (3) a connection joint that electrically connects the routing line and the pad, (4) an encapsulant, and (5) an insulative base, wherein the chip is embedded in the encapsulant, the metal pillar is embedded in the insulative base and extends vertically beyond the routing line in the second direction, the body is not covered in the second direction by any material of the assembly, the encapsulant contacts the chip and extends vertically beyond the routing line, the metal pillar, the contact terminal, the connection joint and the insulative base in the first direction, and the insulative base contacts the routing line, the metal pillar and the contact terminal, is overlapped by the chip, extends vertically beyond the contact terminal in the first direction and extends vertically beyond the chip, the routing line, the metal pillar, the flange, the connection joint and the encapsulant in the second direction.

The chip can be the only chip embedded in the encapsulant, or alternatively, multiple chips can be embedded in the encapsulant. The first surface of the chip can face in the first direction and the second surface of the chip can face in the second direction, or alternatively, the first surface of the chip can face in the second direction and the second surface of the chip can face in the first direction. The chip can extend vertically beyond the routing line, the metal pillar and the contact terminal in the first direction. The chip can also extend vertically beyond the conductive trace in the first direction. In addition, any chip embedded in the encapsulant can extend vertically beyond the conductive trace in the first direction.

The routing line can extend laterally beyond the metal pillar and the contact terminal towards the chip. The routing line can extend or be disposed vertically beyond the metal pillar and the contact terminal in the first direction, and can extend or be disposed vertically beyond the chip in the second direction. The routing line can extend within and outside the periphery of the chip, or alternatively, be disposed outside the periphery of the chip. The routing line can also be essentially flat and parallel to the first and second surfaces of the chip. Furthermore, the routing line can be in an electrically conductive path between the metal pillar and any chip embedded in the encapsulant, and between the contact terminal and any chip embedded in the encapsulant. That is, any chip embedded in the encapsulant can be electrically connected to the metal pillar and the contact terminal by an electrically conductive path that includes the routing line.

The metal pillar can extend or be disposed vertically beyond the chip, the routing line, the connection joint and the encapsulant in the second direction. The metal pillar can also be disposed within or outside the periphery of the chip. The metal pillar can include a spike that protrudes laterally from the metal pillar and is spaced from the first and second surfaces of the metal pillar, and the first and second sidewall portions can be adjacent to one another at the spike.

The metal pillar can have a generally conical shape with a diameter that substantially continuously decreases from the first surface of the metal pillar to the second surface of the metal pillar as the metal pillar extends in the second direction. The metal pillar can be a single-piece metal such as copper that excludes solder. The second surface of the metal pillar can be flat and parallel to the first and second surfaces of the chip. Furthermore, the second surface of the metal pillar can be disposed within a surface area of the first surface of the metal pillar, and a surface area of the first surface of the metal pillar can be at least 20 percent larger than a surface area of the second surface of the metal pillar.

The first sidewall portion can be a continuous concave arc, and the second sidewall portion can be a continuous concave arc. The first sidewall portion can have a maximum diameter at the first surface of the metal pillar and a minimum diameter at the spike, and the second sidewall portion can have a maximum diameter at the spike and a minimum diameter at the second surface of the metal pillar. The first sidewall portion can extend vertically beyond the spike only in the first direction, and the second sidewall portion can extend vertically beyond the spike only in the second direction, or alternatively, the second sidewall portion can extend vertically beyond the spike in the first and second directions. The sidewalls can consist of the first and second sidewall portions.

The spike can span 360 degrees laterally around the metal pillar and can provide an abrupt discontinuity between the first and second sidewall portions. The spike can also be a first distance in the first direction from the first surface of the metal pillar and a second distance in the second direction from the second surface of the metal pillar, and the first distance can be greater than the second distance. For instance, the first distance can be at most four times the second distance, and more particularly, the first distance can be about two times the second distance. In addition, the first and second distances can be constant as the spike spans 360 degrees laterally around the metal pillar.

The contact terminal can extend or be disposed vertically beyond the chip, the routing line, the connection joint and the encapsulant in the second direction. The contact terminal can also be disposed within or outside the periphery of the chip. The contact terminal can contact most or all of the second sidewall portion.

The contact terminal can be mostly but not entirely solder, or alternatively, entirely solder. Likewise, the body can be mostly but not entirely solder, or alternatively, entirely solder, and the flange can be mostly but not entirely solder, or alternatively, entirely solder.

For example, the contact terminal can consist of first and second solder layers, in which the first solder layer contacts and is sandwiched between the second solder layer and the metal pillar, extends vertically beyond the second solder layer in the first direction and has a different composition than the second solder layer, and the second solder layer is spaced from the metal pillar, extends vertically beyond the first solder layer in the second direction and provides the solder surface and a portion of the flange. In this example, the first solder layer can be substantially thicker than the second solder layer, and the contact terminal, the body and the flange are solder.

As another example, the contact terminal can consist of a metal layer and a solder layer, in which the metal layer contacts and is sandwiched between the solder layer and the metal pillar, extends vertically beyond the solder layer in the first direction and excludes solder, and the solder layer is spaced from the metal pillar, extends vertically beyond the metal layer in the second direction and provides the solder surface and a portion of the flange. The metal layer can be a single metal such as nickel or gold, or alternatively, the metal layer be multiple metal layers such as a nickel layer and a gold layer, in which the nickel layer contacts and is sandwiched between the gold layer and the metal pillar, is spaced from the solder layer and extends vertically beyond the gold layer in the first direction, and the gold layer contacts and is sandwiched between the nickel layer and the solder layer, is spaced from the metal pillar and extends vertically beyond the nickel layer in the second direction. In this example, the solder layer can be substantially thicker than the metal layer, and the contact terminal, the body and the flange can be mostly but not entirely solder.

The flange can be proximate to a periphery of the body. For instance, the flange can be adjacent to the periphery of the body, or alternatively, the flange can be spaced from the periphery of the body by a flat lateral surface of the body and disposed within the periphery of the body. The flange can cover the second sidewall portion and be spaced from the first sidewall portion. Furthermore, the flange can span 360 degrees laterally around the metal pillar, have an annular shape in a lateral plane orthogonal to the first and second directions, have a hemispherical cross-sectional shape in a vertical plane parallel to the first and second directions, and have a donut shape.

The flange can include an interlocking surface that faces in the first direction, extends laterally from an inner diameter of the flange to an outer diameter of the flange and contacts the metal pillar and the insulative base, in which the inner and outer diameters are adjacent to the body. The interlocking surface can be a convex arc with substantially constant curvature as the interlocking surface extends laterally from the inner diameter to the outer diameter. The interlocking surface can contact the metal pillar adjacent to the inner diameter and the insulative base adjacent to the outer diameter. The interlocking surface can also consist of inner and outer surface portions that are adjacent to one another, in which the inner surface portion is adjacent to the inner diameter and spaced from the outer diameter, the outer surface portion is adjacent to the outer diameter and spaced from the inner diameter, all of the inner surface portion contacts the metal pillar, and all of the outer surface portion contacts the insulative base.

The flange can protrude in the first direction to a flange tip of the flange that is a first distance in the first direction from the first surface of the metal pillar and a second distance in the second direction from the second surface of the metal pillar, and the first distance can be greater than the second distance. For instance, the first distance can be at most four times the second distance, and more particularly, the first distance can be about two times the second distance. In addition, the first and second distances can be constant as the flange tip spans 360 degrees laterally around the metal pillar.

The solder surface can be flat or dome shaped.

The connection joint can extend between and electrically connect the routing line and the pad. The connection joint can be electroplated metal, electrolessly plated metal, solder, conductive adhesive or a wire bond.

The encapsulant can cover the chip and the conductive trace in the first direction.

The insulative base can contact the body and the flange, and can contact most or all of the first sidewall portion. The insulative base can also cover the first sidewall portion and be spaced from the second sidewall portion.

The assembly can include an insulative adhesive that contacts the chip and the encapsulant and extends vertically beyond the chip in the second direction.

The assembly can be a first-level package that is a single-chip or multi-chip package.

In accordance with another aspect of the invention, a method of making a semiconductor chip assembly includes (1) providing a metal base, a trench, a routing line and a pillar etch mask, wherein the metal base includes first and second opposing surfaces, the trench extends into but not through the metal base from the second surface of the metal base towards the first surface of the metal base, is spaced from the first surface of the metal base and includes inner and outer peripheries that are adjacent to the second surface of the metal base, the inner periphery surrounds and is adjacent to a portion of the second surface of the metal base, the outer periphery surrounds and is spaced from the inner periphery, the routing line contacts the first surface of the metal base and is spaced from the trench, the pillar etch mask includes a metal layer and a solder layer, the metal layer contacts and covers the portion of the second surface of the metal base and extends into the trench, the solder layer contacts the metal layer, covers and is spaced from the portion of the second surface of the metal base and extends into the trench, and the metal layer and the solder layer form a flange that extends into the trench, (2) mechanically attaching a semiconductor chip to the routing line, wherein the chip includes a conductive pad, (3) forming a connection joint that electrically connects the routing line and the pad, (4) etching the metal base using a wet chemical etch, thereby reducing contact area between the metal base and the routing line and forming a metal pillar from an unetched portion of the metal base that contacts the routing line, wherein a portion of the first surface of the metal base forms a pillar base of the metal pillar, the portion of the second surface of the metal base forms a pillar tip of the metal pillar, the wet chemical etch removes all of the metal base adjacent to the outer periphery, removes none of the metal base adjacent to the inner periphery and forms the pillar base, and the pillar etch mask protects the pillar tip from the wet chemical etch, and (5) providing a contact terminal that is a permanent part of the assembly, wherein the contact terminal contacts and covers the pillar tip, includes the metal layer, the solder layer and the flange and includes a solder surface that faces away from the pillar tip and is exposed.

The method can include forming an encapsulant that contacts and covers the chip after attaching the chip to the routing line. The encapsulant can be formed by transfer molding or curing.

The method can include forming an insulative base that covers the routing line and the metal pillar after forming the encapsulant, and then removing a portion of the insulative base such that the insulative base does not cover the pillar tip.

The method can include forming the routing line by depositing the routing line on the metal base. For instance, the method can include forming a plating mask on the metal base, wherein the plating mask includes an opening that exposes a portion of the metal base, and then electroplating the routing line on the exposed portion of the metal base through the opening in the plating mask.

The method can include forming the pillar etch mask by depositing the metal layer on the metal base and then depositing the solder layer on the metal layer. For instance, the method can include, in sequence, forming a plating mask on the metal base, wherein the plating mask includes an opening that exposes a portion of the metal base and exposes the trench, electroplating the metal layer on the exposed portion of the metal base and the trench through the opening in the plating mask, depositing solder paste on the metal layer, and reflowing the solder paste, thereby forming the solder layer. The metal layer can be solder or exclude solder, and can be a single metal such as solder or gold or include a first metal such as nickel that contacts the metal base and a second metal such as gold that contacts the first metal and is spaced from the metal base. Furthermore, forming the pillar etch mask can consist of depositing the metal layer on the metal base and then depositing the solder layer on the metal layer (in which case the pillar etch mask can consist of the metal layer and the solder layer), or alternatively, include depositing the metal layer on the metal base, then depositing the solder layer on the metal layer, then depositing a solder material on the solder layer and then reflowing the solder material and the solder layer together to form a second solder layer (in which case the pillar etch mask can consist of the metal layer and the second solder layer).

The method can include forming the contact terminal by depositing the metal layer on the metal base and then depositing the solder layer on the metal layer. For instance, the method can include, in sequence, forming a plating mask on the metal base, wherein the plating mask includes an opening that exposes a portion of the metal base and exposes the trench, electroplating the metal layer on the exposed portion of the metal base and the trench through the opening in the plating mask, depositing solder paste on the metal layer, and reflowing the solder paste, thereby forming the solder layer. Furthermore, forming the contact terminal can consist of depositing the metal layer on the metal base and then depositing the solder layer on the metal layer such that the solder layer provides the solder surface, or alternatively, include depositing the metal layer on the metal base, then depositing the solder layer on the metal layer, then depositing a solder material on the solder layer and then reflowing the solder material and the solder layer together to form a second solder layer that covers the pillar tip, extends into the flange and provides the solder surface. Moreover, forming the contact terminal can include depositing the solder material and then forming the metal pillar (in which case the pillar etch mask and the contact terminal can consist of the metal layer and the second solder layer), or alternatively, forming the metal pillar and then depositing the solder material (in which case the pillar etch mask can consist of the metal layer and the solder layer and the contact terminal can consist of the metal layer and the second solder layer).

The method can include forming the trench and the pillar etch mask by, in sequence, etching the metal base to form the trench, depositing the metal layer on the metal base and into the trench, and depositing the solder layer on the metal layer. For instance, the method can include, in sequence, forming a trench etch mask on the metal base, wherein the trench etch mask includes an opening that exposes a portion of the metal base, etching the metal base through the opening in the trench etch mask, thereby forming the trench, forming a plating mask on the metal base, wherein the plating mask includes an opening that exposes a portion of the metal base and exposes the trench, electroplating the metal layer on the exposed portion of the metal base and the trench through the opening in the plating mask, depositing solder paste on the metal layer, and reflowing the solder paste, thereby forming the solder layer.

The method can include forming the trench and the contact terminal by, in sequence, etching the metal base to form the trench, depositing the metal layer on the metal base and into the trench, and depositing the solder layer on the metal layer. For example, the method can include, in sequence, forming a trench etch mask on the metal base, wherein the trench etch mask includes an opening that exposes a portion of the metal base, etching the metal base through the opening in the trench etch mask, thereby forming the trench, forming a plating mask on the metal base, wherein the plating mask includes an opening that exposes a portion of the metal base and exposes the trench, electroplating the metal layer on the exposed portion of the metal base and the trench through the opening in the plating mask, depositing solder paste on the metal layer, and reflowing the solder paste, thereby forming the solder layer. In this example, the contact terminal can consist of the metal layer and the solder layer and the solder layer can provide the solder surface. As another example, the method can include, in sequence, forming a trench etch mask on the metal base, wherein the trench etch mask includes an opening that exposes a portion of the metal base, etching the metal base through the opening in the trench etch mask, thereby forming the trench, forming a plating mask on the metal base, wherein the plating mask includes an opening that exposes a portion of the metal base and exposes the trench, electroplating the metal layer on the exposed portion of the metal base and the trench through the opening in the plating mask, depositing solder paste on the metal layer, reflowing the solder paste, thereby forming the solder layer, depositing a solder material on the solder layer after forming the metal pillar, and reflowing the solder material and the solder layer together to form a second solder layer. In this example, the contact terminal can consist of the metal layer and the second solder layer, the metal layer and the second solder layer can cover the pillar tip and provide the flange, and the second solder layer can provide the solder surface.

The method can include forming the trench and the metal pillar by etching the metal base using a first wet chemical etch, thereby forming the trench and the pillar tip, then attaching the chip to the metal base, the routing line, the metal layer and the solder layer, and then etching the metal base using a second wet chemical etch, thereby forming the metal pillar and the pillar base.

The method can include attaching the chip to the routing line by disposing an insulative adhesive between the chip and the metal base and then hardening the adhesive.

The method can include forming the connection joint by plating the connection joint between the routing line and the pad. For instance, the connection joint can be electroplated or electrolessly plated between the routing line and the pad. Alternatively, the method can include forming the connection joint by depositing a non-solidified material between the routing line and the pad and then hardening the non-solidified material. For instance, solder paste can be deposited between the routing line and the pad and then hardened by reflowing, or conductive adhesive can be deposited between the routing line and the pad and then hardened by curing. Alternatively, the method can include forming the connection joint by wire bonding.

The method can include etching the metal base to form the metal pillar, thereby exposing the routing line, removing most of the metal base, removing all of the metal base within the periphery of the pad, removing all of the metal base within the periphery of the chip, electrically isolating the routing line from other routing lines that contact the metal base, and electrically isolating the pad from other pads of the chip. For instance, the method can include forming the connection joint by wire bonding, then forming the encapsulant, and then etching the metal base to form the metal pillar, thereby electrically isolating the routing line from the other routing lines and the pad from other pads. Alternatively, the method can include forming the encapsulant, then forming the connection joint by electroplating using the metal base as a plating bus, and then etching the metal base to form the metal pillar, thereby electrically isolating the routing line from the other routing lines and the pad from the other pads. Alternatively, the method can include forming the encapsulant, then etching the metal base to form the metal pillar, thereby electrically isolating the routing line from the other routing lines, and then forming the connection joint by electroless plating in which case the pad remains electrically isolated from the other pads.

The method can include forming the trench to form the pillar tip and a second sidewall portion of the metal pillar that is adjacent to the pillar tip and spaced from the first surface of the metal base, and etching the metal base to form the metal pillar, the pillar base and a first sidewall portion of the metal pillar that is adjacent to the pillar base and the second sidewall portion and spaced from the pillar tip without affecting the pillar tip and without affecting the second sidewall portion.

The method can include forming the trench and then forming the routing line and the pillar etch mask. For instance, after forming the trench, the method can include forming the routing line and then forming the pillar etch mask, or alternatively, forming the pillar etch mask and then forming the routing line. In addition, forming the routing line and then forming the pillar etch mask can include forming the routing line, then forming the metal layer and then forming the solder layer, or alternatively, simultaneously forming the routing line and the metal layer and then forming the solder layer.

The method can include forming the trench and then attaching the chip to the metal base and the routing line. The method can also include forming the trench and then forming the connection joint.

The method can include attaching the chip to the metal base and the routing line and then forming the metal pillar. For example, the method can include forming the pillar etch mask, then attaching the chip to the metal base, the routing line and the pillar etch mask and then forming the metal pillar. In this example, the method can include forming the contact terminal and then attaching the chip to the metal base, the routing line and the contact terminal, or alternatively, attaching the chip to the metal base, the routing line and the pillar etch mask and then forming the contact terminal.

The method can include forming the pillar etch mask and then forming the contact terminal, or alternatively, simultaneously forming the pillar etch mask and the contact terminal.

The method can include forming the contact terminal and then forming the metal pillar, or alternatively, forming the metal pillar and then forming the contact terminal.

The method can include forming the connection joint and then forming the metal pillar, or alternatively, forming the metal pillar and then forming the connection joint. The method can include forming the connection joint and then forming the encapsulant, or alternatively, forming the encapsulant and then forming the connection joint.

The method can include forming the metal pillar and then forming the encapsulant, or alternatively, forming the encapsulant and then forming the metal pillar. The method can include forming the encapsulant, then forming the connection joint and then forming the metal pillar, or alternatively, forming the encapsulant, then forming the metal pillar and then forming the connection joint.

The method can include (1) providing a metal base that includes first and second opposing surfaces, then (2) etching the metal base using a first wet chemical etch, thereby forming a trench in the metal base that extends into but not through the metal base from the second surface of the metal base towards the first surface of the metal base, is spaced from the first surface of the metal base and includes inner and outer peripheries that are adjacent to the second surface of the metal base, wherein the inner periphery surrounds and is adjacent to a portion of the second surface of the metal base and the outer periphery surrounds and is spaced from the inner periphery, (3) forming a routing line on the first surface of the metal base, wherein the routing line contacts the first surface of the metal base and is spaced from the second surface of the metal base, (4) forming a metal layer on the second surface of the metal base, wherein the metal layer contacts the second surface of the metal base, is spaced from the first surface of the metal base, extends into the trench and contacts and covers the portion of the second surface of the metal base, (5) forming a solder layer on the metal layer, wherein the solder layer contacts the metal layer, is spaced from the first surface of the metal base, extends into the trench and covers the portion of the second surface of the metal base, and the metal layer and the solder layer form a flange that fills the trench, (6) mechanically attaching a semiconductor chip to the metal base and the routing line, wherein the chip includes a conductive pad, (7) forming a connection joint that electrically connects the routing line and the pad, (8) etching the metal base using a second wet chemical etch after attaching the chip to the metal base and the routing line and forming the metal layer and the solder layer, thereby reducing contact area between the metal base and the routing line and forming a metal pillar from an unetched portion of the metal base that contacts the routing line, wherein a portion of the first surface of the metal base forms a pillar base of the metal pillar, the portion of the second surface of the metal base forms a pillar tip of the metal pillar, the second wet chemical etch removes all of the metal base adjacent to the outer periphery, removes none of the metal base adjacent to the inner periphery and forms the pillar base, and a pillar etch mask that includes the metal layer and the solder layer protects the pillar tip from the second wet chemical etch, and (9) providing a contact terminal that is a permanent part of the assembly, wherein the contact terminal contacts and covers the pillar tip, includes the metal layer, the solder layer and the flange and includes a solder surface that faces away from the pillar tip and is exposed.

The method can include (1) providing a metal base, a trench, a routing line, a metal layer and solder layer, wherein the metal base includes first and second opposing surfaces, the first surface of the metal base faces in a first direction, the second surface of the metal base faces in a second direction opposite the first direction, the trench extends into but not through the metal base from the second surface of the metal base towards the first surface of the metal base, is spaced from the first surface of the metal base and includes inner and outer peripheries that are adjacent to the second surface of the metal base, the inner periphery surrounds and is adjacent to a portion of the second surface of the metal base, the outer periphery surrounds and is spaced from the inner periphery, the routing line contacts the first surface of the metal base and is spaced from the trench, the metal layer extends into the trench and contacts and covers the portion of the second surface of the metal base, the solder layer contacts the metal layer, covers and is spaced from the portion of the second surface of the metal base and extends into the trench, and the metal layer and the solder layer form a flange that fills the trench, (2) mechanically attaching a semiconductor chip to the metal base and the routing line, wherein the chip includes a conductive pad, (3) forming a connection joint that electrically connects the routing line and the pad, (4) forming an encapsulant after attaching the chip to the metal base and the routing line, wherein the encapsulant contacts the chip and extends vertically beyond the chip, the metal base and the routing line in the first direction, and the metal base extends vertically beyond the chip and the routing line in the second direction, (5) etching the metal base using a wet chemical etch after forming the metal layer, the solder layer and the encapsulant, thereby reducing contact area between the metal base and the routing line and forming a metal pillar from an unetched portion of the metal base that contacts the routing line and extends vertically beyond the chip and the routing line in the second direction, wherein a portion of the first surface of the metal base forms a pillar base of the metal pillar, the portion of the second surface of the metal base forms a pillar tip of the metal pillar, the wet chemical etch removes all of the metal base adjacent to the outer periphery, removes none of the metal base adjacent to the inner periphery and forms the pillar base, and a pillar etch mask that includes the metal layer and the solder layer protects the pillar tip from the wet chemical etch, (6) forming an insulative base that covers the routing line and the metal pillar and extends vertically beyond the chip, the routing line, the pillar etch mask, the metal pillar and the connection joint in the second direction, (7) removing a portion of the insulative base such that the insulative base does not cover the pillar tip in the second direction, and (8) providing a contact terminal that is a permanent part of the assembly, wherein the contact terminal contacts the pillar tip and covers the pillar tip in the second direction, includes the metal layer, the solder layer and the flange and includes a solder surface that faces in the second direction and is exposed.

The method can include (1) providing a metal base that includes first and second opposing surfaces, wherein the first surface of the metal base faces in a first direction and the second surface of the metal base faces in a second direction opposite the first direction, then (2) etching the metal base using a first wet chemical etch, thereby forming a trench in the metal base that extends into but not through the metal base from the second surface of the metal base towards the first surface of the metal base, is spaced from the first surface of the metal base and includes inner and outer peripheries that are adjacent to the second surface of the metal base, wherein the inner periphery surrounds and is adjacent to a portion of the second surface of the metal base and the outer periphery surrounds and is spaced from the inner periphery, (3) forming a routing line on the first surface of the metal base, wherein the routing line contacts the first surface of the metal base and is spaced from the second surface of the metal base, (4) forming a metal layer on the second surface of the metal base, wherein the metal layer contacts the second surface of the metal base, is spaced from the first surface of the metal base, extends into the trench and contacts and covers the portion of the second surface of the metal base, (5) forming a solder layer on the metal layer, wherein the solder layer contacts the metal layer, is spaced from the first surface of the metal base, extends into the trench and covers the portion of the second surface of the metal base, and the metal layer and the solder layer form a flange that fills the trench, (6) mechanically attaching a semiconductor chip to the metal base and the routing line, wherein the chip includes a conductive pad, (7) forming a connection joint that electrically connects the routing line and the pad, (8) forming an encapsulant after attaching the chip to the metal base and the routing line, wherein the encapsulant contacts the chip and extends vertically beyond the chip, the metal base and the routing line in the first direction, and the metal base extends vertically beyond the chip, the routing line and the encapsulant in the second direction, (9) etching the metal base using a second wet chemical etch after forming the metal layer, the solder layer and the encapsulant, thereby reducing contact area between the metal base and the routing line and forming a metal pillar from an unetched portion of the metal base that contacts the routing line and extends vertically beyond the chip, the routing line and the encapsulant in the second direction, wherein a portion of the first surface of the metal base forms a pillar base of the metal pillar, the portion of the second surface of the metal base forms a pillar tip of the metal pillar, the second wet chemical etch removes all of the metal base adjacent to the outer periphery, removes none of the metal base adjacent to the inner periphery and forms the pillar base, and a pillar etch mask that includes the metal layer and the solder layer protects the pillar tip from the second wet chemical etch, (10) forming an insulative base that covers the routing line and the metal pillar and extends vertically beyond the chip, the routing line, the pillar etch mask, the metal pillar, the connection joint and the encapsulant in the second direction, (11) removing a portion of the insulative base such that the insulative base does not cover the pillar tip in the second direction, and (12) providing a contact terminal that is a permanent part of the assembly, wherein the contact terminal contacts the pillar tip, covers the pillar tip in the second direction, includes the metal layer, the solder layer and the flange and includes a solder surface that faces in the second direction and is exposed.

The method can include attaching the chip to the metal base and the routing line (and, if already formed, the metal layer and the solder layer) by disposing an insulative adhesive between the chip and the metal base and then hardening the adhesive.

The method can include etching the metal base using the first wet chemical etch to form the pillar tip and a second sidewall portion of the metal pillar that is adjacent to the pillar tip and the trench and spaced from the first surface of the metal base, and etching the metal base using the second wet chemical etch to form the pillar base and a first sidewall portion of the metal pillar that is adjacent to the pillar base and the second sidewall portion and spaced from the pillar tip without affecting the pillar tip and without affecting the second sidewall portion.

The method can include removing the portion of the insulative base by grinding, laser ablation, plasma etching or photolithography.

The method can include removing the portion of the insulative base to expose the pillar etch mask without exposing the metal pillar and without exposing the routing line. More particularly, the method can include removing the portion of the insulative base to expose the solder layer without exposing the metal layer. For instance, the method can include grinding the insulative base without grinding the pillar etch mask and without grinding the metal pillar, then grinding the insulative base and the pillar etch mask without grinding the metal pillar, and then discontinuing the grinding such that the insulative base is laterally aligned with the pillar etch mask and the metal pillar is unexposed. More particularly, the method can include grinding the insulative base and the solder layer without grinding the metal layer, and then discontinuing the grinding such that the insulative base is laterally aligned with the solder layer and the metal layer is unexposed. Furthermore, after discontinuing the grinding, the contact terminal can consist of the metal layer and the solder layer and the solder layer can provide the solder surface, or alternatively, the method can include depositing a solder material on the solder layer and then reflowing the solder material and the solder layer together to form the second solder layer.

An advantage of the present invention is that the semiconductor chip assembly can be manufactured conveniently and cost effectively. Another advantage is that the encapsulant can be provided before the metal base is etched to form the metal pillar, thereby enhancing mechanical support and protection for the routing line. Another advantage is that the metal pillar can be formed by etching (subtractively) rather than by electroplating or electroless plating (additively) which improves uniformity and reduces manufacturing time and cost. Another advantage is that the contact terminal can include a flange that interlocks it to the metal pillar. Another advantage is that the connection joint can be made from a wide variety of materials and processes, thereby making advantageous use of mature connection joint technologies in a unique and improved manufacturing approach. Another advantage is that the assembly need not include wire bonds or TAB leads, although the process is flexible enough to accommodate these techniques if desired. Another advantage is that the assembly can be manufactured using low temperature processes which reduces stress and improves reliability. A further advantage is that the assembly can be manufactured using well-controlled processes which can be easily implemented by circuit board, lead frame and tape manufacturers. Still another advantage is that the assembly can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which:

FIGS. 1A–25A are cross-sectional views showing a method of making a semiconductor chip assembly in accordance with a first embodiment of the present invention;

FIGS. 1B–25B are top plan views corresponding to FIGS. 1A–25A, respectively;

FIGS. 1C–25C are bottom plan views corresponding to FIGS. 1A–25A, respectively;

DETAILED DESCRIPTION OF THE PREFERRED EMBODIMENTS

FIGS. 1A–25A, 1B–25B and 1C–25C are cross-sectional, top and bottom views, respectively, of a method of making a semiconductor chip assembly in accordance with a first embodiment of the present invention.

Figure 1A:
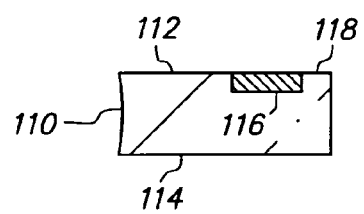
Figure 1B:
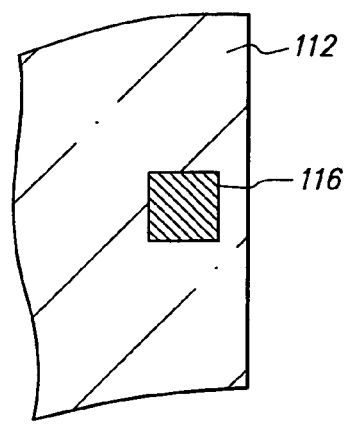
Figure 1C:
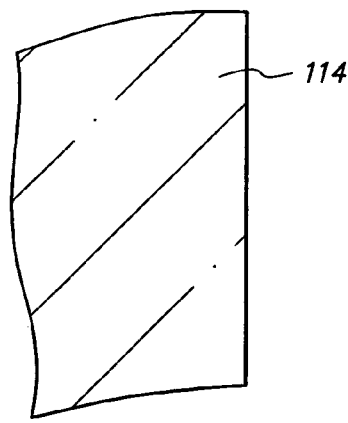

FIGS. 1A, 1B and 1C are cross-sectional, top and bottom views, respectively, of semiconductor chip 110 which is an integrated circuit in which various transistors, circuits, interconnect lines and the like are formed (not shown). Chip 110 includes opposing major surfaces 112 and 114 and has a thickness (between surfaces 112 and 114) of 150 microns. Surface 112 is the active surface and includes conductive pad 116 and passivation layer 118.

Pad 116 is substantially aligned with passivation layer 118 so that surface 112 is essentially flat. Alternatively, if desired, pad 116 can extend above or be recessed below passivation layer 118. Pad 116 provides a bonding site to electrically couple chip 110 with external circuitry. Thus, pad 116 can be an input/output pad or a power/ground pad. Pad 116 has a length and width of 100 microns.

Pad 116 has an aluminum base that is cleaned by dipping chip 110 in a solution containing 0.05 M phosphoric acid at room temperature for 1 minute and then rinsed in distilled water. Pad 116 can have the aluminum base serve as a surface layer, or alternatively, pad 116 can be treated to include a surface layer that covers the aluminum base, depending on the nature of a connection joint that shall subsequently contact the surface layer. In this embodiment, the connection joint is a gold wire bond. Therefore, pad 116 need not be treated to accommodate this connection joint. Alternatively, pad 116 can be treated by depositing several metal layers, such as chromium/copper/gold or titanium/nickel/gold on the aluminum base. The chromium or titanium layer provides a barrier for the aluminum base and an adhesive between the overlaying metal and the aluminum base. The metal layers, however, are typically selectively deposited by evaporation, electroplating or sputtering using a mask which is a relatively complicated process. Alternatively, pad 116 is treated by forming a nickel surface layer on the aluminum base. For instance, chip 110 is dipped in a zinc solution to deposit a zinc layer on the aluminum base. This step is commonly known as zincation. Preferably, the zinc solution contains about 150 grams/liter of NaOH, 25 grams/liter of ZnO, and 1 gram/liter of $NaNO_3$, as well as tartaric acid to reduce the rate at which the aluminum base dissolves. Thereafter, the nickel surface layer is electrolessly deposited on the zincated aluminum base. A suitable electroless nickel plating solution is Enthone Enplate NI-424 at 85° C.

Chip 110 includes many other pads on surface 112, and only pad 116 is shown for convenience of illustration. In addition, chip 110 has already been singulated from other chips that it was previously attached to on a wafer.

Figure 2A:
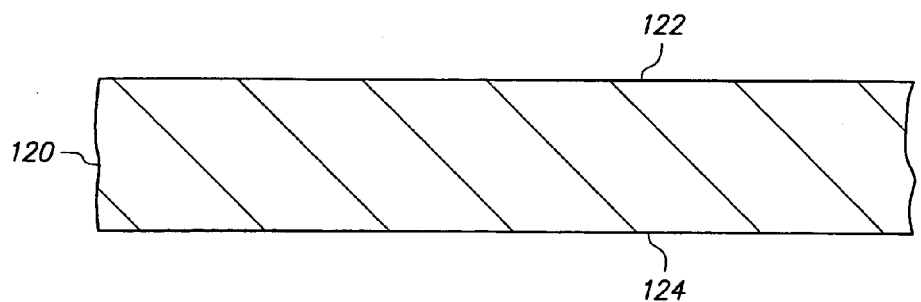
Figure 2B:
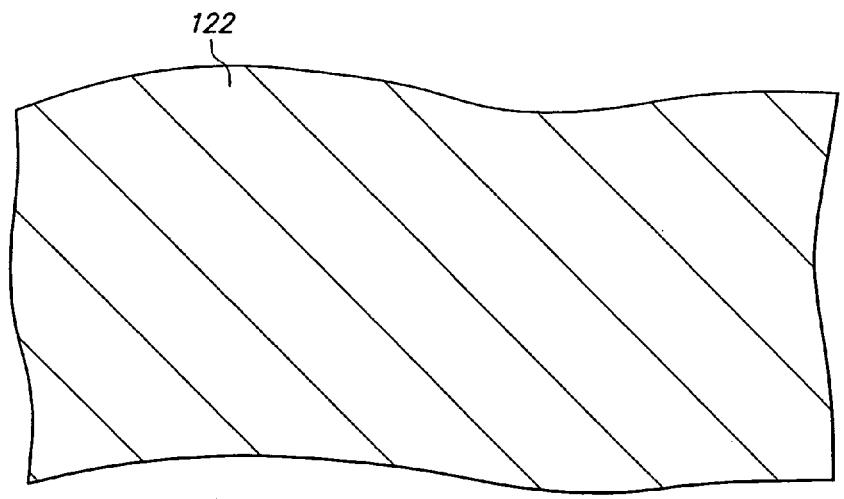
Figure 2C:
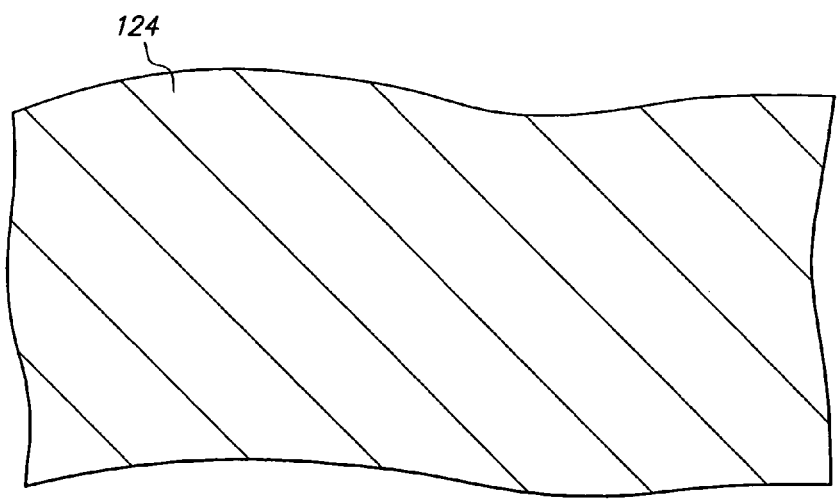

FIGS. 2A, 2B and 2C are cross-sectional, top and bottom views, respectively, of metal base 120 which includes opposing major surfaces 122 and 124. Metal base 120 is a copper plate with a thickness of 150 microns.

Figure 3A:
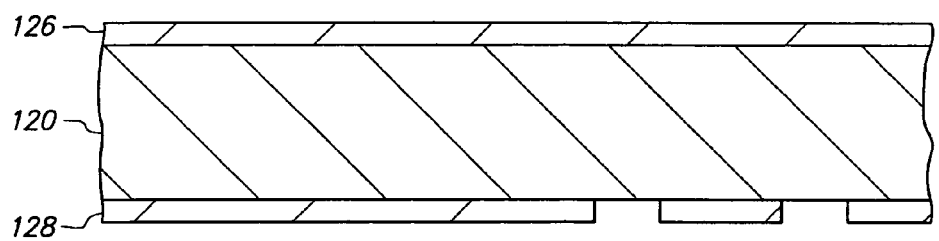
Figure 3B:
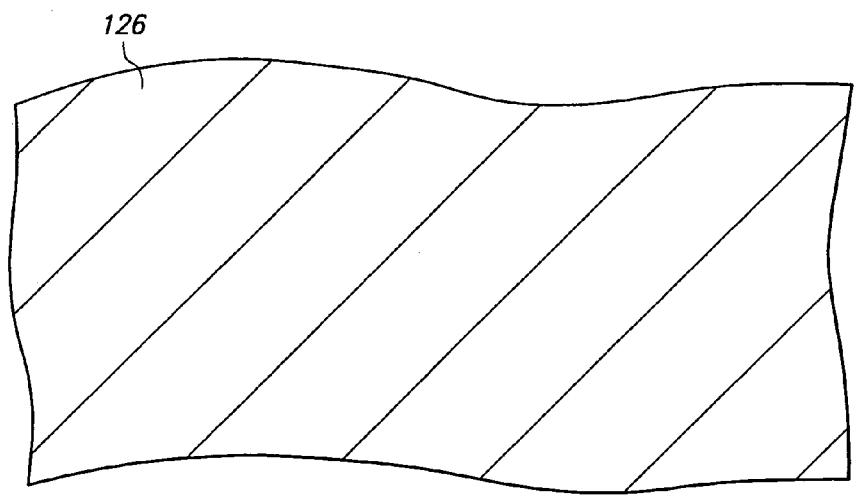
Figure 3C:
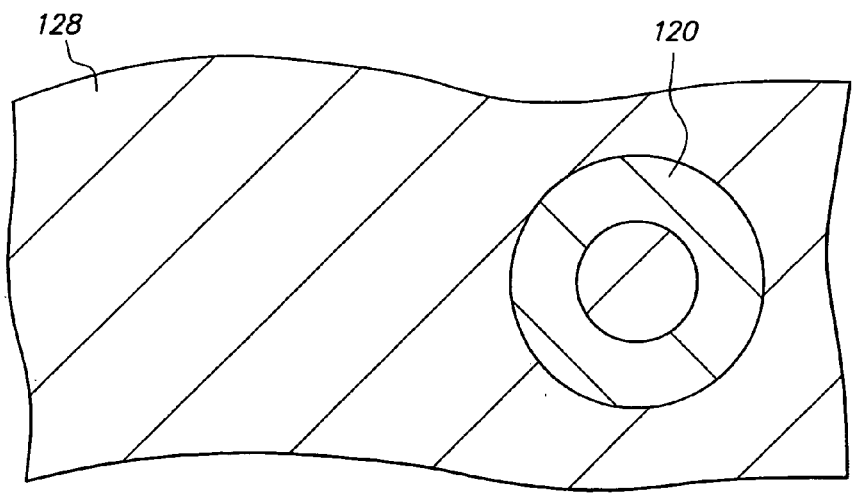

FIGS. 3A, 3B and 3C are cross-sectional, top and bottom views, respectively, of photoresist layers 126 and 128 formed on metal base 120. Photoresist layers 126 and 128 are deposited using a dry film lamination process in which hot rolls simultaneously press photoresist layers 126 and 128 onto surfaces 122 and 124, respectively. A reticle (not shown) is positioned proximate to photoresist layer 128. Thereafter, photoresist layer 128 is patterned by selectively applying light through the reticle, applying a developer solution to remove the photoresist portion rendered soluble by the light, and then hard baking, as is conventional. As a result, photoresist layer 128 contains an opening that selectively exposes surface 124 of metal base 120, and photoresist layer 126 remains unpatterned. Photoresist layers 126 and 128 have a thickness of 25 microns beyond surfaces 122 and 124, respectively.

Figure 4A:
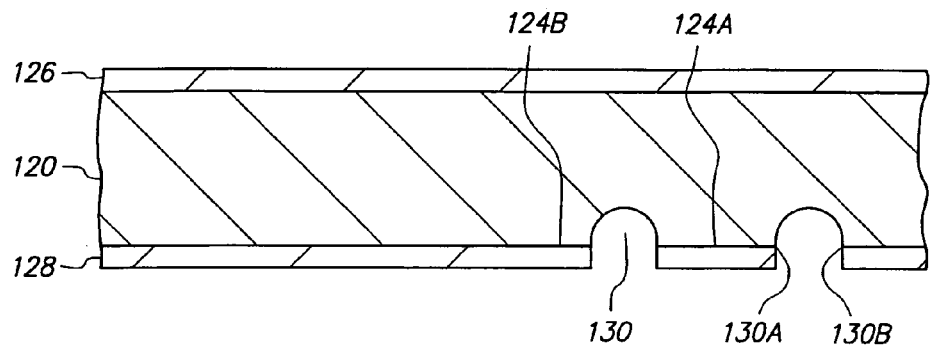
Figure 4B:
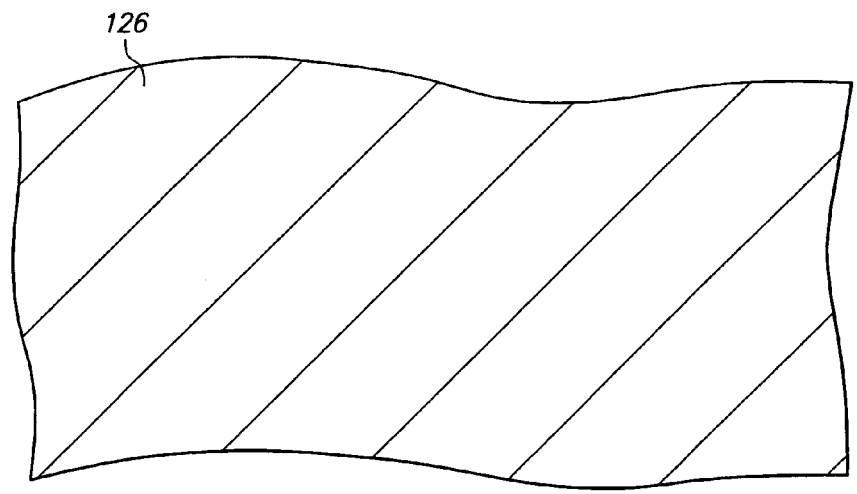
Figure 4C:
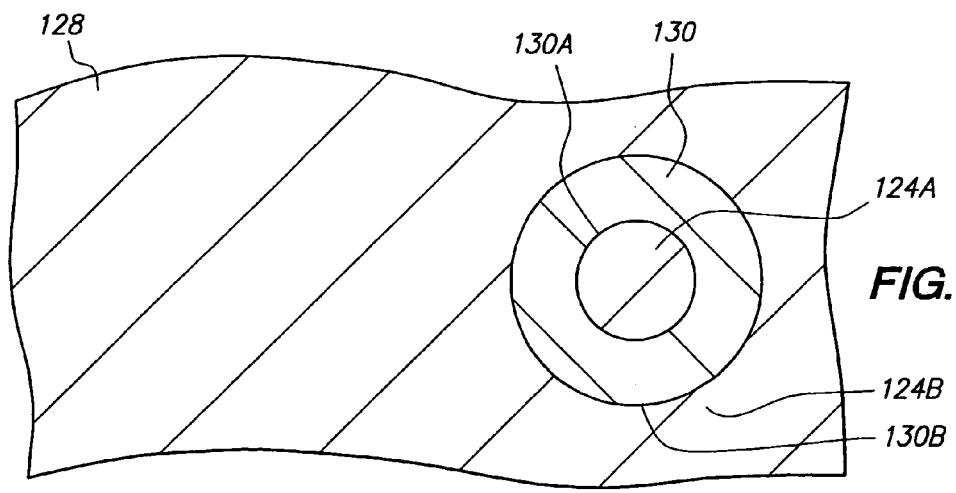

FIGS. 4A, 4B and 4C are cross-sectional, top and bottom views, respectively, of trench 130 formed in metal base 120.

Trench 130 is formed by applying a back-side wet chemical etch to the exposed portion of surface 124 using photoresist layer 128 as a trench etch mask. For instance, a bottom spray nozzle (not shown) can spray the wet chemical etch on metal base 120 while a top spray nozzle (not shown) is deactivated, or the structure can be dipped in the wet chemical etch since photoresist layer 126 provides front-side protection. The wet chemical etch is highly selective of copper and etches 50 microns into metal base 120. As a result, trench 130 extends from surface 124 into but not through metal base 120.

Trench 130 includes inner periphery 130A at surface 124 and outer periphery 130B at surface 124. Inner periphery 130A is surrounded by and spaced from outer periphery 130B. Trench 130 has an inner diameter of 200 microns at inner periphery 130A, an outer diameter of 400 microns at outer periphery 130B, a width of 100 microns ((400−200)/2) between inner periphery 130A and outer periphery 130B, a depth of 50 microns relative to surface 124 and is spaced from surface 122 by 100 microns. Trench 130 also has an annular shape at surface 124 (in a lateral plane orthogonal to the upward direction that surface 122 faces in and the downward direction that surface 124 faces in), a hemispherical cross-sectional shape between surfaces 122 and 124 (in a vertical plane parallel to the upward and downward directions) and an overall donut shape.

Trench 130 defines inner surface portion 124A of surface 124. In particular, inner periphery 130A surrounds and is adjacent to inner surface portion 124A. That is, inner surface portion 124A is the entire portion of surface 124 encircled by inner periphery 130A. Thus, trench 130 spans 360 degrees laterally around inner surface portion 124A, and inner surface portion 124A has a circular shape with a diameter of 200 microns.

Trench 130 is also adjacent to outer surface portion 124B of surface 124. In particular, outer periphery 130B is surrounded by and adjacent to outer surface portion 124B. That is, trench 130 is encircled by outer surface portion 124B. Thus, outer surface portion 124B spans 360 degrees laterally around trench 130 and inner surface portion 124A, and is spaced from inner surface portion 124A by the width of trench 130. Outer surface portion 124B has an annular shape with an inner diameter of 400 microns at outer periphery 130B, an outer diameter (not shown) of 450 microns and a width of 25 microns ((450−400)/2).

A suitable wet chemical etch can be provided by a solution containing alkaline ammonia. The optimal etch time for exposing metal base 120 to the wet chemical etch in order to form trench 130 with the desired dimensions can be established through trial and error.

Figure 5A:
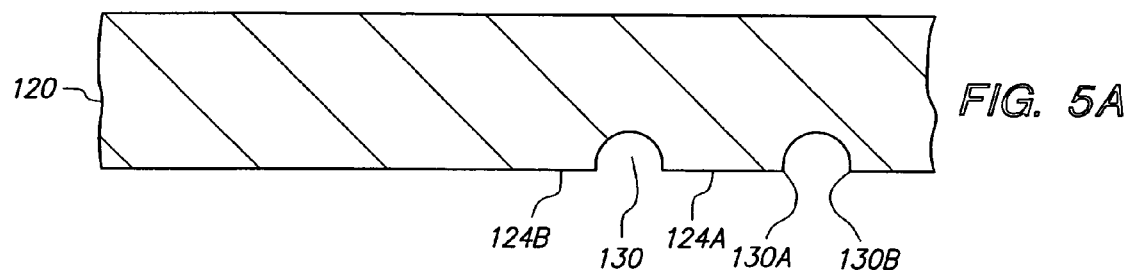
Figure 5B:
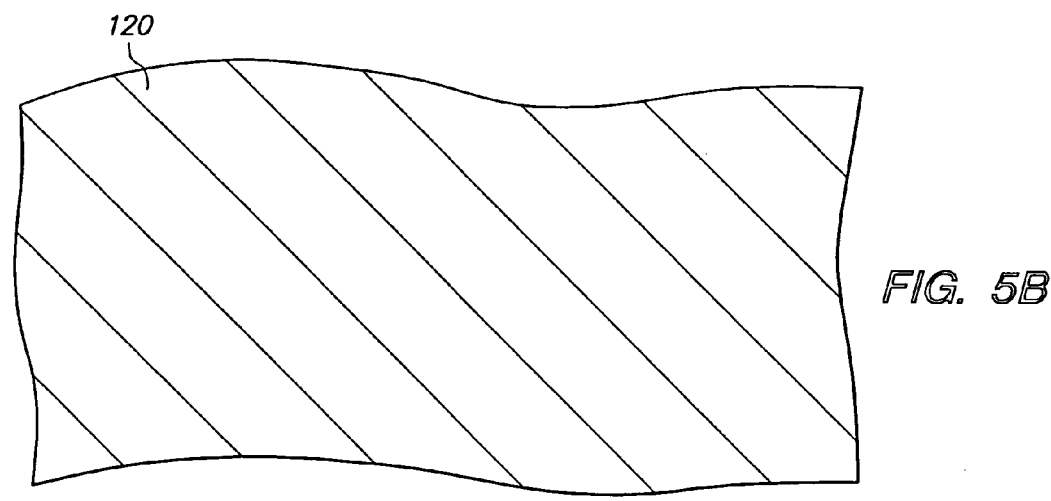
Figure 5C:
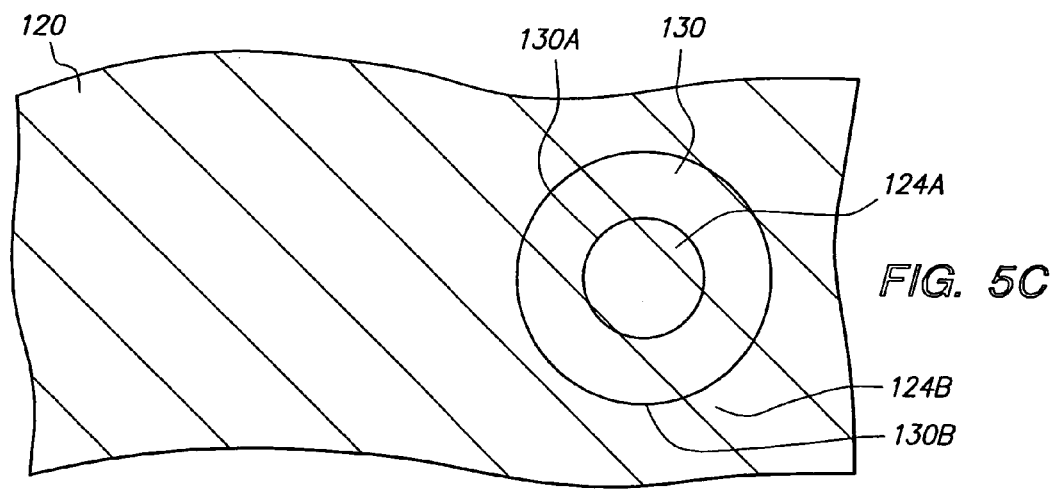

FIGS. 5A, 5B and 5C are cross-sectional, top and bottom views, respectively, of metal base 120 after photoresist layers 126 and 128 are stripped. Photoresist layers 126 and 128 are removed using a solvent, such as a mild alkaline solution with a pH of 9, that is highly selective of photoresist with respect to copper. Therefore, no appreciable amount of metal base 120 is removed.

Figure 6A:
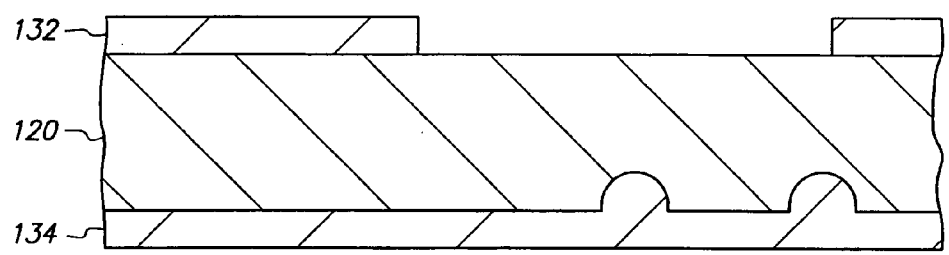
Figure 6B:
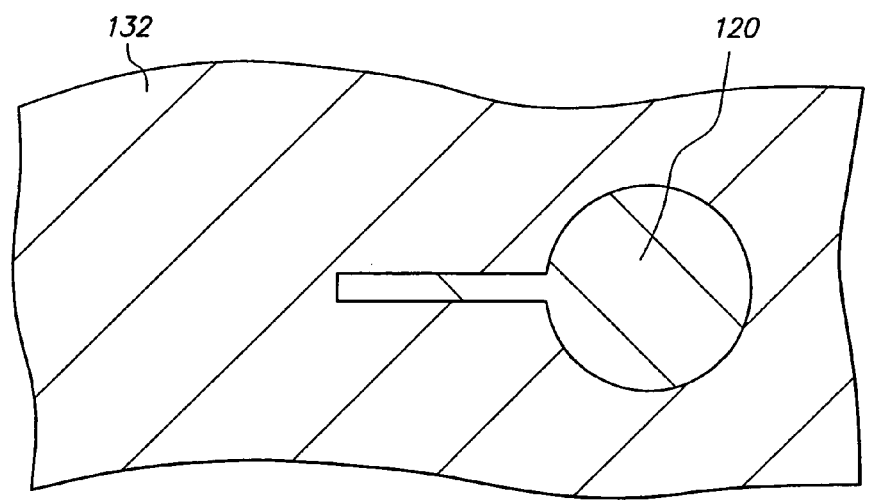
Figure 6C:
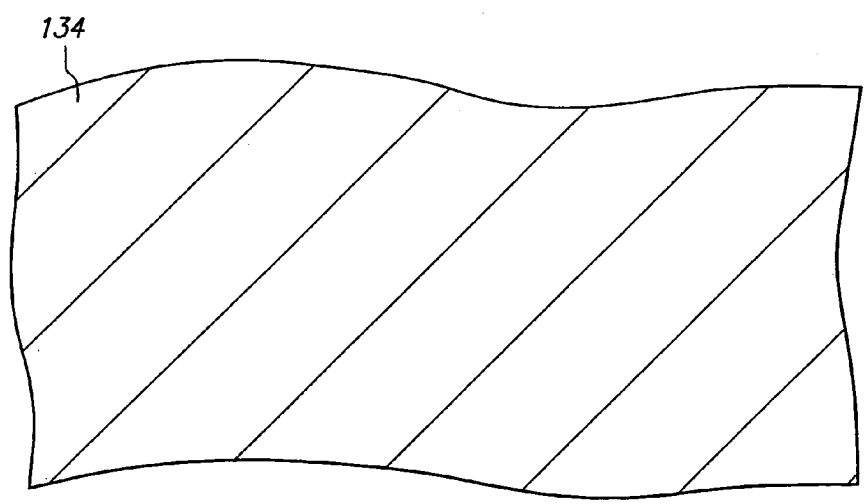

FIGS. 6A, 6B and 6C are cross-sectional, top and bottom views, respectively, of photoresist layers 132 and 134 formed on metal base 120. Photoresist layers 132 and 134 are deposited using a dry film lamination process in which hot rolls simultaneously press photoresist layers 132 and 134 onto surfaces 122 and 124, respectively. A reticle (not shown) is positioned proximate to photoresist layer 132. Thereafter, photoresist layer 132 is patterned by selectively applying light through the reticle, applying a developer solution to remove the photoresist portion rendered soluble by the light, and then hard baking, as is conventional. As a result, photoresist layer 132 contains an opening that selectively exposes surface 122 of metal base 120, and photoresist layer 134 remains unpatterned. Photoresist layers 132 and 134 have a thickness of 50 microns beyond surfaces 122 and 124, respectively.

Figure 7A:
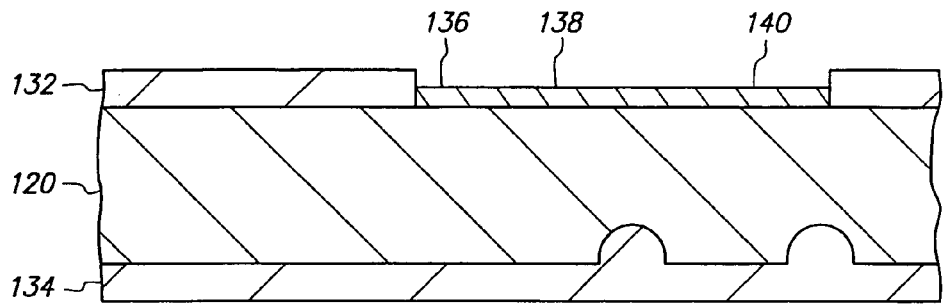
Figure 7B:
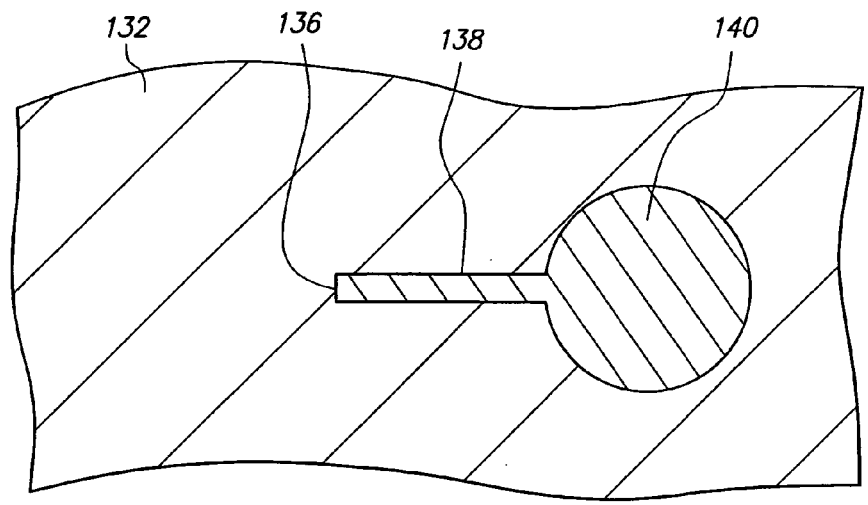
Figure 7C:
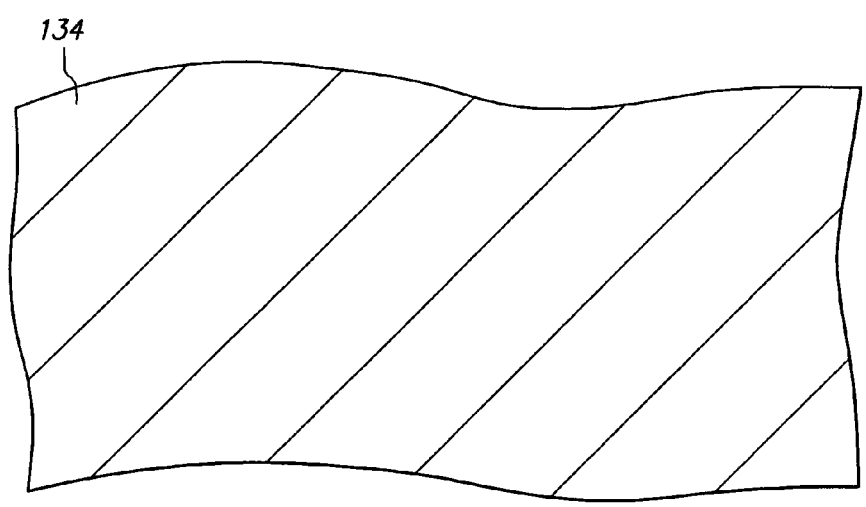

FIGS. 7A, 7B and 7C are cross-sectional, top and bottom views, respectively, of routing line 136 formed on metal base 120.

Routing line 136 contacts metal base 120 at surface 122 and is spaced from surface 124 and trench 130. Routing line 136 is composed of a nickel layer electroplated on metal base 120 and a copper layer electroplated on the nickel layer. The nickel layer contacts and is sandwiched between metal base 120 and the copper layer, and the copper layer contacts the nickel layer and is spaced from metal base 120. Thus, the nickel layer is buried beneath the copper layer, and the copper layer is exposed. Routing line 136 has a thickness of 20 microns. In particular, the nickel layer has a thickness of 1 micron, and the copper layer has a thickness of 19 microns. For convenience of illustration, the nickel and copper layers are shown as a single layer.

Routing line 136 is formed by an electroplating operation using photoresist layers 132 and 134 as plating masks. Thus, routing line 136 is formed additively. Initially, a plating bus (not shown) is connected to metal base 120, current is applied to the plating bus from an external power source, and metal base 120 is submerged in an electrolytic nickel plating solution such as Technic Techni Nickel "S" at room temperature. As a result, the nickel layer electroplates (deposits or grows) on the exposed portions of metal base 120. The nickel electroplating operation continues until the nickel layer has the desired thickness. Thereafter, the structure is removed from the electrolytic nickel plating solution and submerged in an electrolytic copper plating solution such as Sel-Rex CUBATH M™ at room temperature while current is applied to the plating bus to electroplate the copper layer on the nickel layer. The copper electroplating operation continues until the copper layer has the desired thickness. Thereafter, the structure is removed from the electrolytic copper plating solution and rinsed in distilled water to remove contaminants.

Routing line 136 is a flat planar lead that includes elongated routing portion 138 and enlarged circular portion 140. Elongated routing portion 138 and enlarged circular portion 140 are adjacent to and coplanar with one another. Elongated routing portion 138 has a width (orthogonal to its elongated length) of 100 microns, and enlarged circular portion 140 has a diameter of 300 microns. Furthermore, elongated routing portion 138 extends laterally from enlarged circular portion 140, and surface portion 124A and trench 130 are vertically aligned with enlarged circular portion 140.

Figure 8A:
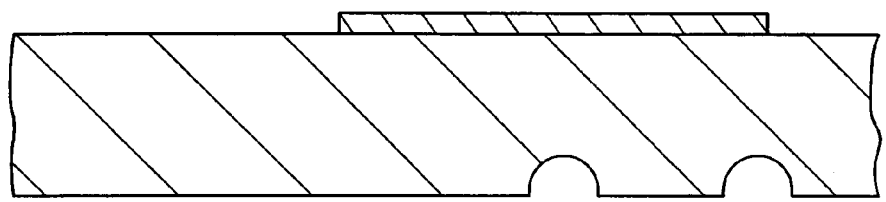
Figure 8B:
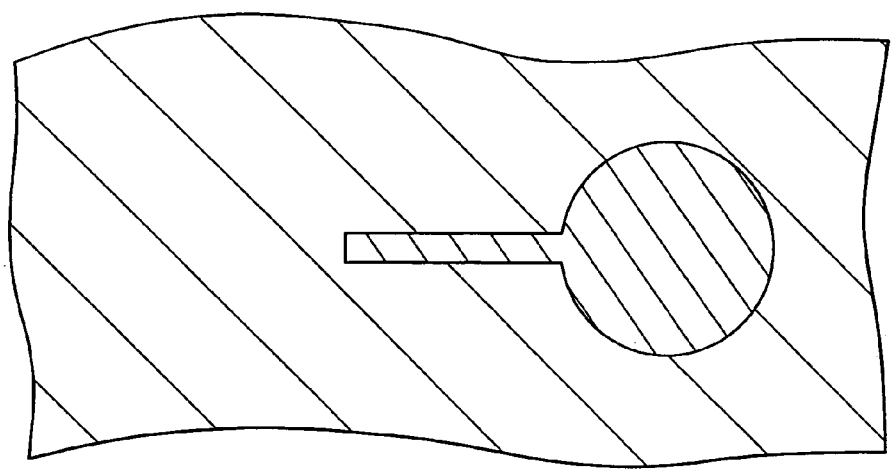
Figure 8C:
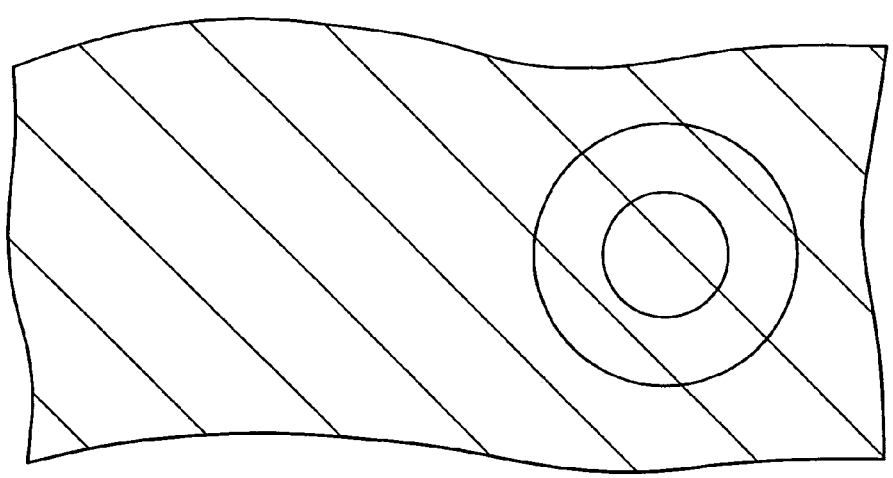

FIGS. 8A, 8B and 8C are cross-sectional, top and bottom views, respectively, of metal base 120 and routing line 136 after photoresist layers 132 and 134 are stripped. Photoresist layers 132 and 134 are removed using a solvent, such as a mild alkaline solution with a pH of 9, that is highly selective of photoresist with respect to copper and nickel. Therefore, no appreciable amount of metal base 120 or routing line 136 is removed.

Figure 9A:
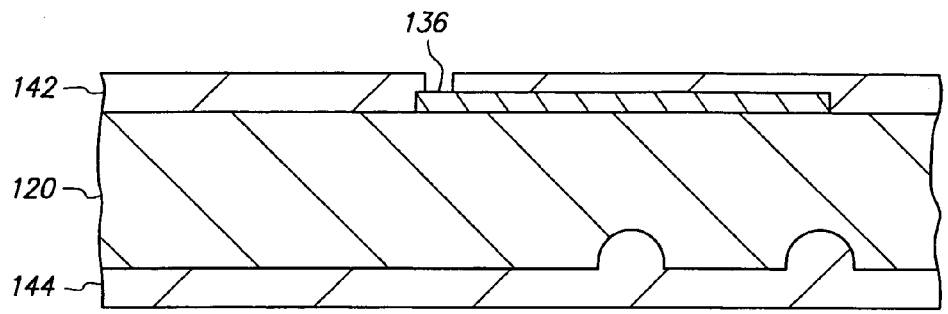
Figure 9B:
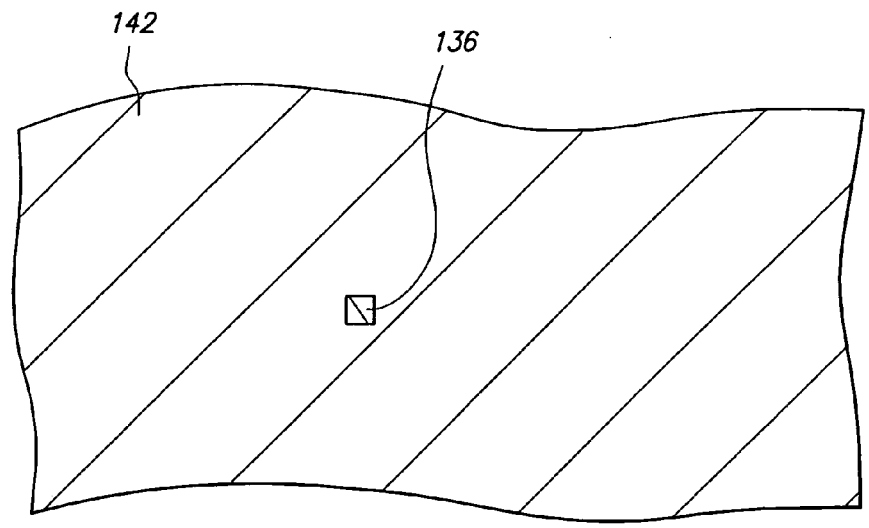
Figure 9C:
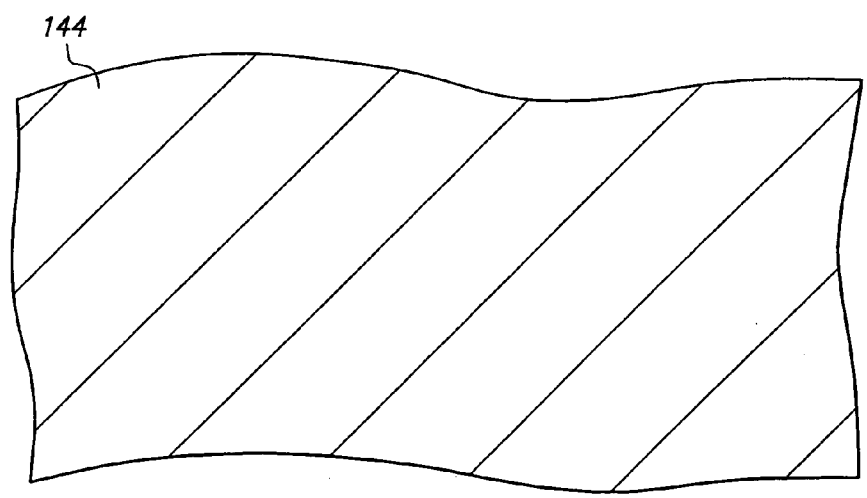

FIGS. 9A, 9B and 9C are cross-sectional, top and bottom views, respectively, of photoresist layers 142 and 144 formed on metal base 120. Photoresist layers 142 and 144 are deposited in liquid form using roller coating onto surfaces 122 and 124, respectively. A reticle (not shown) is positioned proximate to photoresist layer 142. Thereafter, photoresist layer 142 is patterned by selectively applying light through the reticle, applying a developer solution to remove the photoresist portion rendered soluble by the light, and then hard baking, as is conventional. As a result, photoresist layer 142 contains an opening that selectively exposes routing line 136, and photoresist layer 144 remains unpatterned. Photoresist layers 142 and 144 each have a thickness of 50 microns beyond surfaces 122 and 124, respectively.

Figure 10A:
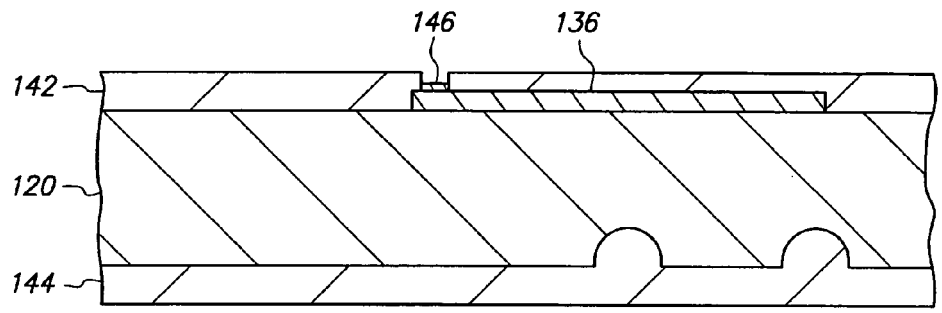
Figure 10B:
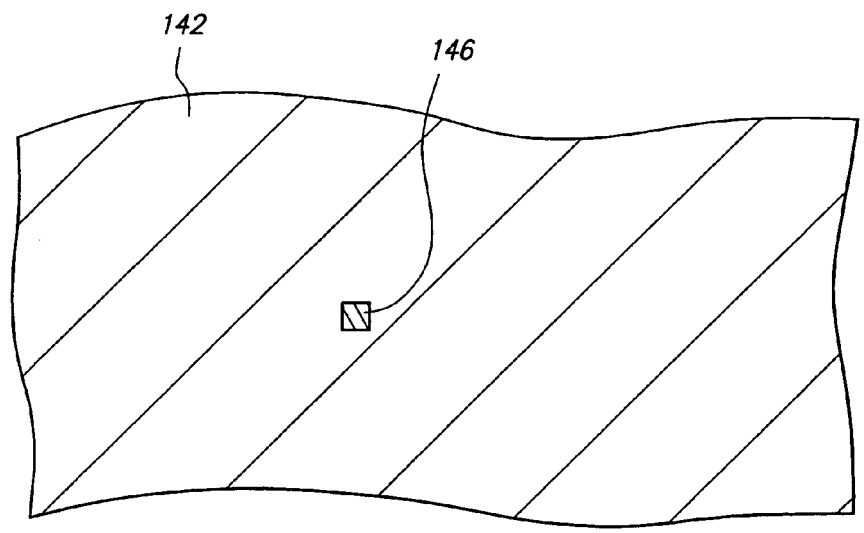
Figure 10C:
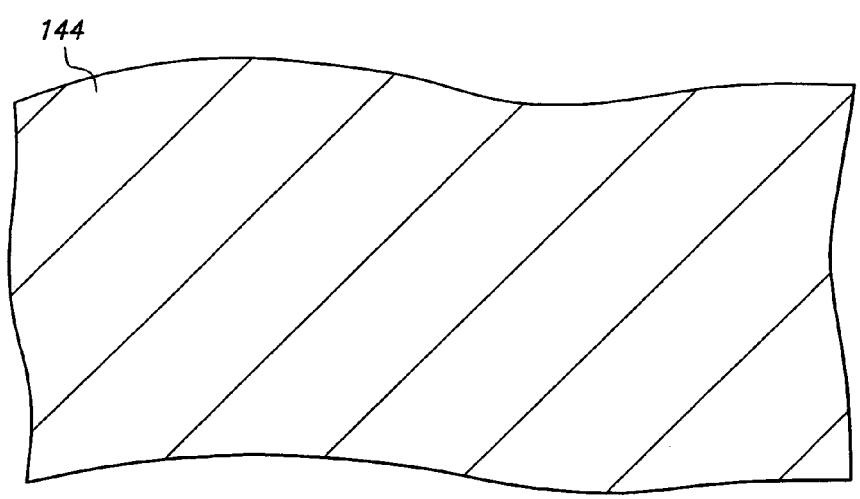

FIGS. 10A, 10B and 10C are cross-sectional, top and bottom views, respectively, of plated contact 146 formed on routing line 136.

Plated contact 146 contacts and is electrically connected to routing line 136, and is spaced from metal base 120. Plated contact 146 is composed of a nickel layer electroplated on routing line 136 and a gold layer electroplated on the nickel layer. The nickel layer contacts and is sandwiched between routing line 136 and the gold layer, and the gold layer contacts the nickel layer and is spaced from routing line 136. Thus, the nickel layer is buried beneath the gold layer, and the gold layer is exposed. Plated contact 146 has a thickness of 3.5 microns. In particular, the nickel layer has a thickness of 3 microns, and the gold layer has a thickness of 0.5 microns. For convenience of illustration, the nickel and gold layers are shown as a single layer.

Plated contact 146 is formed by an electroplating operation using photoresist layers 142 and 144 as plating masks. Thus, plated contact 146 is formed additively. Initially, a plating bus (not shown) is connected to metal base 120, current is applied to the plating bus from an external power source, and the structure is submerged in an electrolytic nickel plating solution such as Technic Techni Nickel "S" at room temperature. As a result, the nickel layer electroplates on the exposed portion of routing line 136. The nickel electroplating operation continues until the nickel layer has the desired thickness. Thereafter, the structure is removed from the electrolytic nickel plating solution and submerged in an electrolytic gold plating solution such as Technic Orotemp at room temperature while current is applied to the plating bus to electroplate the gold layer on the nickel layer. The gold electroplating operation continues until the gold layer has the desired thickness. Thereafter, the structure is removed from the electrolytic gold plating solution and rinsed in distilled water to remove contaminants.

Figure 11A:
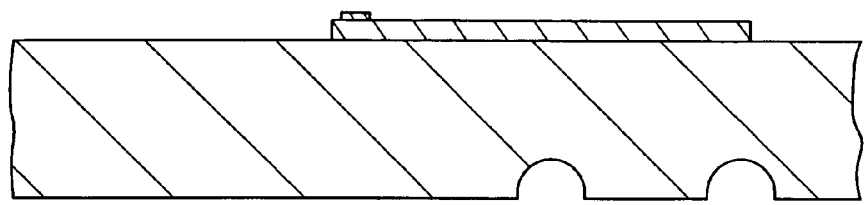
Figure 11B:
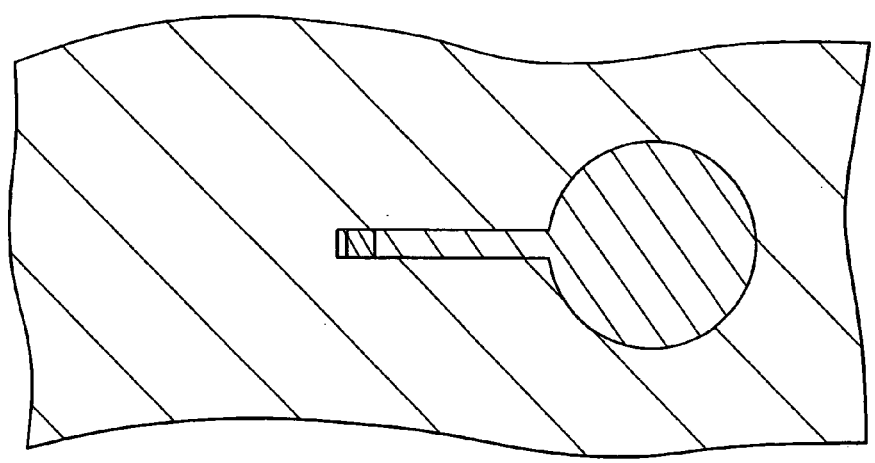
Figure 11C:
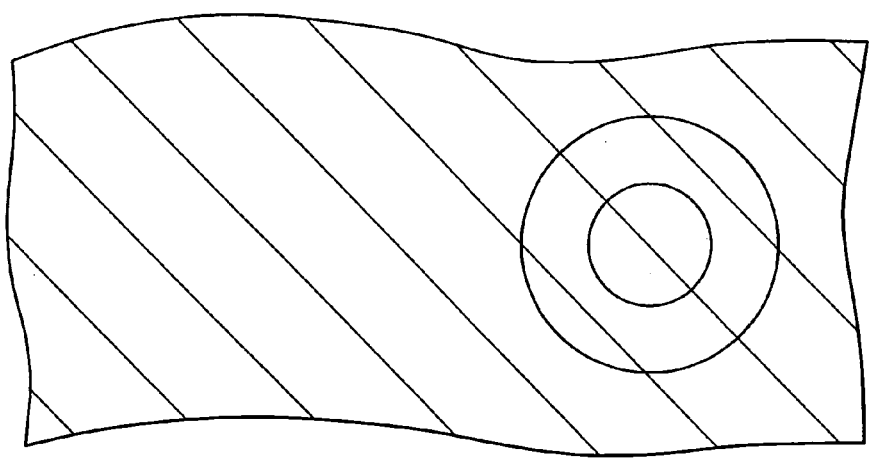

FIGS. 11A, 11B and 11C are cross-sectional, top and bottom views, respectively, of metal base 120, routing line 136 and plated contact 146 after photoresist layers 142 and 144 are stripped. Photoresist layers 142 and 144 are removed using a solvent, such as a mild alkaline solution with a pH of 9, that is highly selective of photoresist with respect to copper, nickel and gold. Therefore, no appreciable amount of metal base 120, routing line 136 or plated contact 146 is removed.

Figure 12A:
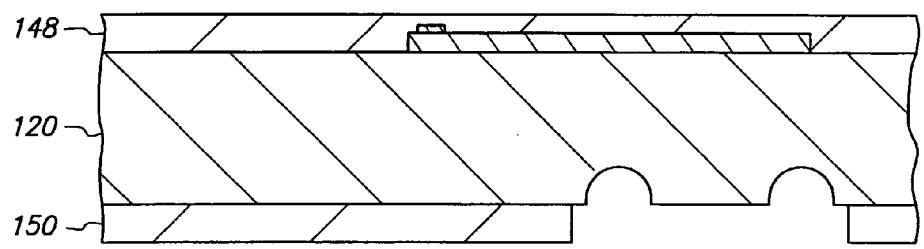
Figure 12B:
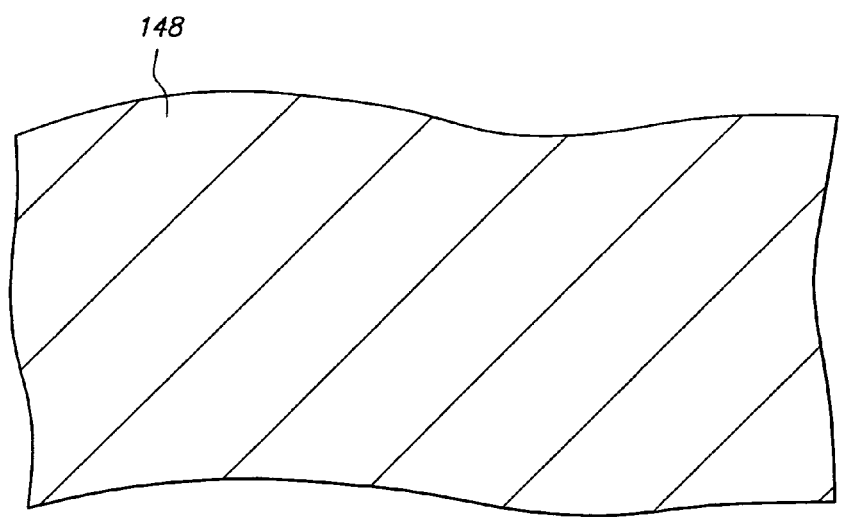
Figure 12C:
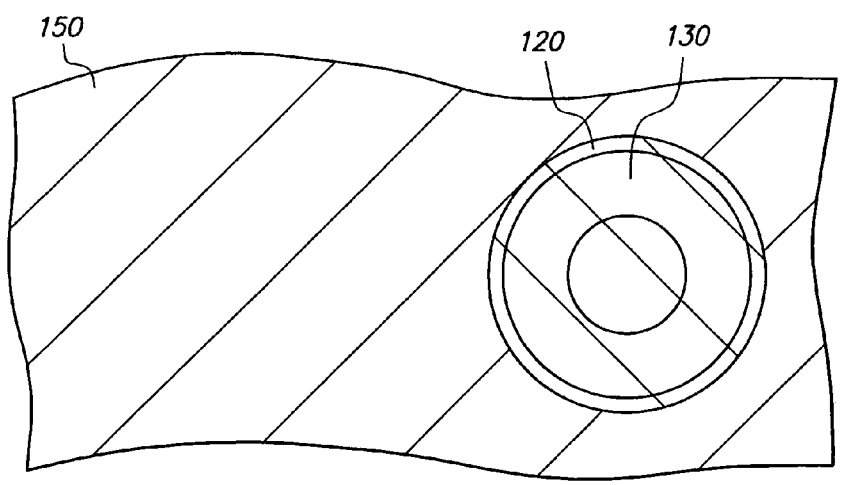

FIGS. 12A, 12B and 12C are cross-sectional, top and bottom views, respectively, of photoresist layers 148 and 150 formed on metal base 120. Photoresist layers 148 and 150 are deposited in liquid form using roller coating onto surfaces 122 and 124, respectively. A reticle (not shown) is positioned proximate to photoresist layer 150. Thereafter, photoresist layer 150 is patterned by selectively applying light through the reticle, applying a developer solution to remove the photoresist portion rendered soluble by the light, and then hard baking, as is conventional. As a result, photoresist layer 150 contains an opening that fully exposes surface portions 124A and 124B and trench 130 and is aligned with the outer diameter of outer surface portion 124B, and photoresist layer 148 remains unpatterned. Photoresist layers 148 and 150 each have a thickness of 50 microns beyond surfaces 122 and 124, respectively.

Figure 13A:
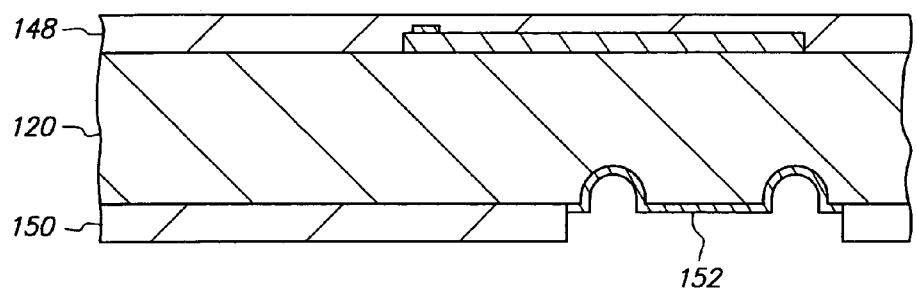
Figure 13B:
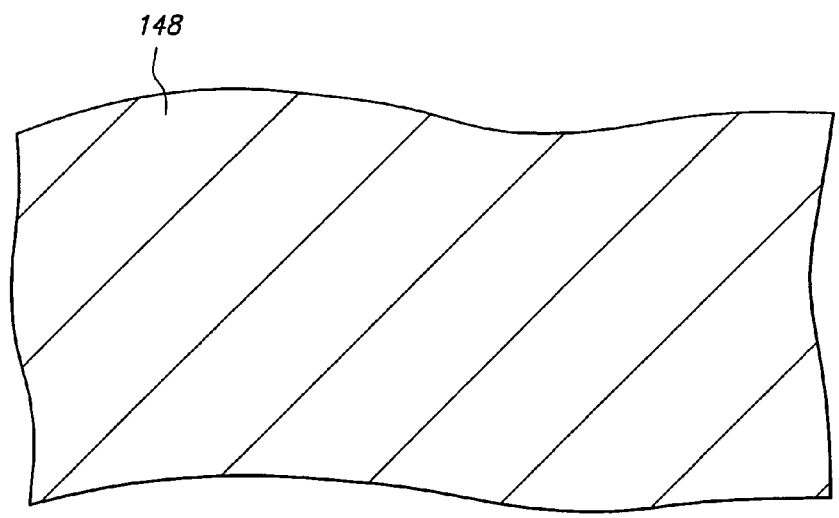
Figure 13C:
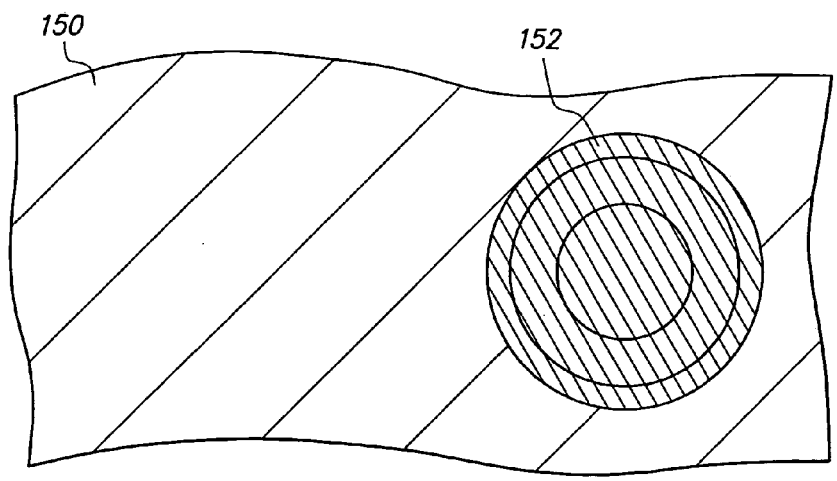

FIGS. 13A, 13B and 13C are cross-sectional, top and bottom views, respectively, of metal layer 152 formed on metal base 120.

Metal layer 152 contacts metal base 120 at surface portions 124A and 124B and trench 130 and is spaced from surface 122 and routing line 136. Metal layer 152 covers surface portions 124A and 124B and trench 130 in the downward direction. Furthermore, metal layer 152 is non-integral with metal base 120 and extends into but does not fill trench 130. Metal layer 152 is composed of solder and has a thickness of 5 microns.

Metal layer 152 is formed by an electroplating operation using photoresist layers 148 and 150 as plating masks. Thus, metal layer 152 is formed additively. Initially, a plating bus (not shown) is connected to metal base 120, current is applied to the plating bus from an external power source, and metal base 120 is submerged in an electrolytic solder plating solution such as Technic Solder NF 72 BC at room temperature. As a result, the solder layer electroplates on the exposed portions of metal base 120. The solder electroplating operation continues until the solder layer has the desired thickness. Thereafter, the structure is removed from the electrolytic solder plating solution and rinsed in distilled water to remove contaminants.

Metal layer 152 is flat at surface portions 124A and 124B, is curved at and contours to trench 130, has a diameter of 450 microns and is vertically aligned with surface portions 124A and 124B, trench 130 and enlarged circular portion 140.

Figure 14A:
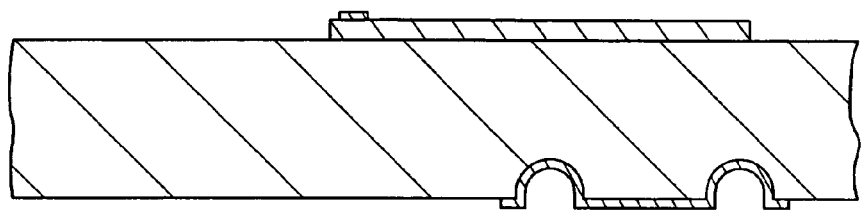
Figure 14B:
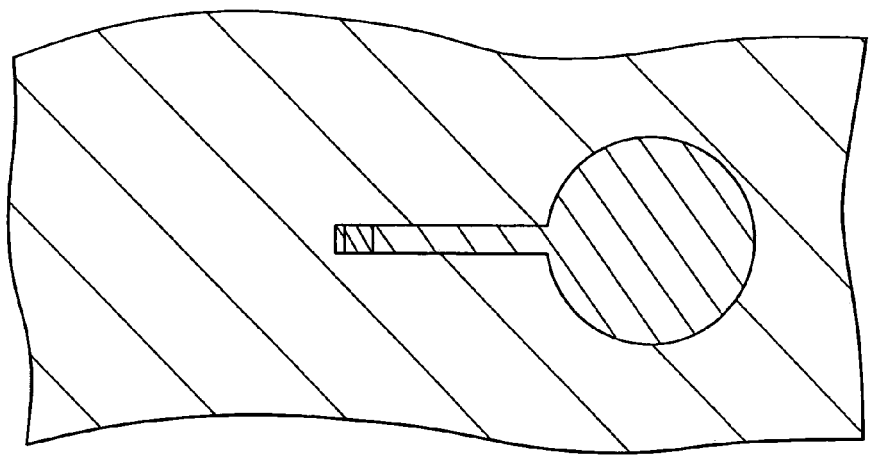
Figure 14C:
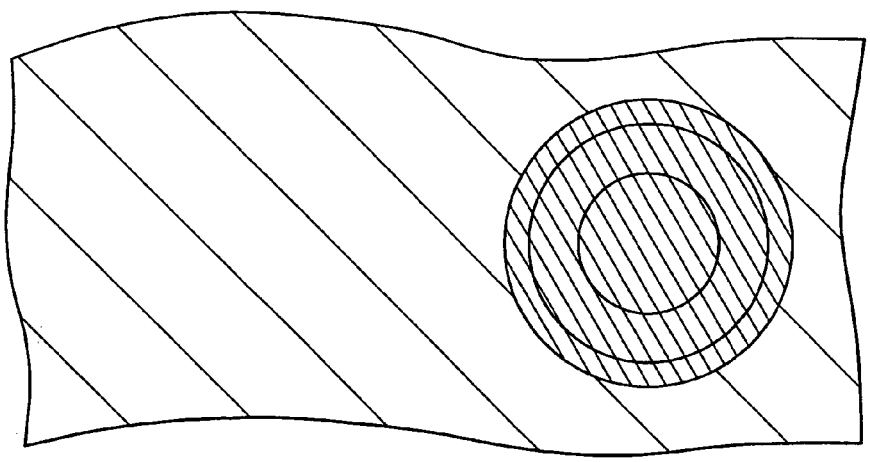

FIGS. 14A, 14B and 14C are cross-sectional, top and bottom views, respectively, of metal base 120, routing line 136, plated contact 146 and metal layer 152 after photoresist layers 148 and 150 are stripped. Photoresist layers 148 and 150 are removed using a solvent, such as a mild alkaline solution with a pH of 9, that is highly selective of photoresist with respect to copper, nickel, gold and solder. Therefore, no appreciable amount of metal base 120, routing line 136, plated contact 146 or metal layer 152 is removed.

Figure 15A:
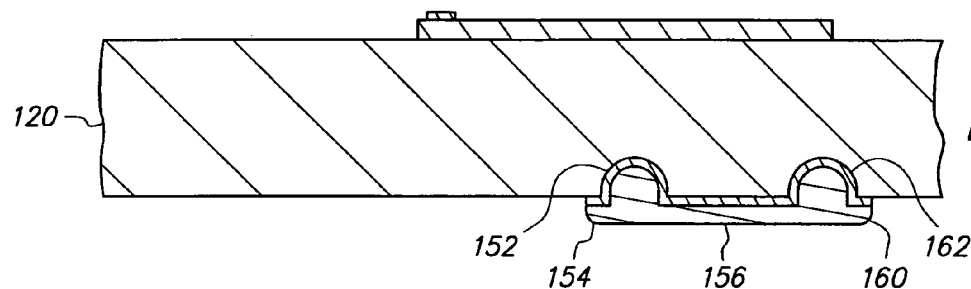
Figure 15B:
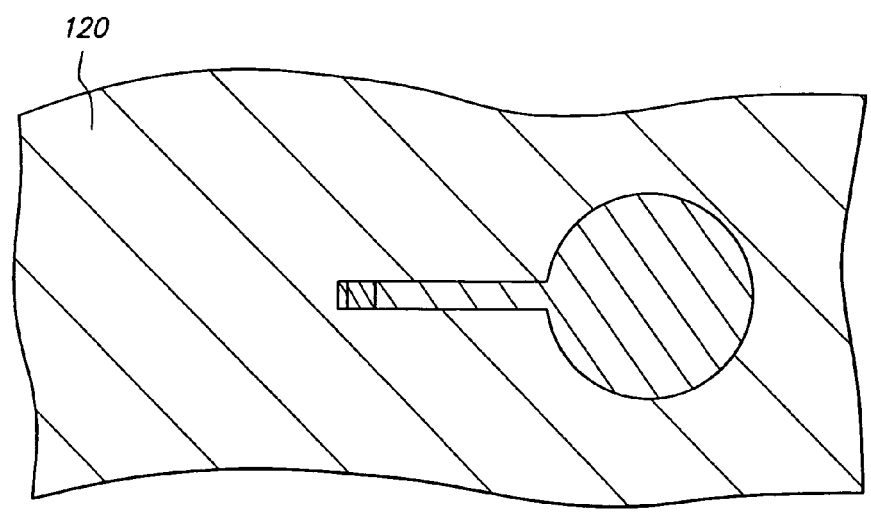
Figure 15C:
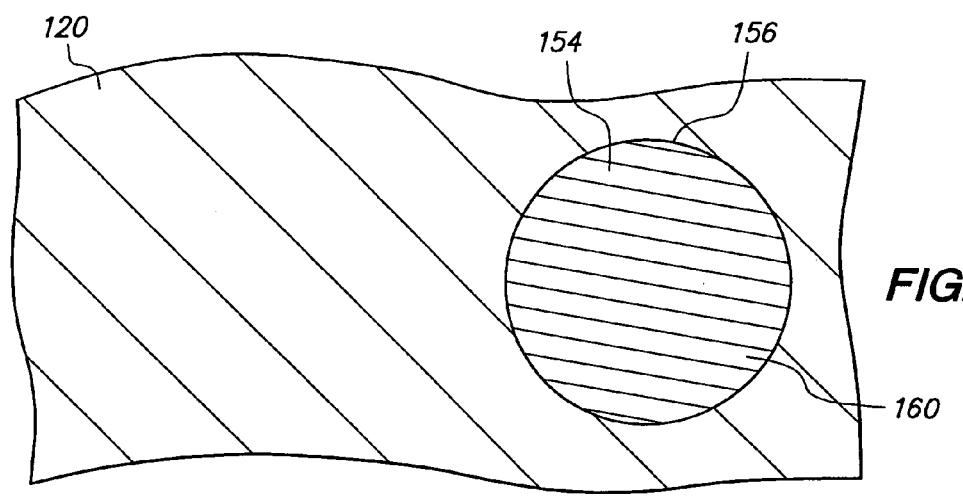
Figure 15D:
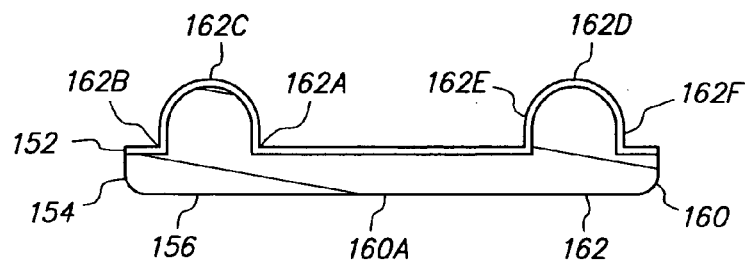
FIGS. 15D, 15E and 15F are enlarged cross-sectional, top and bottom views, respectively, of an etch mask in the first embodiment.
Figure 15E:
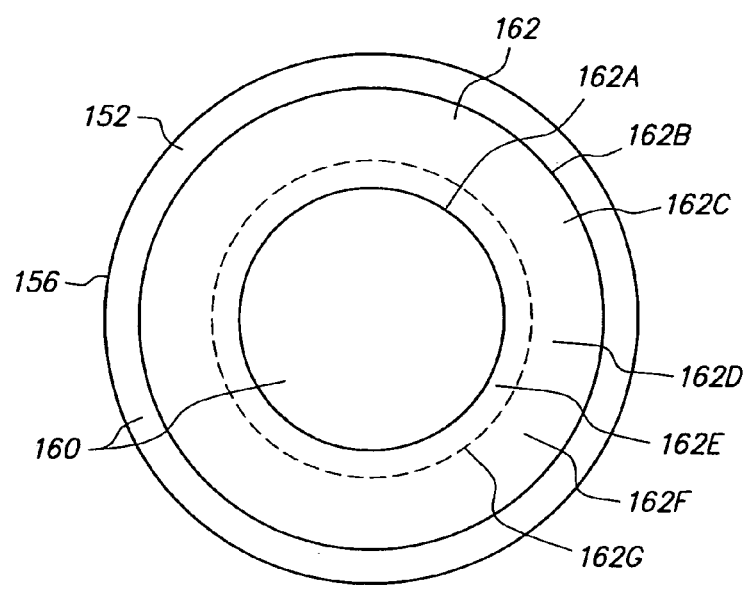
Figure 15F:
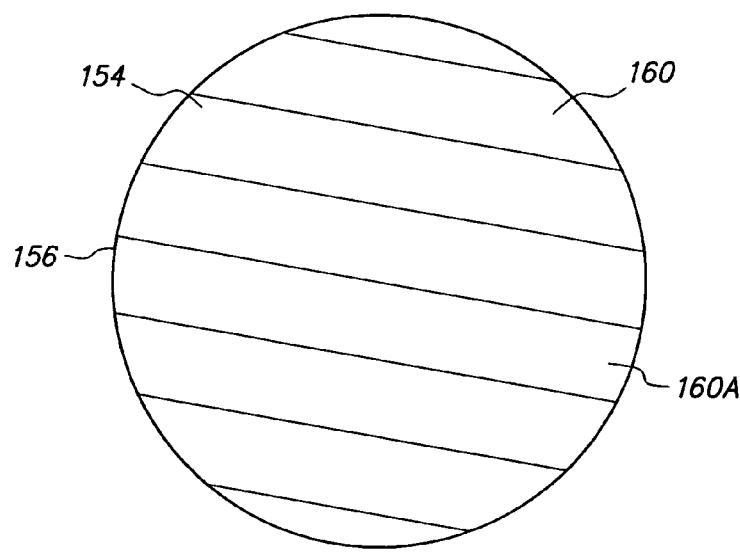

FIGS. 15A, 15B and 15C are cross-sectional, top and bottom views, respectively, of solder layer 154 formed on metal layer 152, and FIGS. 15D, 15E and 15F are enlarged cross-sectional, top and bottom views, respectively, of etch mask 156.

Solder layer 154 contacts and is non-integral with metal layer 152 and is spaced from surface 122 and routing line 136. Solder layer 154 covers metal layer 152 in the downward direction. Furthermore, solder layer 154 extends into and fills the remaining space in trench 130. Solder layer 154 has a thickness of 30 microns in the downward direction relative to surface 124.

Solder layer 154 is formed by depositing solder paste on metal layer 152 and then reflowing the solder paste. The solder paste includes finely powdered tin-silver-copper solder particles mixed in a viscous organic resin containing a fluxing agent. The solder paste is deposited on metal layer 152 using stencil printing. During the stencil printing process, a stencil (not shown) with a thickness of 100 microns is placed over metal base 120, a stencil opening with a diameter of 400 microns is vertically aligned with metal layer 152, and then a squeegee (not shown) pushes the solder paste along the surface of the stencil opposite metal base 120, through the stencil opening and onto metal layer 152. The solder paste is compliant enough at room temperature to conform to virtually any shape. As a result, the solder paste fills the remaining space in trench 130 and extends above trench 130 and metal layer 152 in the stencil opening. However, the solder paste contacts little or none of surface 124.

Thereafter, the structure is heated to a temperature of about 260° C. The heat causes the flux in the solder paste to react with and remove oxides from metal layer 152 and the solder particles in the solder paste, renders the solder particles in the solder paste molten such that they coalesce, and vaporizes the organic resin in the solder paste. As a result, the solder paste contracts from its original size and solder reflow occurs. Although metal layer 152 is also solder, metal layer 152 has a significantly higher melting point than 260° C. and remains solid during the solder reflow. Furthermore, metal layer 152 provides a wettable surface to facilitate the solder reflow, however metal base 120 does not. As a result, the solder reflow is essentially confined to metal layer 152. Thereafter, the heat is removed and the molten solder particles cool and solidify into solder layer 154 which is hardened.

Solder layer 154 has a diameter of 450 microns and is vertically aligned with surface portions 124A and 124B, trench 130, enlarged circular portion 140 and metal layer 152.

Thus, metal layer 152 and solder layer 154 are deposited in sequence. That is, metal layer 152 is electroplated on metal base 120, and then solder paste is deposited on metal layer 152 and then reflowed to form solder layer 154.

Etch mask 156 is composed of metal layer 152 and solder layer 154. Etch mask 156 also includes body 160 and flange 162. Body 160 is the portion of etch mask 156 that is disposed outside trench 130, and flange 162 is the portion of etch mask 156 that is disposed within trench 130. Thus, body 160 and flange 162 are vertically adjacent to one another and each include portions of metal layer 152 and solder layer 154. In addition, etch mask 156, body 160 and flange 162 are solder.

Body 160 contacts surface portions 124A and 124B, covers and extends downwardly beyond surface portions 124A and 124B, trench 130 and flange 162 and has a diameter of 450 microns. Body 160 includes solder surface 160A that faces downwardly and is exposed.

Flange 162 contacts metal base 120 at trench 130, extends upwardly beyond surface portions 124A and 124B and body 160, is spaced from and does not contact but is laterally aligned with and adjacent to surface portions 124A and 124B, and extends into and fills and assumes the shape of trench 130. Flange 162 is proximate to but spaced from the periphery of body 160 by a flat lateral surface of body 160 that covers outer surface portion 124B and has a width of 25 microns.

Flange 162 includes inner diameter 162A, outer diameter 162B, flange surface 162C and flange tip 162D. Inner diameter 162A is identical to inner periphery 130A, and outer diameter 162B is identical to outer periphery 130B. Thus, inner diameter 162A and outer diameter 162B are adjacent to surface portions 124A and 124B, respectively, and to body 160, and are spaced from surface portions 124B and 124A, respectively, and from one another. Flange surface 162C faces upwardly, is a convex arc with substantially constant curvature as it extends laterally from inner diameter 162A to outer diameter 162B and includes flange tip 162D at its apex. Flange surface 162C contacts and is covered by metal base 120, is provided by metal layer 152 and is spaced from solder layer 154. Flange surface 162C includes inner surface portion 162E and outer surface portion 162F. Inner surface portion 162E is adjacent to inner diameter 162A and spaced from outer diameter 162B, outer surface portion 162F is adjacent to outer diameter 162B and spaced from inner diameter 162A, and inner and outer surface portions 162E and 162F are adjacent to one another at circular boundary 162G (shown in phantom) between inner diameter 162A and flange tip 162D. Flange tip 162D is the portion of flange 162 (and flange surface 162C) that extends farthest upwardly and (like trench 130) has a depth of 50 microns relative to surface 124 and is spaced from surface 122 by 100 microns.

Flange 162 has a diameter of 200 microns at inner diameter 162A, a diameter of 400 microns at outer diameter 162B, a width of 100 microns ((400–200)/2) between inner diameter 162A and outer diameter 162B, a depth of 50 microns relative to surface 124 at flange tip 162D and is spaced from surface 122 by 100 microns at flange tip 162D. Flange 162 also has an annular shape at surface 124 (in a lateral plane orthogonal to the upward and downward directions), a hemispherical cross-sectional shape between surfaces 122 and 124 (in a vertical plane parallel to the upward and downward directions) and an overall donut shape.

For convenience of illustration, metal base 120 is shown above metal layer 152 and solder layer 154 to retain a single orientation throughout the figures for ease of comparison between the figures, although the structure would be inverted during the formation of solder layer 154 so that gravitational force would assist with the solder paste deposition and reflow.

Figure 16A:
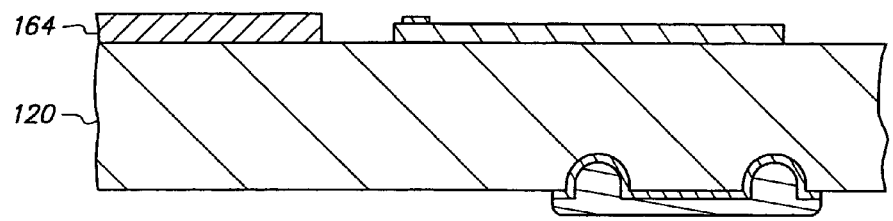
Figure 16B:
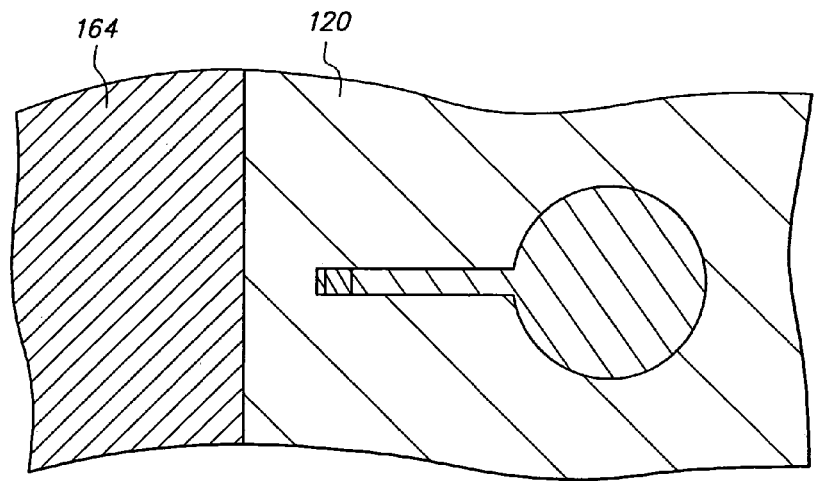
Figure 16C:
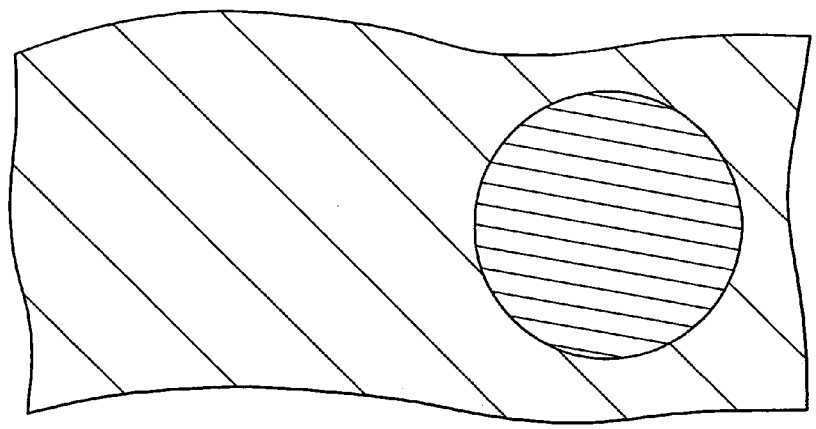

FIGS. 16A, 16B and 16C are cross-sectional, top and bottom views, respectively, of adhesive 164 formed on metal base 120.

Adhesive 164 may include an organic surface protectant such as HK 2000 which is promptly applied to the structure after photoresist layer 150 is removed and solder layer 154 is formed to reduce native oxide formation on the exposed copper surfaces. The use of organic surface protectant layers in insulative adhesives for semiconductor chip assemblies is well-known in the art.

Thereafter, a liquid resin (A stage) such as polyamic acid is applied over metal base 120 using stencil printing. During stencil printing, a stencil (not shown) is placed over metal base 120, routing line 136 and plated contact 146, a stencil opening is aligned with metal base 120 and offset from routing line 136 and plated contact 146, and then a squeegee (not shown) pushes the liquid resin along the surface of the stencil opposite metal base 120, routing line 136 and plated contact 146, through the stencil opening and onto metal base 120 but not routing line 136 and plated contact 146. The liquid resin is compliant enough at room temperature to conform to virtually any shape. Therefore, the liquid resin flows over and covers a portion of metal base 120 but remains spaced from routing line 136 and plated contact 146.

Figure 17A:
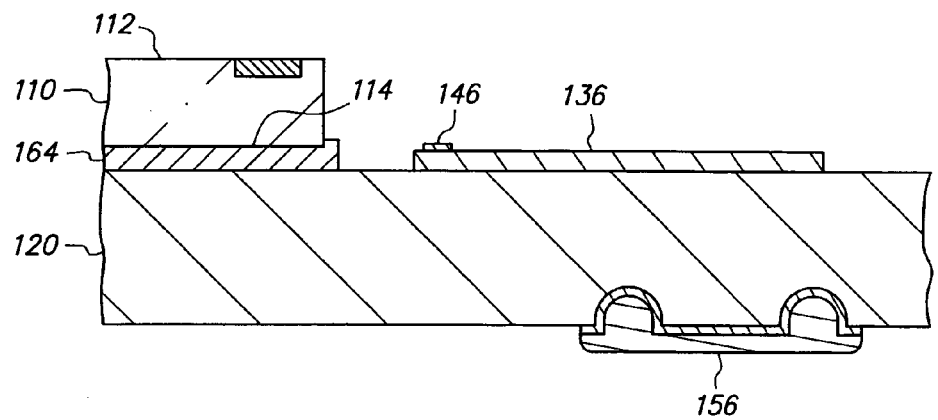
Figure 17B:
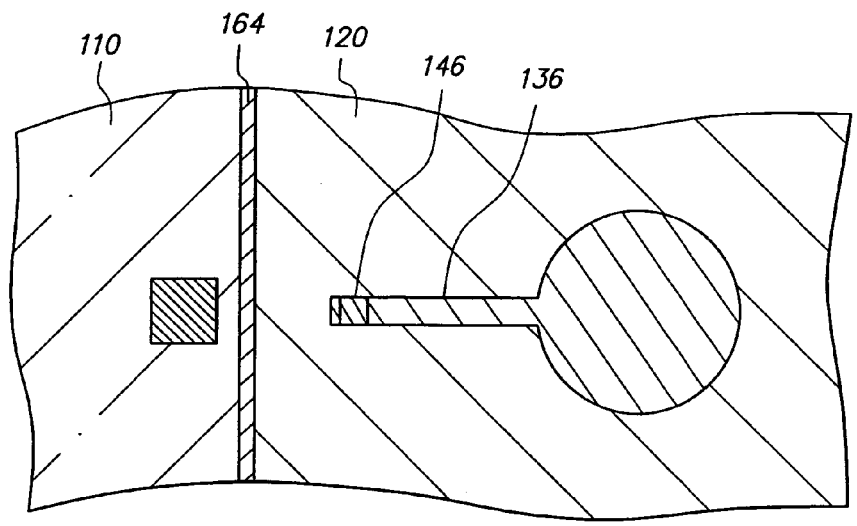
Figure 17C:
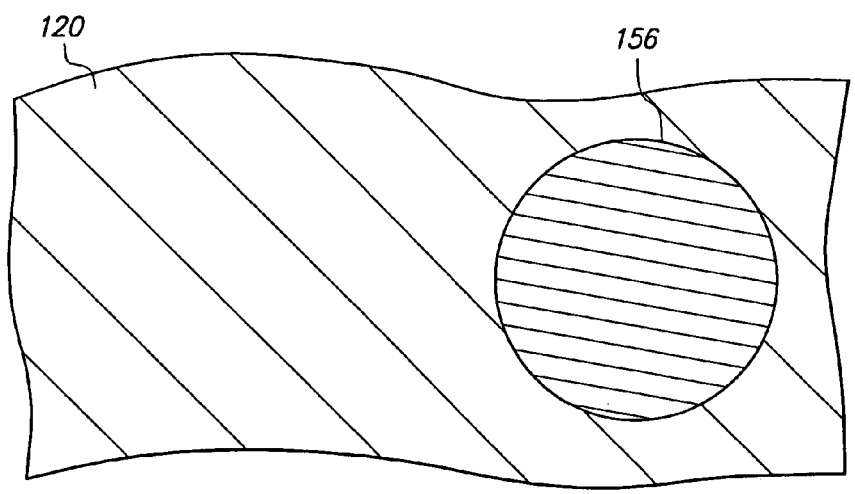

FIGS. 17A, 17B and 17C are cross-sectional, top and bottom views, respectively, of chip 110 mechanically attached to metal base 120, routing line 136, plated contact 146 and etch mask 156 by adhesive 164.

Adhesive 164 contacts and extends between chip 110 and metal base 120 but remains spaced from routing line 136 and plated contact 146. Surface 112 of chip 110 faces upwardly and away from metal base 120 and is exposed, and surface 114 of chip 110 faces downwardly and towards metal base 120 and is covered by adhesive 164. Chip 110 and metal base 120 do not contact one another, and chip 110 and routing line 136 do not contact one another.

Adhesive 164 is sandwiched between chip 110 and metal base 120 using relatively low pressure from a pick-up head that places chip 110 on adhesive 164, holds chip 110 against adhesive 164 for 5 seconds and then releases chip 110. The pick-up head is heated to a relatively low temperature such as 150° C., and adhesive 164 receives heat from the pick-up head transferred through chip 110. As a result, adhesive 164 proximate to chip 110 is partially polymerized (B stage) and forms a gel but is not fully cured, and adhesive 164 that is partially polymerized provides a loose mechanical bond between chip 110 and metal base 120.

Chip 110 and metal base 120 are positioned relative to one another so that chip 110 is disposed within the periphery of adhesive 164, and routing line 136, plated contact 146 and etch mask 156 are disposed outside the periphery of chip 110. Chip 110 and metal base 120 can be aligned using an automated pattern recognition system.

Thereafter, the structure is placed in an oven and adhesive 164 is fully cured (C stage) at relatively low temperature in the range of 200 to 250° C. to form a solid adhesive insulative thermosetting polyimide layer that contacts and is sandwiched between and mechanically attaches chip 110 and metal base 120. Adhesive 164 is 30 microns thick between chip 110 and metal base 120.

At this stage, metal base 120 covers and extends downwardly beyond chip 110, routing line 136, plated contact 146 and adhesive 164, routing line 136 is disposed downwardly beyond and outside the periphery of chip 110 and extends laterally beyond etch mask 156 towards chip 110, etch mask 156 is disposed outside the periphery of chip 110 and extends downwardly beyond chip 110, metal base 120, routing line 136 and plated contact 146, and adhesive 164 extends downwardly beyond chip 110. Furthermore, chip 110 remains electrically isolated from routing line 136.

Figure 18A:
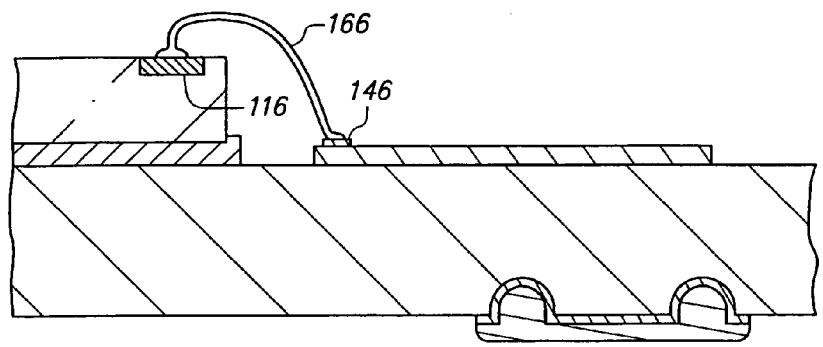
Figure 18B:
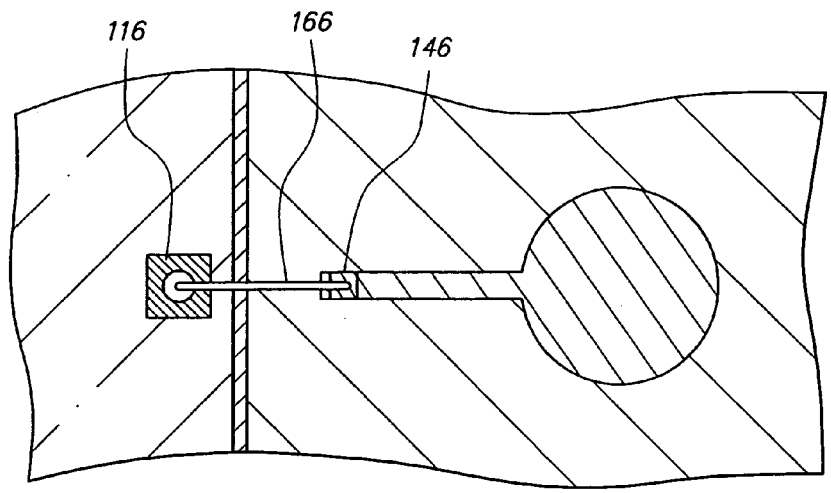
Figure 18C:
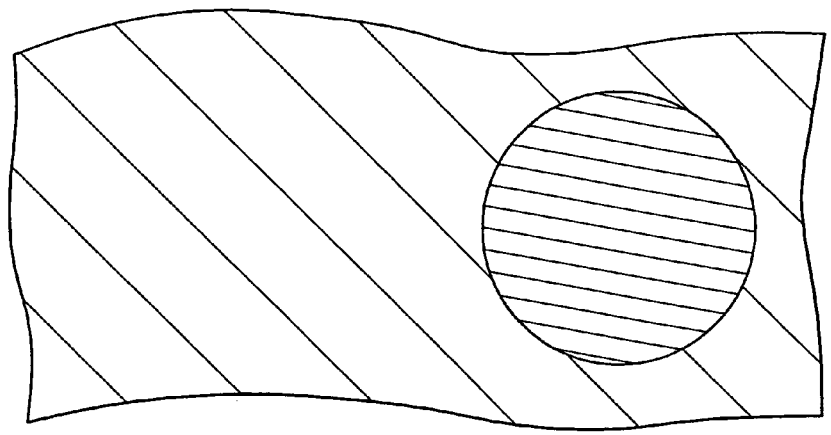

FIGS. 18A, 18B and 18C are cross-sectional, top and bottom views, respectively, of connection joint 166 formed on pad 116 and plated contact 146.

Connection joint 166 is a gold wire bond that is ball bonded to pad 116 and then wedge bonded to plated contact 146. The gold wire between the ball bond and the wedge bond has a thickness of 25 microns. Thus, connection joint 166 contacts and electrically connects pad 116 and plated contact 146, and consequently, electrically connects pad 116 to metal base 120, routing line 136 and etch mask 156. Furthermore, connection joint 166 extends within and outside the periphery of chip 110, extends upwardly beyond chip 110 by 100 microns and is spaced from metal base 120, routing line 136 and etch mask 156.

Figure 19A:
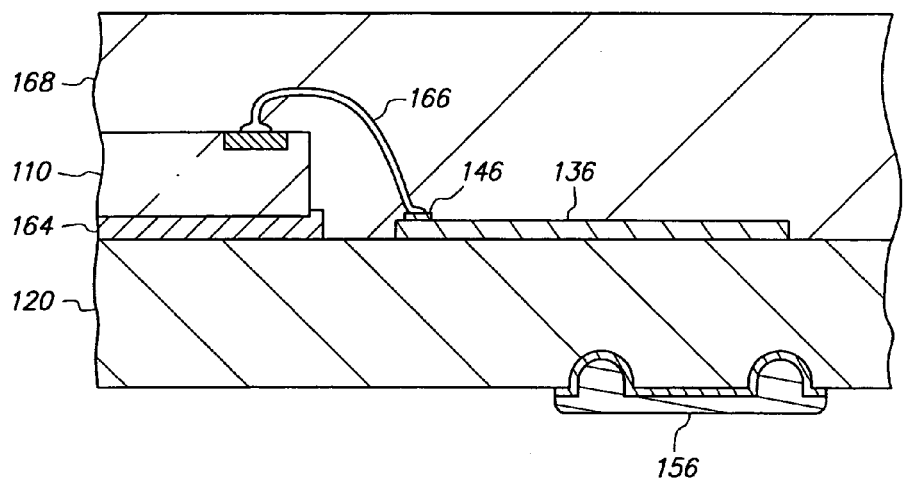
Figure 19B:
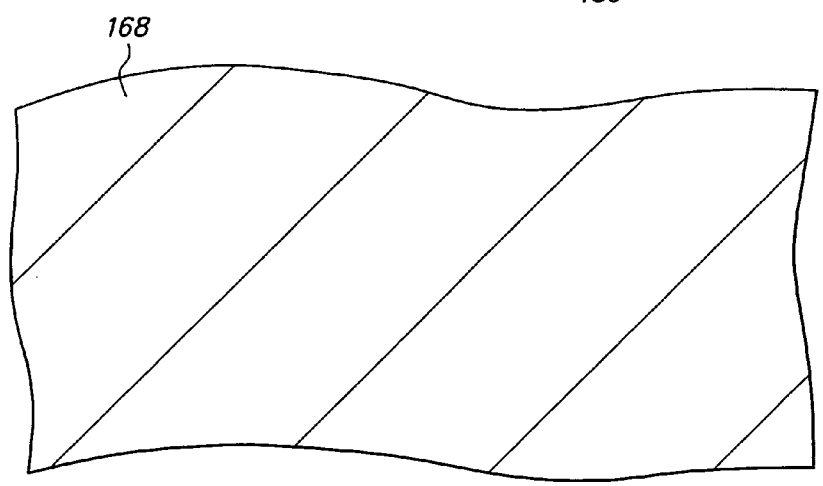
Figure 19C:
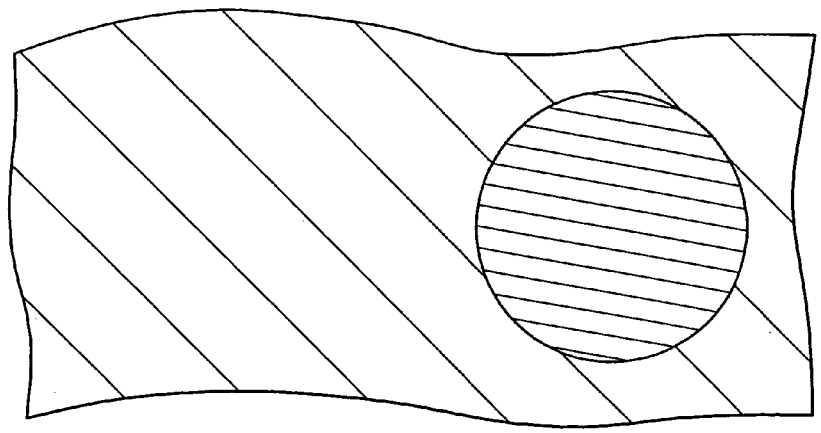

FIGS. 19A, 19B and 19C are cross-sectional, top and bottom views, respectively, of encapsulant 168 formed on chip 110, routing line 136, plated contact 146, adhesive 164 and connection joint 166.

Encapsulant 168 is deposited by transfer molding. Transfer molding is the most popular chip encapsulation method for essentially all plastic packages. Generally speaking, transfer molding involves forming components in a closed mold from a molding compound that is conveyed under pressure in a hot, plastic state from a central reservoir called the transfer pot through a tree-like array of runners and gates into closed cavities. Molding compounds are well-known in the art.

The preferred transfer molding system includes a pre-heater, a mold, a press and a cure oven. The mold includes an upper mold section and a lower mold section, also called "platens" or "halves" which define the mold cavities. The mold also includes the transfer pot, runners, gates and vents. The transfer pot holds the molding compound. The runners and gates provide channels from the transfer pot to the cavities. The gates are placed near the entrances of the cavities and are constricted to control the flow and injection velocity of the molding compound into the cavities and to facilitate removal of the solidified molding compound after molding occurs. The vents allow trapped air to escape but are small enough to permit only a negligible amount of the molding compound to pass through them.

The molding compound is initially in tablet form. The preheater applies high-frequency energy to preheat the molding compound to a temperature in the range of 50 to 100° C. The preheated temperature is below the transfer temperature and therefore the preheated molding compound is not in a fluid state. In addition, the structure is placed in one of the mold cavities, and the press operates hydraulically to close the mold and seal the mold cavities by clamping together the upper and lower mold sections. Guide pins ensure proper mating of the upper and lower mold sections at the parting line. In addition, the mold is heated to a transfer temperature in the range of 150 to 250° C. by inserting electric heating cartridges in the upper and lower mold sections.

After closing the mold, the preheated molding compound in tablet form is placed in the transfer pot. Thereafter, a transfer plunger applies pressure to the molding compound in the transfer pot. The pressure is in the range of 10 to 100 kgf/cm² and preferably is set as high as possible without introducing reliability problems. The combination of heat from the mold and pressure from the transfer plunger converts the molding compound in the transfer pot into a fluid state. Furthermore, the pressure from the transfer plunger forces the fluid molding compound through the runners and the gates into the mold cavities. The pressure is maintained for a certain optimum time to ensure that the molding compound fills the cavities.

The lower mold section contacts and makes sealing engagement with and is generally flush with metal base 120. However, the upper mold section is spaced from connection joint 166 by 120 microns. As a result, the molding compound contacts the exposed portions of the chip 110, metal base 120, routing line 136, plated contact 146, adhesive 164 and connection joint 166 in the cavity. After 1 to 3 minutes at the transfer temperature, the molding compound polymerizes and is partially cured in the mold.

Once the partially cured molding compound is resilient and hard enough to withstand ejection forces without significant permanent deformation, the press opens the mold, ejector pins remove the molded structure from the mold, and excess molding compound attached to the molded structure that solidified in the runners and the gates is trimmed and removed. The molded structure is then loaded into a magazine and postcured in the curing oven for 4 to 16 hours at a temperature somewhat lower than the transfer temperature but well above room temperature to completely cure the molding compound.

The molding compound is a multi-component mixture of an encapsulating resin with various additives. The principal additives include curing agents (or hardeners), accelerators, inert fillers, coupling agents, flame retardants, stress-relief agents, coloring agents and mold-release agents. The encapsulating resin provides a binder, the curing agent provides linear/cross-polymerization, the accelerator enhances the polymerization rate, the inert filler increases thermal conductivity and thermal shock resistance and reduces the thermal coefficient of expansion, resin bleed, shrinkage and residual stress, the coupling agent enhances adhesion to the structure, the flame retardant reduces flammability, the stress-relief agent reduces crack propagation, the coloring agent reduces photonic activity and device visibility, and the mold-release agent facilitates removal from the mold.

Encapsulant 168 contacts and covers chip 110, metal base 120, routing line 136, plated contact 146, adhesive 164 and connection joint 166. More particularly, encapsulant 168 contacts surface 112 and the outer edges of chip 110, but is spaced from surface 114 of chip 110 (due to adhesive 164). Furthermore encapsulant 168 covers but is spaced from etch mask 156.

Encapsulant 168 is a solid adherent compressible protective layer that provides environmental protection such as moisture resistance and particle protection for chip 110 as well as mechanical support for routing line 136. Furthermore, chip 110 is embedded in encapsulant 168.

Encapsulant 168 extends upwardly beyond chip 110, routing line 136, plated contact 146, etch mask 156, adhesive 164 and connection joint 166, has a thickness of 400 microns and extends 120 microns upwardly beyond connection joint 166.

Figure 20A:
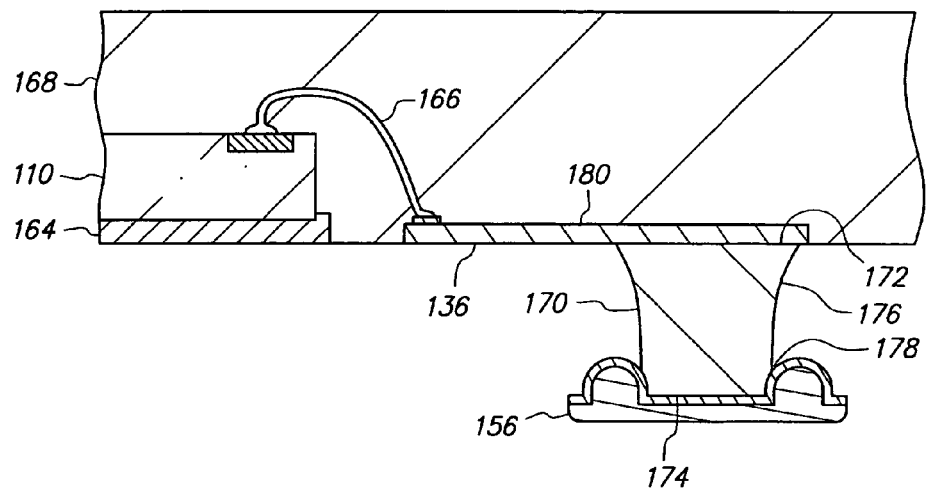
Figure 20B:
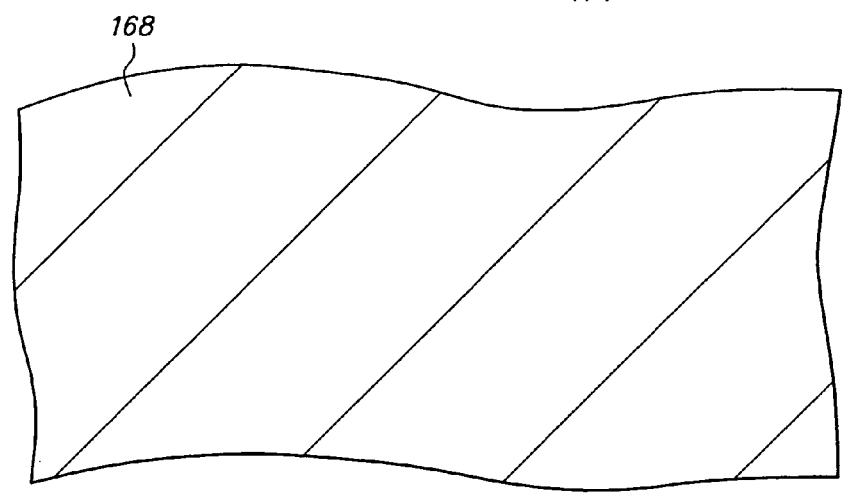
Figure 20C:
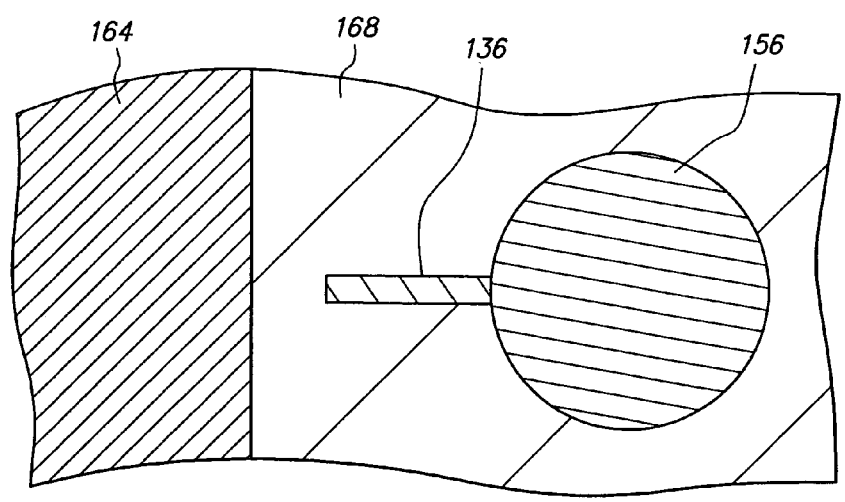
Figure 20D:
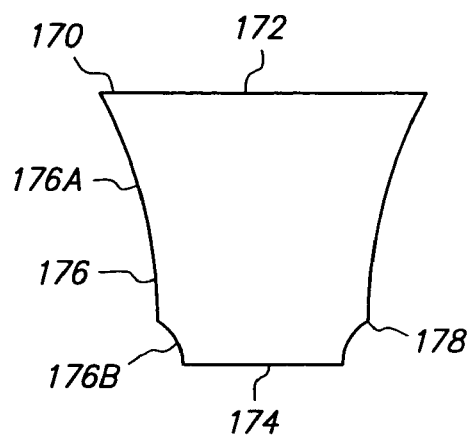
FIGS. 20D, 20E and 20F are enlarged cross-sectional, top and bottom views, respectively, of a metal pillar in the first embodiment.
Figure 20E:
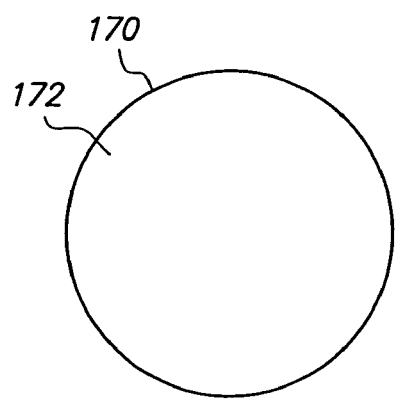
Figure 20F:
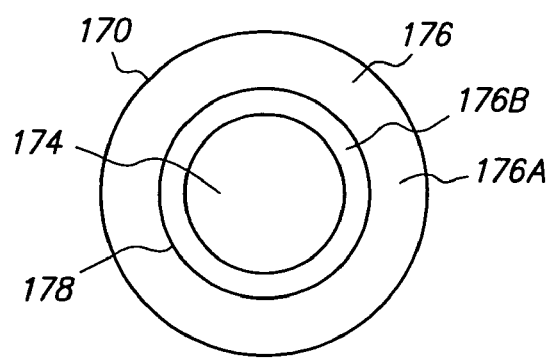

FIGS. 20A, 20B and 20C are cross-sectional, top and bottom views, respectively, of metal pillar 170 formed from metal base 120, and FIGS. 20D, 20E and 20F are enlarged cross-sectional, top and bottom views, respectively, of metal pillar 170.

Metal pillar 170 is an unetched portion of metal base 120 that contacts and is non-integral with routing line 136 and is composed of copper.

Metal pillar 170 is formed by applying a wet chemical etch to metal base 120 using etch mask 156 as a pillar etch mask to selectively protect metal base 120. Thus, metal pillar 170 is an unetched portion of metal base 120 defined by etch mask 156 that is formed subtractively.

A back-side wet chemical etch is applied to surface 124 of metal base 120 and etch mask 156. For instance, the bottom spray nozzle can spray the wet chemical etch on metal base 120 while the top spray nozzle is deactivated, or the structure can be dipped in the wet chemical etch since encapsulant 168 provides front-side protection. The wet chemical etch is highly selective of copper with respect to nickel, solder, polyimide and the molding compound, and therefore, highly selective of metal base 120 with respect to the nickel layer of routing line 136, etch mask 156, adhesive 164 and encapsulant 168.

The wet chemical etch etches completely through metal base 120, thereby effecting a pattern transfer of etch mask 156 onto metal base 120, exposing routing line 136 and adhesive 164, reducing but not eliminating contact area between metal base 120 and routing line 136, and eliminating contact area between metal base 120 and adhesive 164 and between metal base 120 and encapsulant 168. However, no appreciable amount of the nickel layer of routing line 136, etch mask 156, adhesive 164 or encapsulant 168 is removed. Furthermore, the nickel layer of routing line 136 protects the underlying copper layer of routing line 136 from the wet chemical etch. Therefore, no appreciable amount of routing line 136 is removed.

The wet chemical etch removes all of metal base 120 within the periphery of chip 110 and removes most of metal base 120. The wet chemical etch also removes all of outer surface portion 124B and none of inner surface portion 124A.

The wet chemical etch laterally undercuts metal base 120 relative to etch mask 156, causing metal pillar 170 to taper inwardly with increasing height. A suitable taper is between 45 and slightly less than 90 degrees, such as approximately 75 degrees. In particular, the wet chemical etch laterally undercuts metal base 120 relative to outer surface portion 162F, thereby removing all of metal base 120 that contacts outer surface portion 162F and exposing outer surface portion 162F, however the wet chemical etch does not laterally undercut metal base 120 relative to inner surface portion 162E, thereby removing none of metal base 120 that contacts inner surface portion 162E which remains unexposed.

Thus, the wet chemical etch removes outer surface portion 124B and all of metal base 120 that contacts outer surface portion 162F, however the wet chemical etch removes none of inner surface portion 124A or any of metal base 120 that contacts inner surface portion 162E since etch mask 156 protects inner surface portion 124A and all of metal base 120 that contacts inner surface portion 162E from the wet chemical etch. Likewise, the wet chemical etch removes all of metal base 120 adjacent to outer periphery 130B, however the wet chemical etch removes none of metal base 120 adjacent to inner periphery 130A since etch mask 156 protects all of metal base 120 adjacent to inner periphery 130A from the wet chemical etch. Etch mask 156 contacts and covers and extends downwardly beyond inner surface portion 124A, and inner surface portion 124A remains unexposed. As a result, inner surface portion 124A is not exposed to or affected by the wet chemical etch and remains intact. Metal pillar 170 contacts routing line 136 at enlarged circular portion 140, is spaced from elongated routing portion 138 and extends downwardly beyond routing line 136. Thus, metal pillar 170 overlaps routing line 136 in the downward direction, however metal pillar 170 does not cover routing line 136 in the downward direction.

A suitable wet chemical etch can be provided by a solution containing alkaline ammonia. The optimal etch time for exposing metal base 120 to the wet chemical etch in order to etch through metal base 120 and form metal pillar 170 with the desired dimensions without excessively undercutting flange 162 or excessively exposing the nickel layer of routing line 136 to the wet chemical etch can be established through trial and error.

Metal pillar 170 includes pillar base 172, pillar tip 174, tapered sidewalls 176 and spike 178.

Pillar base 172 constitutes an unetched portion of surface 122 of metal base 120, and pillar tip 174 is inner surface portion 124A which constitutes an unetched portion of surface 124 of metal base 120. Thus, pillar base 172 is formed using the wet chemical etch that forms metal pillar 170, and pillar tip 174 is formed using the wet chemical etch that forms trench 130. Pillar base 172 faces upwardly, pillar tip 174 faces downwardly, and pillar base 172 and pillar tip 174 are opposing surfaces that are flat and parallel to surfaces 112 and 114 of chip 110, routing line 136 and one another. Pillar base 172 contacts and is non-integral with and faces towards routing line 136 and is spaced from and faces away from etch mask 156, and pillar tip 174 contacts and is non-integral with and faces towards etch mask 156 and is spaced from and faces away from routing line 136.

Tapered sidewalls 176 are adjacent to and extend between pillar base 172 and pillar tip 174 and slant inwardly towards pillar tip 174. Tapered sidewalls 176 include base sidewall portion 176A and tip sidewall portion 176B. Base sidewall portion 176A is adjacent to pillar base 172, spaced from trench 130 and pillar tip 174 and extends upwardly beyond tip sidewall portion 176B and spike 178, tip sidewall portion 176B is adjacent to trench 130 and pillar tip 174, spaced from pillar base 172 and extends downwardly beyond base sidewall portion 176A and spike 178, and sidewall portions 176A and 176B are adjacent to one another at spike 178. Thus, base sidewall portion 176A is formed using the wet chemical etch that forms metal pillar 170, and tip sidewall portion 176B is formed using the wet chemical etch that forms trench 130. Base sidewall portion 176A is a continuous concave arc that slants inwardly as it extends downwardly between pillar base 172 and spike 178 towards pillar tip 174, has a maximum diameter at pillar base 172 and a minimum diameter at spike 178, extends laterally beyond spike 178 only in the outward direction and extends vertically beyond spike 178 only in the upward direction. Tip sidewall portion 176B is a continuous concave arc that slants inwardly as it extends downwardly between spike 178 and pillar tip 174 towards pillar tip 174, has a maximum diameter at spike 178 and a minimum diameter at pillar tip 174, extends laterally beyond spike 178 only in the inward direction and extends vertically beyond spike 178 only in the downward direction.

Spike 178 is the portion of metal pillar 170 at the boundary between sidewall portions 176A and 176B. Thus, spike 178 is adjacent to sidewall portions 176A and 176B and spaced from pillar base 172 and pillar tip 174. Spike 178 protrudes laterally as well as downwardly from metal pillar 170, spans 360 degrees laterally around metal pillar 170 at a constant vertical distance between pillar base 172 and pillar tip 174 and provides an abrupt discontinuity between sidewall portions 176A and 176B. Spike 178 is spaced from pillar base 172 by a vertical distance of 105 microns and is spaced from pillar tip 174 by a vertical distance of 45 microns. Thus, spike 178 is disposed downwardly beyond flange tip 162D by 5 microns (50–45) and is more than twice the vertical distance from pillar base 172 than from pillar tip 174. Furthermore, spike 178 is located proximate to but spaced from flange tip 162D, between inner diameter 162A and flange tip 162D, and therefore extends laterally and downwardly slightly beyond flange tip 162D, is slightly closer than flange tip 162D is to body 160, inner diameter 162A and pillar tip 174, and is slightly farther than flange tip 162D is to routing line 136, outer diameter 162B and pillar base 172.

Metal pillar 170 results from two sequential wet chemical etches. Pillar tip 174 and tip sidewall portion 176B are formed using a first wet chemical etch that forms trench 130 and does not affect or form pillar base 172 or base sidewall portion 176A, and then pillar base 172 and base sidewall portion 176A are formed using a second wet chemical etch that completes the formation of metal pillar 170 and does not affect or form pillar tip 174 or tip sidewall portion 176B. Moreover, since the first wet chemical etch only begins the formation of metal pillar 170, and the second wet chemical etch completes the formation of metal pillar 170, the second wet chemical etch "forms" metal pillar 170.

Metal pillar 170 has a generally conical shape with a height (between pillar base 172 and pillar tip 174) of 150 microns and a diameter that substantially continuously decreases as metal pillar 170 extends downwardly (from pillar base 172 to pillar tip 174). Pillar base 172 has a circular shape with a diameter of 250 microns, and pillar tip 174 has a circular shape with a diameter of 200 microns. Pillar base 172 and pillar tip 174 are vertically aligned with enlarged circular portion 140, etch mask 156 and one another. Thus, pillar tip 174 is concentrically disposed within the surface area of enlarged circular portion 140, etch mask 156 and pillar base 172. Furthermore, pillar base 172 has a surface area that is at least 20 percent larger than the surface area of pillar tip 174.

Metal pillar 170 is disposed outside the periphery of chip 110 and extends downwardly beyond chip 110, routing line 136, adhesive 164, connection joint 166 and encapsulant 168. Furthermore, chip 110 extends upwardly beyond routing line 136, etch mask 156 and metal pillar 170, routing line 136 is disposed upwardly beyond etch mask 156 and metal pillar 170 and extends laterally beyond etch mask 156 and metal pillar 170 towards chip 110, and encapsulant 168 covers and extends upwardly beyond chip 110, routing line 136, etch mask 156, adhesive 164, connection joint 166 and metal pillar 170.

Encapsulant 168 provides mechanical support for routing line 136, etch mask 156 and metal pillar 170 and reduces mechanical strain on adhesive 164, which is particularly useful after metal base 120 is etched to form metal pillar 170. Encapsulant 168 protects routing line 136 and metal pillar 170 from mechanical damage by the wet chemical etch and subsequent cleaning steps (such as rinsing in distilled water and air blowing). For instance, encapsulant 168 absorbs physical force of the wet chemical etch and cleaning steps that might otherwise separate chip 110 and routing line 136. Thus, encapsulant 168 improves structural integrity and allows the wet chemical etch and subsequent cleaning steps to be applied more vigorously, thereby improving manufacturing throughput.

Conductive trace 180 includes routing line 136, plated contact 146, etch mask 156 and metal pillar 170. Conductive trace 180 is adapted for providing horizontal and vertical routing between pad 116 and a next level assembly.

Figure 21A:
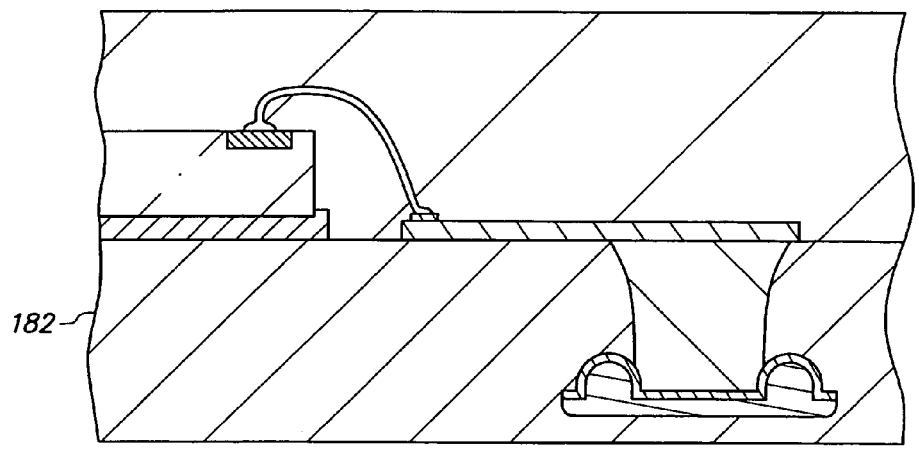
Figure 21B:
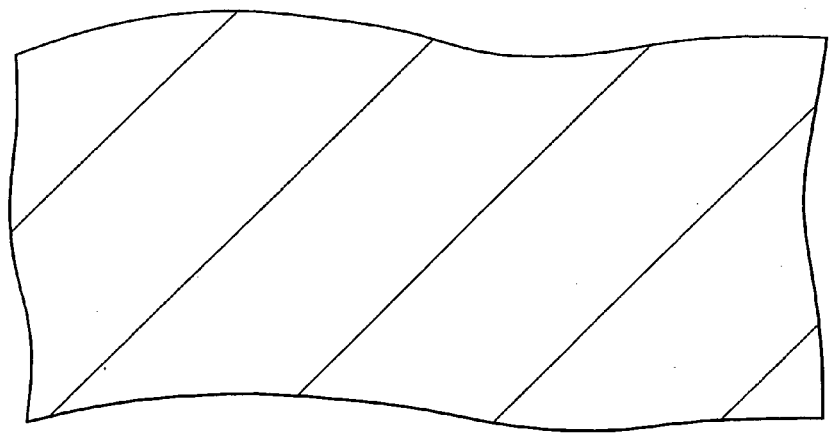
Figure 21C:
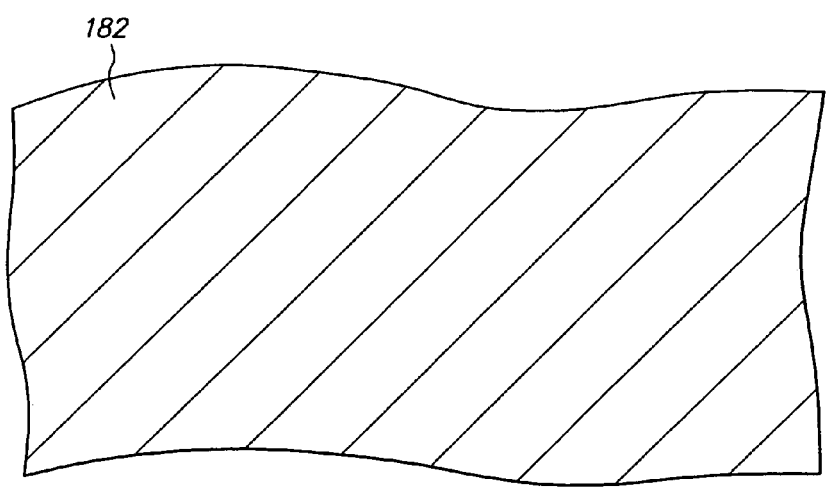

FIGS. 21A, 21B and 21C are cross-sectional, top and bottom views, respectively, of insulative base 182 formed on routing line 136, etch mask 156, adhesive 164, encapsulant 168 and metal pillar 170.

Insulative base 182 is initially an epoxy in paste form that includes an epoxy resin, a curing agent, an accelerator and a filler. The filler is an inert material, such as silica (powdered fused quartz), that improves thermal conductivity, thermal shock resistance, and thermal coefficient of expansion matching. The epoxy paste is blanketly deposited on routing line 136, etch mask 156, adhesive 164, encapsulant 168 and metal pillar 170, and then the epoxy paste is cured or hardened at a relatively low temperature in the range of 100 to 250° C. to form a solid adherent insulator that provides a protective seal for routing line 136 and metal pillar 170.

Insulative base 182 contacts and covers and extends downwardly beyond routing line 136, etch mask 156, adhesive 164, encapsulant 168 and metal pillar 170, covers and extends downwardly beyond and is spaced from chip 110, plated contact 146 and connection joint 166, and has a thickness of 250 microns. Thus, insulative base 182 extends downwardly beyond routing line 136, etch mask 156 and metal pillar 170 and routing line 136, etch mask 156 and metal pillar 170 are unexposed.

For convenience of illustration, insulative base 182 is shown below chip 110 to retain a single orientation throughout the figures for ease of comparison between the figures, although in this step the structure would be inverted so that gravitational force would assist the epoxy paste deposition.

Figure 22A:
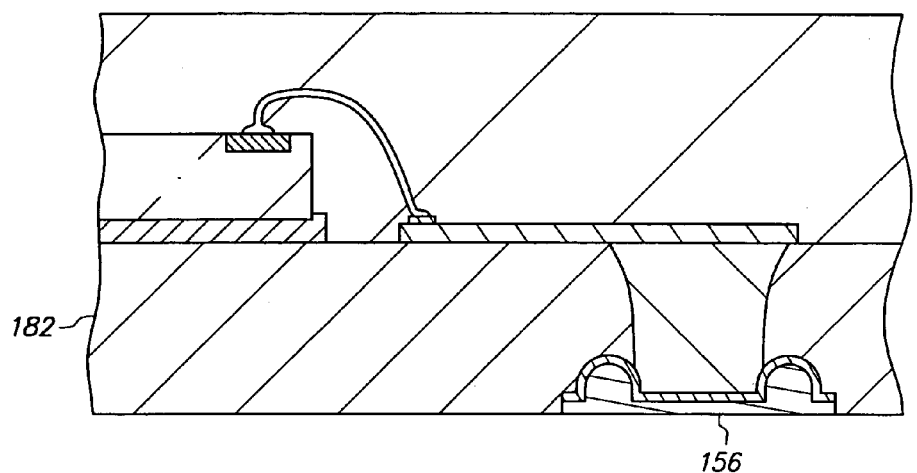
Figure 22B:
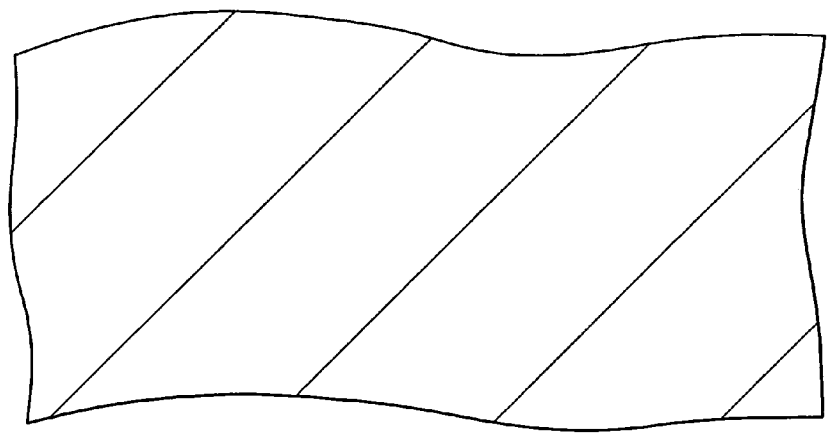
Figure 22C:
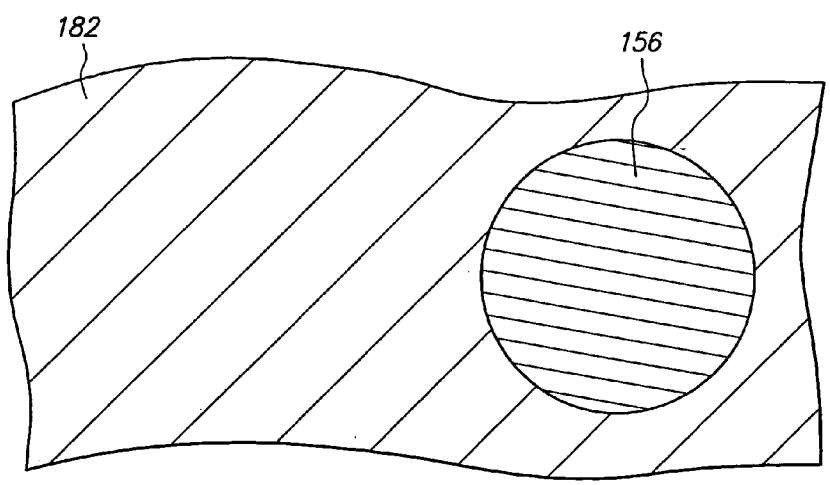

FIGS. 22A, 22B and 22C are cross-sectional, top and bottom views, respectively, of the structure after a lower portion of insulative base 182 is removed.

The lower portion of insulative base 182 is removed by grinding. In particular, a rotating diamond sand wheel and distilled water are applied to the back-side of insulative base 182. Initially, the diamond sand wheel grinds only insulative base 182. As the grinding continues, insulative base 182 becomes thinner as the grinded surface migrates upwardly. Eventually the diamond sand wheel contacts etch mask 156, and as a result, begins to grind solder layer 154 as well. As the grinding continues, solder layer 154 and insulative base 182 become thinner as their grinded surfaces migrate upwardly. The grinding continues until solder layer 154 and insulative base 182 have the desired thickness, and then halts before it reaches chip 110, routing line 136, plated contact 146, metal layer 152, adhesive 164, connection joint 166 or encapsulant 168. Thereafter, the structure is rinsed in distilled water to remove contaminants.

Solder layer 154 and insulative base 182 extend downwardly beyond metal pillar 170 by 20 microns after the grinding operation. Thus, the grinding removes a 10 micron thick lower portion of solder layer 154 and a 30 micron thick lower portion of insulative base 182.

At this stage, chip 110 remains embedded in encapsulant 168, metal pillar 170 remains embedded in insulative base 182, routing line 136, metal layer 152 and metal pillar 170 remain unexposed, and solder layer 154 is exposed. Insulative base 182 continues to contact and cover and extend downwardly beyond adhesive 164, cover and extend downwardly beyond and be spaced from chip 110, plated contact 146 and connection joint 166, contact and extend downwardly beyond routing line 136, encapsulant 168 and metal pillar 170, and contact etch mask 156. Insulative base 182 also continues to overlap etch mask 156, encapsulant 168 and metal pillar 170 in the downward direction, however insulative base 182 no longer covers etch mask 156, encapsulant 168 or metal pillar 170 in the downward direction. Thus, etch mask 156 is exposed and routing line 136 and metal pillar 170 remain unexposed. Furthermore, solder layer 154 and insulative base 182 are laterally aligned with one another at a surface that faces downwardly. Thus, an exposed planarized horizontal surface that faces downwardly includes solder layer 154 and insulative base 182.

Figure 23A:
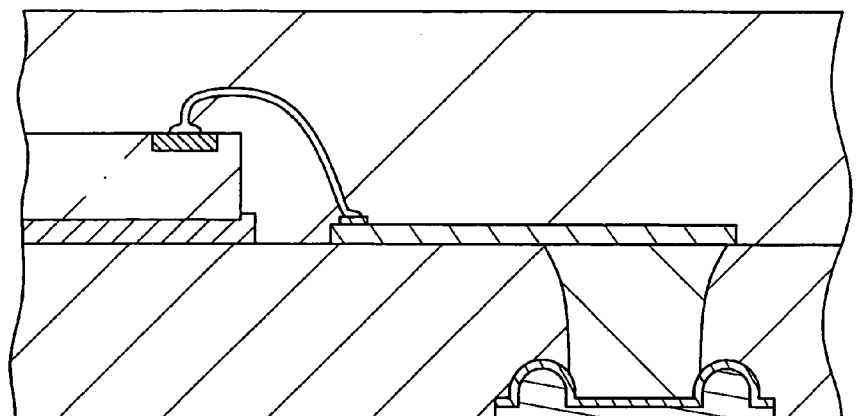
Figure 23B:
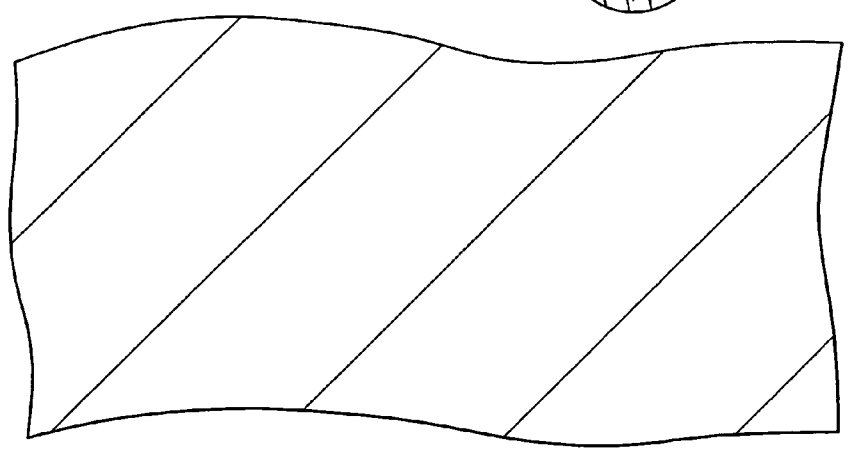
Figure 23C:
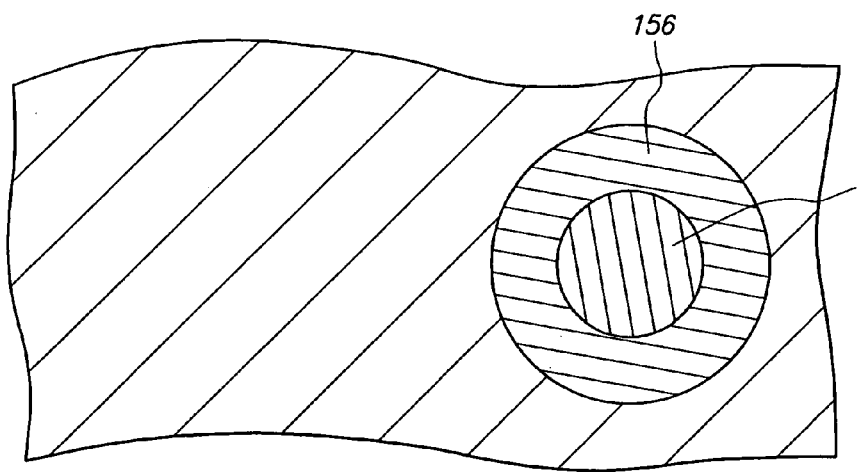

FIGS. 23A, 23B and 23C are cross-sectional, top and bottom views, respectively, of solder ball 184 formed on etch mask 156.

Solder ball 184 is initially a lead-free ball with a spherical shape and a diameter of 300 microns. The lead-free ball is dipped in flux to provide solder ball 184 with a flux surface coating that surrounds the lead-free ball. Thereafter, the structure is inverted so that etch mask 156 faces upwardly, and then solder ball 184 is deposited on etch mask 156. Solder ball 184 weakly adheres to etch mask 156 due to the flux surface coating of solder ball 184.

For convenience of illustration, solder ball 184 is shown below etch mask 156 to retain a single orientation throughout the figures for ease of comparison between the figures, although the structure would be inverted during the deposition of solder ball 184 so that gravitational force would assist with the adhesion of solder ball 184 to etch mask 156.

Figure 24A:
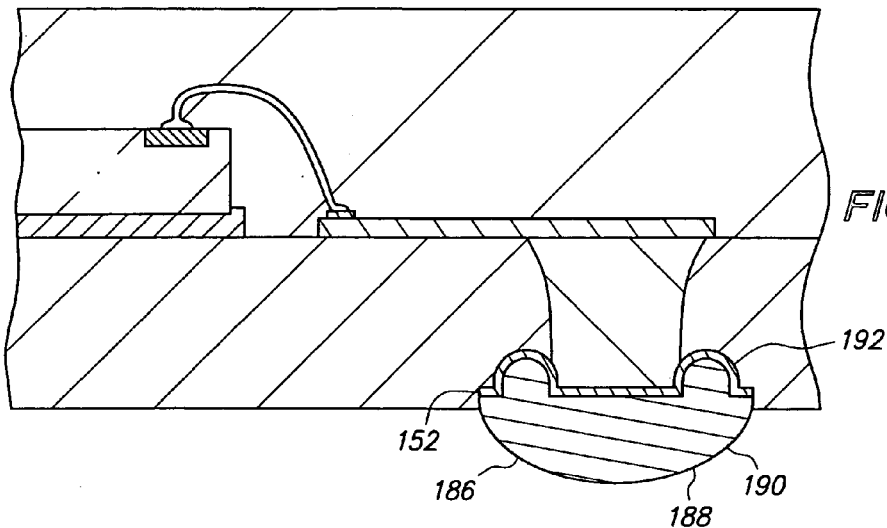
Figure 24B:
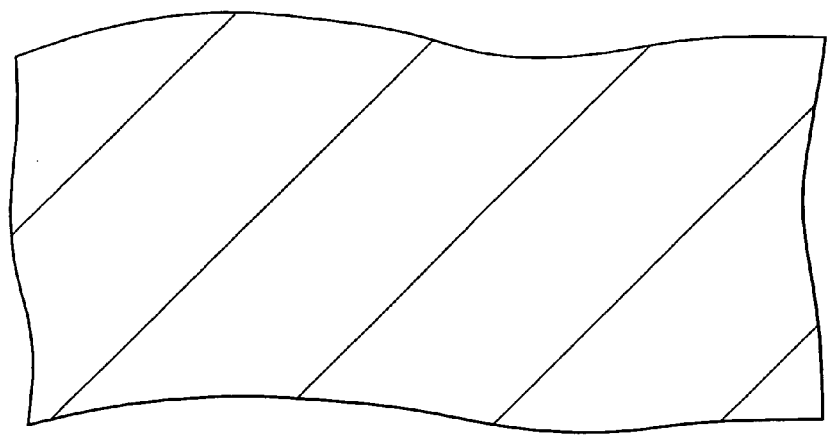
Figure 24C:
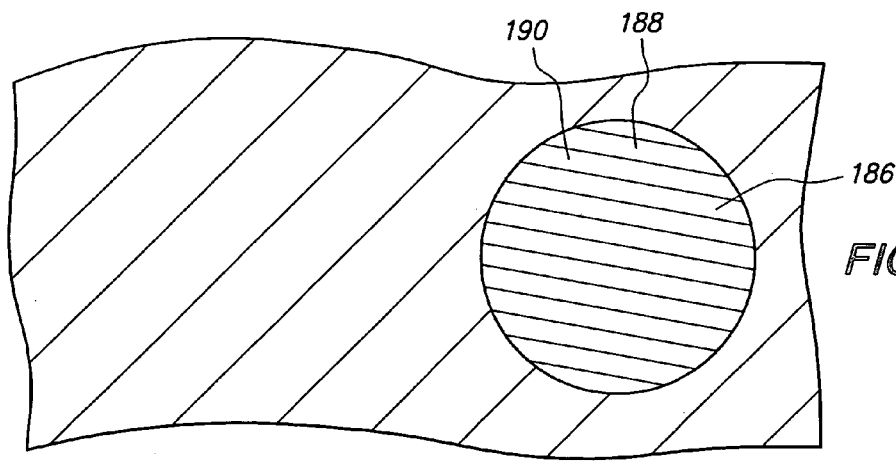
Figure 24D:
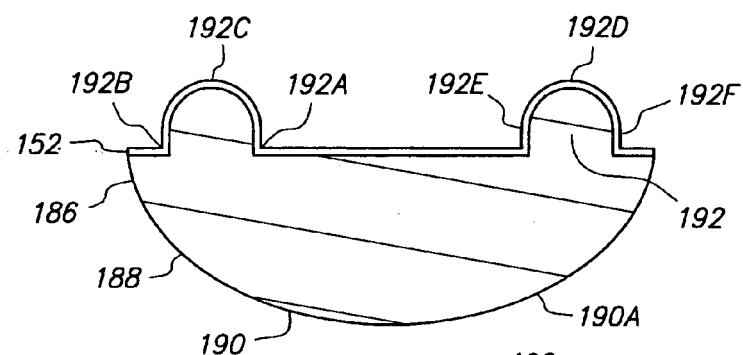
FIGS. 24D, 24E and 24F are enlarged cross-sectional, top and bottom views, respectively, of a contact terminal in the first embodiment.
Figure 24E:
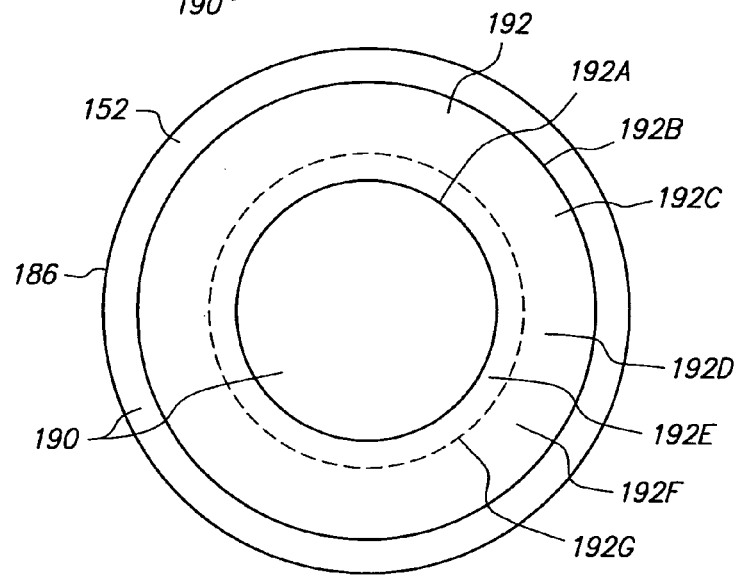
Figure 24F:
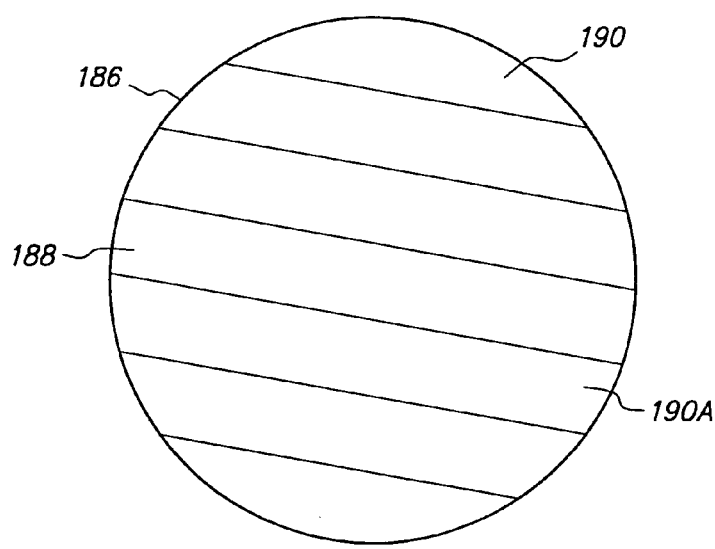

FIGS. 24A, 24B and 24C are cross-sectional, top and bottom views, respectively, of contact terminal 186 formed on metal pillar 170, and FIGS. 24D, 24E and 24F are enlarged cross-sectional, top and bottom views, respectively, of contact terminal 186.

Contact terminal 186 includes metal layer 152 and solder layer 188, and solder layer 188 is formed from solder layer 154 and solder ball 184.

Initially, solder ball 184 rests upon solder layer 154. Thereafter, the structure is heated to a temperature of about 260° C. The heat causes the flux in solder ball 184 to react with and remove oxides from solder layer 154 and renders solder layer 154 and solder ball 184 molten. As a result, solder layer 154 and solder ball 184 reflow together into a molten solder mixture and solder reflow occurs. Although metal layer 152 is also solder, metal layer 152 has a significantly higher melting point than 260° C. and remains solid during the solder reflow. Furthermore, metal layer 152 provides a wettable surface to facilitate the solder reflow, however insulative base 182 does not. As a result, the solder reflow is essentially confined to metal layer 152. Thereafter, the heat is removed and the molten solder cools and solidifies into solder layer 188 which is hardened. In this manner, solder layer 154 and solder ball 184 are converted into solder layer 188.

Solder layer 188 has a diameter of 450 microns, a thickness of 50 microns in the downward direction relative to insulative base 182 and is vertically aligned with enlarged circular portion 140, metal layer 152 and metal pillar 170.

Thus, etch mask 156 and contact terminal 186 are formed in sequence. That is, metal layer 152 is electroplated on metal base 120, then solder paste is deposited on metal layer 152 and then reflowed to form solder layer 154 (thereby forming etch mask 156), then solder ball 184 is deposited on solder layer 154, and then solder layer 154 and solder ball 184 are reflowed together to form solder layer 188 (thereby forming contact terminal 186).

Contact terminal 186 contacts and is non-integral with metal pillar 170 and is spaced from routing line 136. In particular, contact terminal 186 contacts pillar tip 174 and tip sidewall portion 176B, covers pillar tip 174 and tip sidewall portion 176B in the downward direction and is spaced from pillar base 172 and base sidewall portion 176A.

Contact terminal 186 is composed of metal layer 152 and solder layer 188. Contact terminal 186 also includes body 190 and flange 192. Body 190 and flange 192 are identical to body 160 and flange 162, respectively, except that solder layer 188 replaces solder layer 154. Thus, body 190 and flange 192 are vertically adjacent to one another and each include portions of metal layer 152 and solder layer 188 (rather than solder layer 154). In addition, contact terminal 186, body 190 and flange 192 are solder.

Body 190 contacts pillar tip 174 and insulative base 182, covers pillar tip 174 and flange 192 in the downward direction, extends downwardly beyond pillar tip 174, insulative base 182 and flange 192, is spaced from tip sidewall portion 176B, is embedded in insulative base 182, has a diameter of 450 microns and includes solder surface 190A that faces downwardly and is exposed. Body 190 is not covered in the downward direction by any material of the assembly. Furthermore, body 190 differs from body 160 in that body 190 extends downwardly beyond (rather than laterally aligned with) insulative base 182, and solder surface 190A has a dome shape (rather than flat).

Flange 192 contacts metal pillar 170 and insulative base 182, contacts and covers and extends laterally beyond tip sidewall portion 176B, extends upwardly beyond pillar tip 174 and body 190, is spaced from and does not contact but is laterally aligned with and adjacent to pillar tip 174, is embedded in insulative base 182 and is unexposed. Flange 192 is proximate to but spaced from the periphery of body 190 by a flat lateral surface of body 190 that contacts insulative base 182 and has a width of 25 microns, and is spaced from solder surface 190A.

Flange 192 has essentially identical size, shape and location as flange 162. For instance, the wet chemical etch that forms metal pillar 170 and the cure that hardens insulative base 182 may slightly affect the size of flange 162 but have no appreciable affect on flange 162. Likewise, the solder reflow operation that converts solder layer 154 and solder ball 184 into solder layer 188 may slightly change the size of flange 192 relative to flange 162 but has no appreciable affect on the size of flange 192 relative to flange 162. Thus, flange 192 has essentially identical dimensions as flange 162. As a result, contact terminal 186 includes flange 162 although the composition of flange 192 may differ from the composition of flange 162.

Flange 192 includes inner diameter 192A, outer diameter 192B, flange surface 192C and flange tip 192D, which correspond to and are essentially identical to inner diameter 162A, outer diameter 162B, flange surface 162C and flange tip 162D, respectively. Thus, inner diameter 192A is essentially identical to inner periphery 130A, outer diameter 192B is essentially identical to outer periphery 130B. Likewise, inner diameter 192A and outer diameter 192B are adjacent to pillar tip 174 and insulative base 182, respectively, and to body 190, and are spaced from insulative base 182 and pillar tip 174, respectively, and from one another. Flange surface 192C faces upwardly, is a convex arc with substantially constant curvature as it extends laterally from inner diameter 192A to outer diameter 192B and includes flange tip 192D at its apex. Flange surface 192C is provided by metal layer 152 and is spaced from solder layer 188. Flange surface 192C includes inner surface portion 192E and outer surface portion 192F. Inner surface portion 192E is adjacent to inner diameter 192A and spaced from outer diameter 192B, outer surface portion 192F is adjacent to outer diameter 192B and spaced from inner diameter 192A, and inner and outer surface portions 192E and 192F are adjacent to one another at circular boundary 192G (shown in phantom) that is between inner diameter 192A and flange tip 192D and coincides with circular boundary 162G and spike 178. Flange tip 192D is the portion of flange 192 (and flange surface 192C) that extends farthest upwardly and (like flange tip 162D) is vertically spaced from pillar tip 174 by 50 microns and from pillar base 172 by 100 microns. Thus, flange tip 192D spans 360 degrees laterally around metal pillar 170 at a constant vertical distance between pillar base 172 and pillar tip 174.

Flange surface 192C provides an interlocking surface that contacts and is interlocked to metal pillar 170 and insulative base 182. Flange surface 192C contacts metal pillar 170 adjacent to inner diameter 192A and contacts insulative base 182 adjacent to outer diameter 192B. In addition, all of inner surface portion 192E contacts metal pillar 170, and all of outer surface portion 192F contacts insulative base 182.

Flange 192 has a diameter of 200 microns at inner diameter 192A, a diameter of 400 microns at outer diameter 192B, a width of 100 microns ((400–200)/2) between inner diameter 192A and outer diameter 192B, extends upwardly by 50 microns relative to pillar tip 174 at flange tip 192D and is spaced downwardly from pillar base 172 by 100 microns at flange tip 192D. Flange 192 also has an annular shape (in a lateral plane coplanar with pillar tip 174 and orthogonal to the upward and downward directions), a hemispherical cross-sectional shape between pillar base 172 and pillar tip 174 (in a vertical plane parallel to the upward and downward directions) and an overall donut shape.

Contact terminal 186 contacts and is electrically connected to metal pillar 170 and extends downwardly beyond metal pillar 170 and insulative base 182. Thus, contact terminal 186 is spaced from and extends downwardly beyond chip 110, routing line 136, plated contact 146, adhesive 164, connection joint 166 and encapsulant 168. Moreover, contact terminal 186 provides a robust, permanent electrical connection to metal pillar 170 that protrudes downwardly from metal pillar 170. Similarly, since contact terminal 186 is a permanent part of the assembly that includes metal layer 152 and solder layer 188, and solder layer 188 is formed from solder layer 154 and solder ball 184, the assembly manufacture excludes removing etch mask 156.

At this stage, conductive trace 180 includes routing line 136, plated contact 146, metal pillar 170 and contact terminal 186.

For convenience of illustration, solder layer 188 is shown below chip 110 to retain a single orientation throughout the figures for ease of comparison between the figures, although the structure would be inverted during the formation of solder layer 188 so that gravitational force would assist with the solder ball deposition and reflow.

Figure 25A:
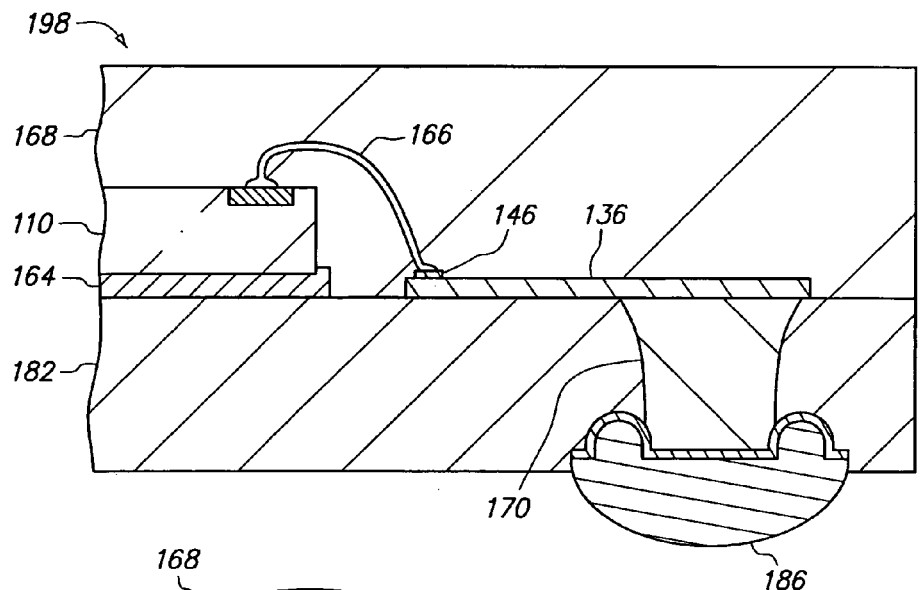
Figure 25B:
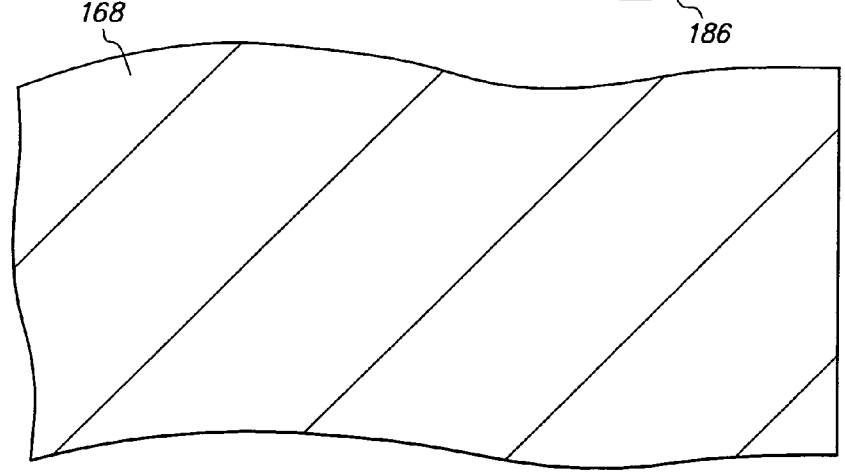
Figure 25C:
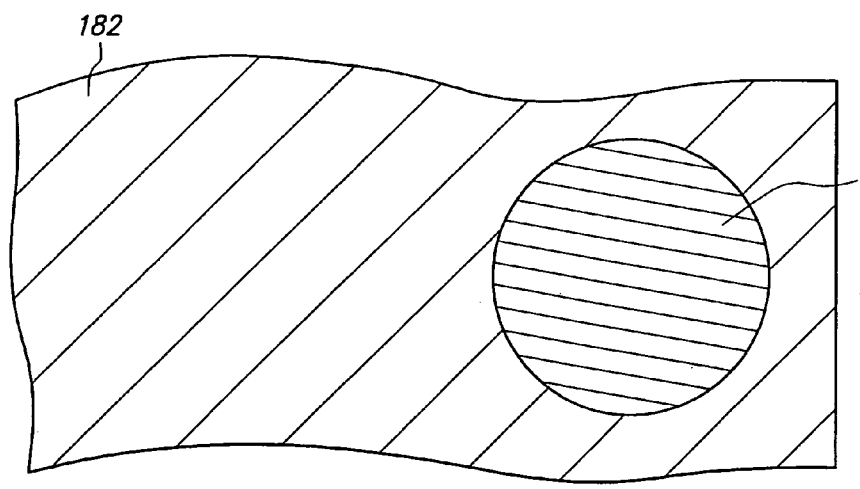

FIGS. 25A, 25B and 25C are cross-sectional, top and bottom views, respectively, of the structure after cutting encapsulant 168 and insulative base 182 with an excise blade to singulate the assembly from other assemblies.

At this stage, the manufacture of semiconductor chip assembly 198 that includes chip 110, routing line 136, plated contact 146, adhesive 164, connection joint 166, encapsulant 168, metal pillar 170, insulative base 182 and contact terminal 186 can be considered complete.

Chip 110 extends upwardly beyond conductive trace 180, overlaps insulative base 182 in the upward direction but does not overlap conductive 180 in the upward direction. Thus, conductive trace 180 is disposed outside the periphery of chip 110. Routing line 136 is mechanically coupled to chip 110 by adhesive 164, and is electrically coupled to chip 110 by connection joint 166. Routing line 136 and connection joint 166 provide horizontal fan-out routing between pad 116 and external circuitry, and metal pillar 170 and contact terminal 186 provide vertical routing between pad 116 and external circuitry. Encapsulant 168 covers chip 110, connection joint 166, conductive trace 180 and insulative base 182 in the upward direction. Encapsulant 168 and insulative base 182 provide mechanical support and environmental protection for the assembly. Metal pillar 170 extends downwardly beyond but does not cover routing line 136 in the downward direction. Although metal pillar 170 is not exposed, and is overlapped by insulative base 182 and contact terminal 186 in the downward direction, metal pillar 170 is not covered in the downward direction by encapsulant 168, insulative base 182 or any other insulative material of the assembly. Furthermore, pillar tip 174 is not covered in the downward direction or even overlapped in the downward direction by encapsulant 168, insulative base 182 or any other insulative material of the assembly. Insulative base 182 contacts routing line 136, metal pillar 170 and contact terminal 186, extends upwardly beyond contact terminal 186, extends downwardly beyond chip 110, routing line 136, connection joint 166, encapsulant 168, metal pillar 170 and flange 192 but does not extend downwardly beyond body 190. Furthermore, insulative base 182 contacts and covers base sidewall portion 176A and is spaced from tip sidewall portion 176B. Thus, insulative base 182 contacts and covers all of base sidewall portion 176A and is spaced from pillar base 172, pillar tip 174 and tip sidewall portion 176B, and contact terminal 186 contacts and covers all of pillar tip 174 and tip sidewall portion 176B and is spaced from pillar base 172 and base sidewall portion 176A.

The semiconductor chip assembly is a single-chip first-level package. Thus, chip 110 is the only chip embedded in encapsulant 168.

The semiconductor chip assembly includes other conductive traces embedded in encapsulant 168 and insulative base 182, and only a single conductive trace 180 is shown for convenience of illustration. The conductive traces are spaced and separated and electrically isolated from one another. The conductive traces each include a respective routing line, plated contact, metal pillar and contact terminal. The conductive traces are each electrically connected to a respective pad on chip 110 by a respective connection joint. The conductive traces each provide horizontal fan-out routing and vertical routing for their respective pads. Furthermore, the conductive traces each include a downwardly protruding contact terminal to provide a ball grid array (BGA) package.

Chip 110 is designed with the pads electrically isolated from one another. However, the corresponding routing lines are initially electroplated on metal base 120 and electrically connected to one another by metal base 120. Furthermore, the connection joints electrically connect the routing lines and the corresponding pads, thereby electrically connecting the pads with one another. Thereafter, once metal base 120 is etched to form the metal pillars, the routing lines are electrically isolated from one another, and therefore, the pads return to being electrically isolated from one another.

Advantageously, there is no plating bus or related circuitry that need be disconnected or severed from the conductive traces after metal base 120 is etched to form the metal pillars.

Figure 26A:
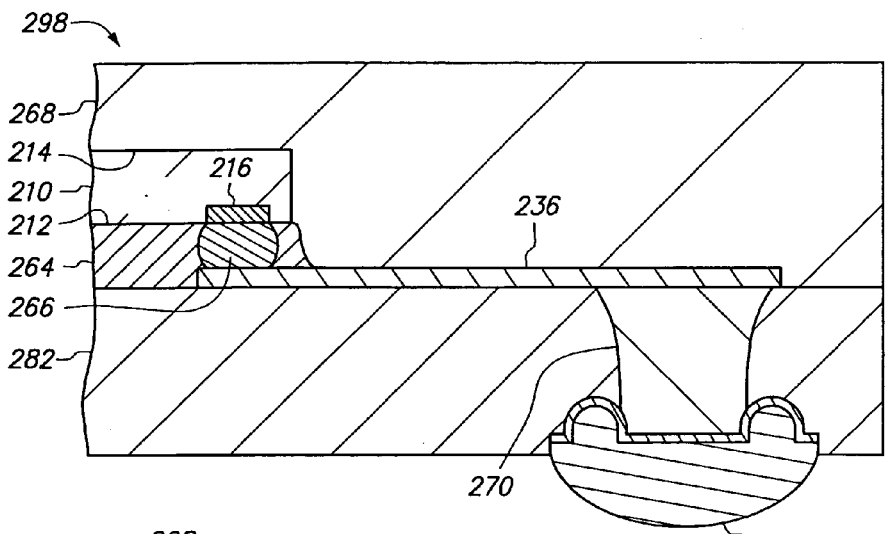
FIGS. 26A, 26B and 26C are cross-sectional, top and bottom views, respectively, of a semiconductor chip assembly in accordance with a second embodiment of the present invention.
Figure 26B:
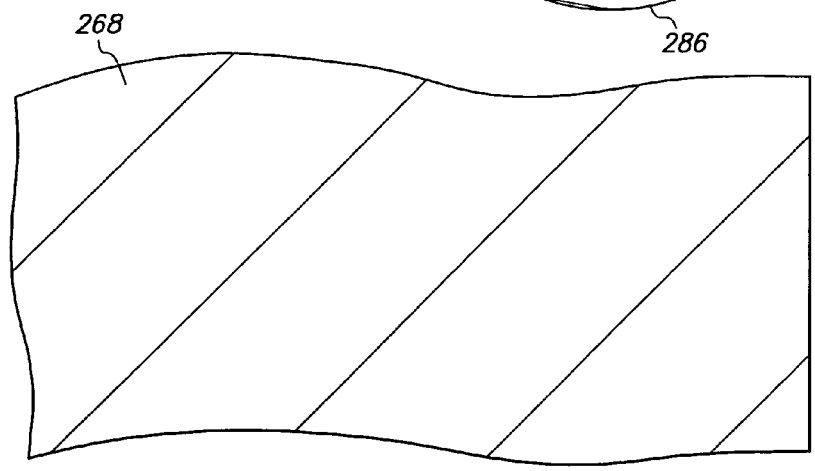
Figure 26C:
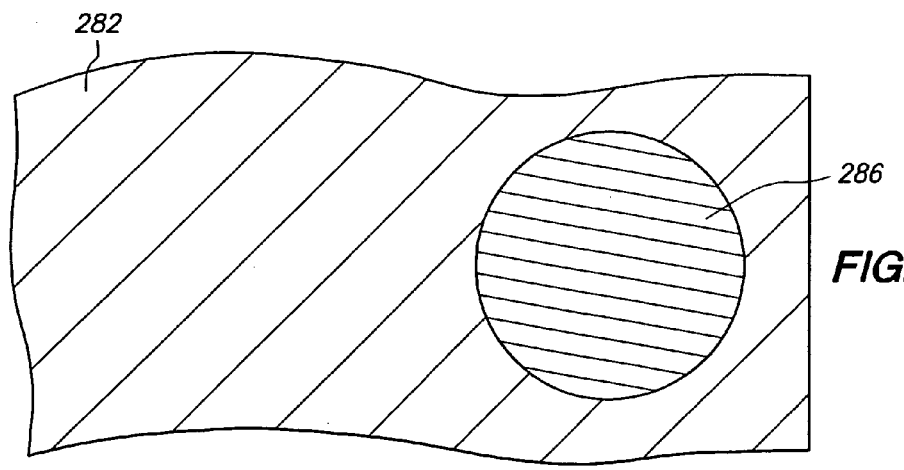

FIGS. 26A, 26B and 26C are cross-sectional, top and bottom views, respectively, of a semiconductor chip assembly in accordance with a second embodiment of the present invention. In the second embodiment, the chip is flip-chip bonded. For purposes of brevity, any description in the first embodiment is incorporated herein insofar as the same is applicable, and the same description need not be repeated. Likewise, elements of the second embodiment similar to those in the first embodiment have corresponding reference numerals indexed at two-hundred rather than one-hundred. For instance, chip 210 corresponds to chip 110, routing line 236 corresponds to routing line 136, etc.

Connection joint 266 is initially a solder bump deposited on pad 216. The solder bump has a hemispherical shape and a diameter of 100 microns.

Routing line 236 extends within and outside the periphery of chip 210. Thus, the elongated routing portion (corresponding to elongated routing portion 138) is lengthened. This is accomplished by a slight adjustment to the electroplating operation previously described for routing line 136. In particular, the photoresist layer (corresponding to photoresist layer 132) is patterned to reshape the opening for routing line 236, and therefore routing line 236 is lengthened relative to routing line 136. Furthermore, the plated contact (corresponding to plated contact 146) is omitted.

Chip 210 is positioned such that surface 212 faces downwardly, surface 214 faces upwardly, routing line 236 extends laterally across pad 216, and connection joint 266 contacts and is sandwiched between pad 216 and routing line 236. Thereafter, heat is applied to reflow connection joint 266, and then the heat is removed and connection joint 266 cools and solidifies into a hardened solder joint that mechanically attaches and electrically connects pad 216 and routing line 236. Connection joint 266 exhibits localized wetting and does not collapse, and chip 210 remains spaced from routing line 236.

Thereafter, adhesive 264 is dispensed into and underfills the open gap between chip 210 and the metal base (corresponding to metal base 120), and then adhesive 264 is cured. As a result, adhesive 264 contacts and is sandwiched between chip 210 and the metal base, contacts connection joint 266 and is spaced from pad 216. Thus, adhesive 264 is significantly thicker than adhesive 164. A suitable underfill adhesive is Namics U8443.

Thereafter, encapsulant 268, metal pillar 270, insulative base 282 and contact terminal 286 are formed.

Semiconductor chip assembly 298 includes chip 210, routing line 236, adhesive 264, connection joint 266, encapsulant 268, metal pillar 270, insulative base 282 and contact terminal 286.

Figure 27A:
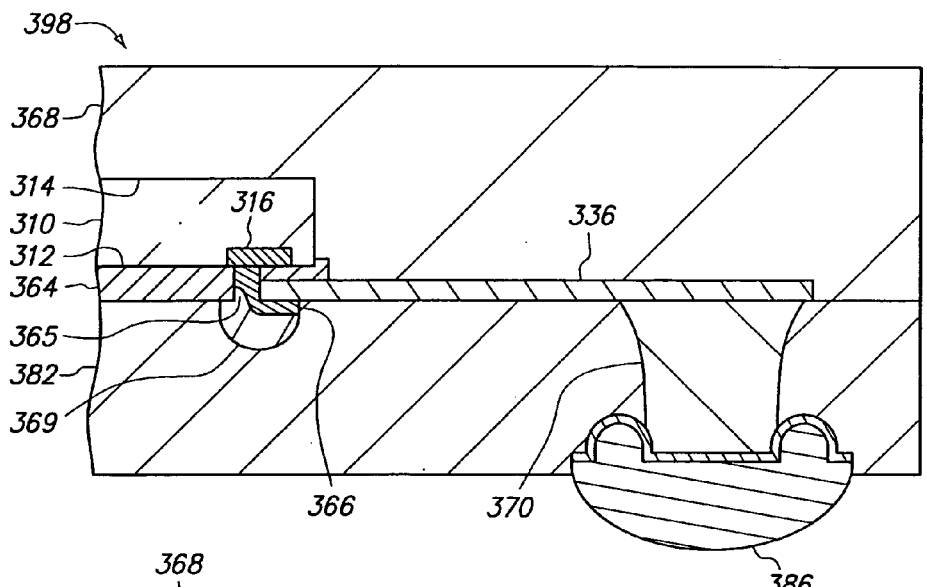
FIGS. 27A, 27B and 27C are cross-sectional, top and bottom views, respectively, of a semiconductor chip assembly in accordance with a third embodiment of the present invention.
Figure 27B:
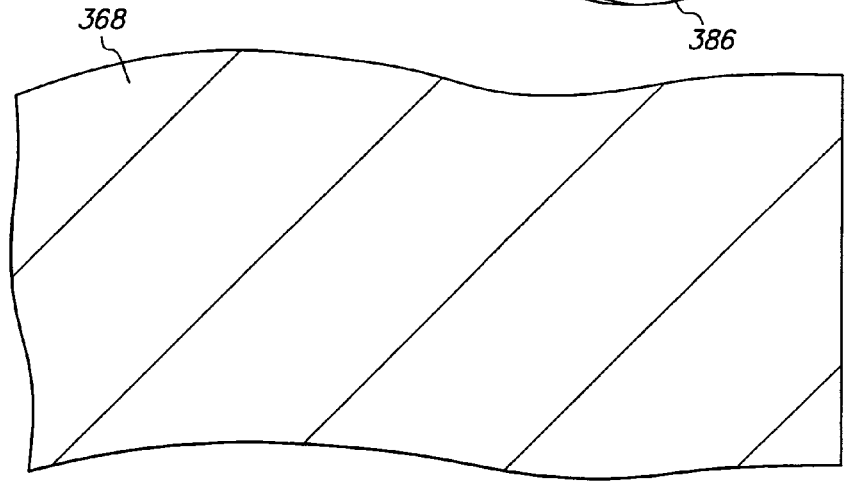
Figure 27C:
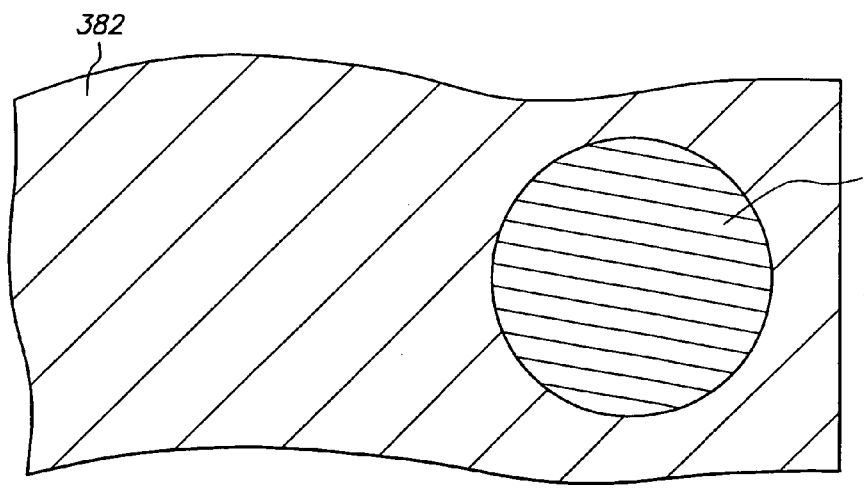

FIGS. 27A, 27B and 27C are cross-sectional, top and bottom views, respectively, of a semiconductor chip assembly in accordance with a third embodiment of the present invention. In the third embodiment, the connection joint is electroplated. For purposes of brevity, any description in the first embodiment is incorporated herein insofar as the same is applicable, and the same description need not be repeated. Likewise, elements of the third embodiment similar to those in the first embodiment have corresponding reference numerals indexed at three-hundred rather than one-hundred. For instance, chip 310 corresponds to chip 110, routing line 336 corresponds to routing line 136, etc.

Pad 316 is treated to accommodate an electroplated copper connection joint by forming a nickel surface layer on the aluminum base. For instance, chip 310 is dipped in a zinc solution to deposit a zinc layer on the aluminum base. This step is commonly known as zincation. Preferably, the zinc solution contains about 150 grams/liter of NaOH, 25 grams/liter of ZnO, and 1 gram/liter of $NaNO_3$, as well as tartaric acid to reduce the rate at which the aluminum base dissolves. Thereafter, the nickel surface layer is electrolessly deposited on the zincated aluminum base. A suitable electroless nickel plating solution is Enthone Enplate NI-424 at 85° C.

Routing line 336 extends within and outside the periphery of chip 310. Thus, the elongated routing portion (corresponding to elongated routing portion 138) is lengthened. This is accomplished by a slight adjustment to the electroplating operation previously described for routing line 136. In particular, the photoresist layer (corresponding to photoresist layer 132) is patterned to reshape the opening for routing line 336, and therefore routing line 336 is lengthened relative to routing line 136.

The metal base (corresponding to metal base 120) is etched to form a back-side recess (not shown), the plated contact (corresponding to plated contact 146) is omitted, and adhesive 364 is deposited on the metal base and routing line 336.

Chip 310 is inverted and positioned such that surface 312 faces downwardly, surface 314 faces upwardly, adhesive 364 contacts and is sandwiched between pad 316 and routing line 336, and routing line 336 partially overlaps pad 316. Thereafter, encapsulant 368 is formed, and then the metal base is etched again to convert the back-side recess into a slot (not shown) that extends through the metal base, exposes adhesive 364 and is vertically aligned with pad 316.

Thereafter, through-hole 365 is formed in adhesive 364 that exposes pad 316. Through-hole 365 is formed by applying a suitable etch that is highly selective of adhesive 364 with respect to pad 316 and routing line 336. In this instance, a selective $TEA\ CO_2$ laser etch is applied. The laser is directed at and vertically aligned with and centered relative to pad 316. The laser has a spot size of 70 microns, and pad 316 has a length and width of 100 microns. As a result, the laser strikes pad 316 and portions of routing line 336 and adhesive 364 that extend within the periphery of pad 316, and ablates adhesive 364. The laser drills through and removes a portion of adhesive 364. However, portions of adhesive 364 that extend across the peripheral edges of pad 316 are outside the scope of the laser and remain intact. Likewise, routing line 336 shields a portion of adhesive 364 from the laser etch, and a portion of adhesive 364 sandwiched between pad 316 and routing line 336 remains intact. The laser etch is anisotropic, and therefore little or none of adhesive 364 sandwiched between pad 316 and routing line 336 is undercut or removed. Through-hole 365 may slightly undercut adhesive 364 between pad 316 and routing line 336 and have a diameter that is slightly larger than 70 microns due to the beam angle of the laser, the thermal effects of the laser, and/or the isotropic nature of an oxygen plasma or wet chemical cleaning step. For convenience of explanation, this slight undercut and enlargement is ignored. However, through-hole 365 is formed without damaging chip 310 or routing line 336 and does not extend into chip 310.

Thereafter, a brief cleaning step can be applied to remove oxides and debris that may be present on the exposed portions of pad 316 and routing line 336. For instance, a brief oxygen plasma cleaning step can be applied to the structure. Alternatively, a brief wet chemical cleaning step using a solution containing potassium permanganate can be applied to the structure. In either case, the cleaning step cleans the exposed portions of pad 316 and routing line 336 without damaging the structure.

Thereafter, connection joint 366 is formed by an electroplating operation. Initially, the metal base is connected to a plating bus (not shown), current is applied to the plating bus from an external power source, and the structure is submerged in an electrolytic copper plating solution such as Sel-Rex CUBATH M™ at room temperature. As a result, connection joint 366 electroplates on the exposed portions of the metal base. In addition, since the plating bus provides the current to the metal base, which in turn provides the current to routing line 336, connection joint 366 electroplates on the exposed portions of routing line 336 in through-hole 365. At the initial stage, since adhesive 364 is an electrical insulator and pad 316 is not connected to the plating bus, connection joint 366 does not electroplate on pad 316 and is spaced from pad 316. However, as the copper electroplating continues, connection joint 366 continues to plate on routing line 336, extends through adhesive 364 and contacts pad 316. As a result, pad 316 is connected to the plating bus by the metal base, routing line 336 and connection joint 366, and therefore connection joint 366 begins to electroplate on pad 316 as well. The copper electroplating continues until connection joint 366 has the desired thickness. Thereafter, the structure is removed from the electrolytic copper plating solution and rinsed in distilled water to remove contaminants.

Thereafter, insulative plug 369 is formed on adhesive 364 and connection joint 366 and disposed within the slot, and then metal pillar 370, insulative base 382 and contact terminal 386 are formed.

Semiconductor chip assembly 398 includes chip 310, routing line 336, adhesive 364, connection joint 366, encapsulant 368, insulative plug 369, metal pillar 370, insulative base 382 and contact terminal 386.

Figure 28A:
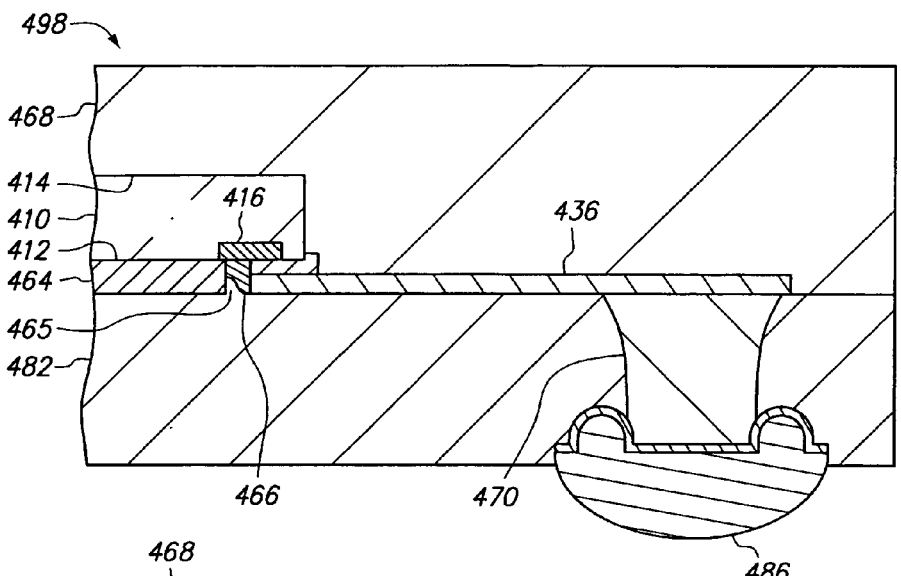
FIGS. 28A, 28B and 28C are cross-sectional, top and bottom views, respectively, of a semiconductor chip assembly in accordance with a fourth embodiment of the present invention.
Figure 28B:
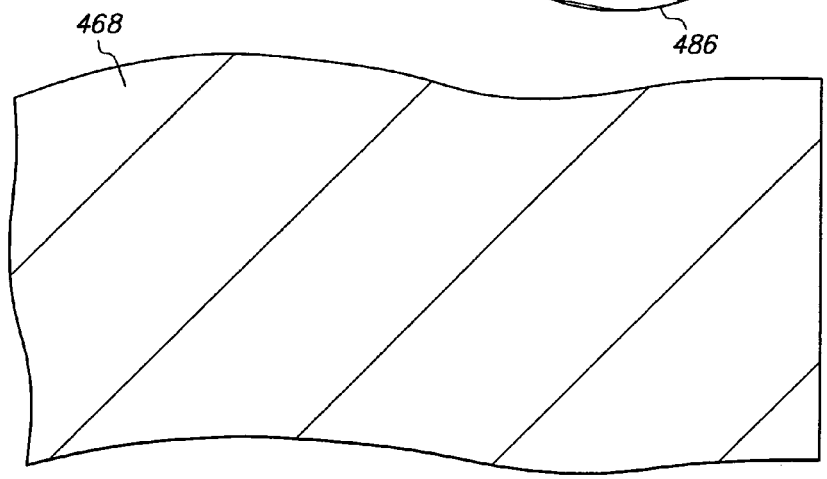
Figure 28C:
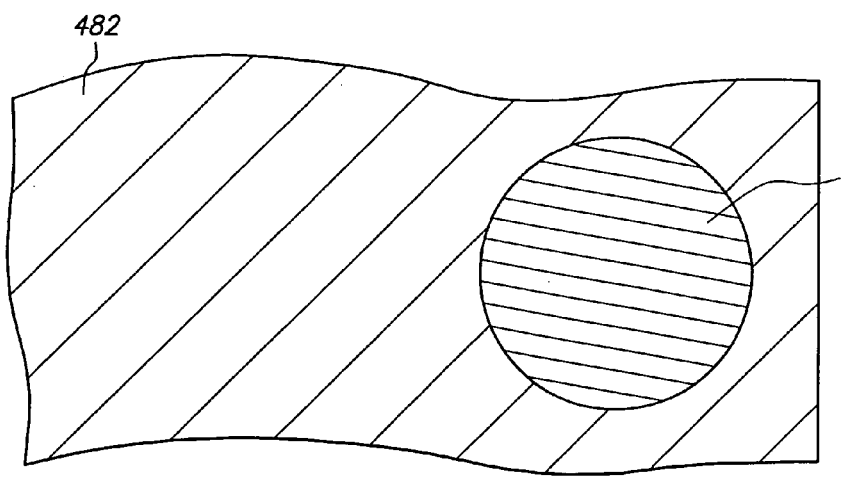

FIGS. 28A, 28B and 28C are cross-sectional, top and bottom views, respectively, of a semiconductor chip assembly in accordance with a fourth embodiment of the present invention. In the fourth embodiment, the connection joint is electrolessly plated. For purposes of brevity, any description in the first embodiment is incorporated herein insofar as the same is applicable, and the same description need not be repeated. Likewise, elements of the fourth embodiment similar to those in the first embodiment have corresponding reference numerals indexed at four-hundred rather than one-hundred. For instance, chip 410 corresponds to chip 110, routing line 436 corresponds to routing line 136, etc.

Pad 416 is treated to include a nickel surface layer in the same manner as pad 316, routing line 436 is configured in the same manner as routing line 336, adhesive 464 is deposited on the metal base (corresponding to metal base 120) and routing line 436 in the same manner that adhesive 364 is deposited on the metal base and routing line 336, and the plated contact (corresponding to plated contact 146) is omitted.

Chip 410 is inverted and positioned such that surface 412 faces downwardly, surface 414 faces upwardly, adhesive 464 contacts and is sandwiched between pad 416 and routing line 436, and routing line 436 partially overlaps pad 416. Thereafter, encapsulant 468 is formed, and then the metal base is etched to form metal pillar 470. Thereafter, through-hole 465 is formed in adhesive 464 and exposes pad 416. Through-hole 465 is formed in the same manner as through-hole 365.

Thereafter, connection joint 466 is formed by an electroless plating operation. The structure is submerged in an electroless nickel plating solution such as Enthone Enplate NI-424 at 85° C. Preferred nickel plating solutions include nickel-sulfate and nickel-chloride and have a pH of about 9.5 to 10.5. A higher nickel concentration provides a faster plating rate but reduces the stability of the solution. The amount of chelating agents or ligands in the solution depends on the nickel concentration and their chemical structure, functionality and equivalent weight. Most of the chelating agents used in electroless nickel plating solutions are hydroxy organic acids which form one or more water soluble nickel ring complexes. These complexes reduce the free nickel ion concentration, thereby increasing the stability of the solution while retaining a reasonably fast plating rate. Generally, the higher the complex agent concentration, the slower the plating rate. In addition, the pH of the solution and the plating rate continually decrease as the electroless plating continues due to hydrogen ions being introduced into the solution as a byproduct of the nickel reduction. Accordingly, the solution is buffered to offset the effects of the hydrogen ions. Suitable buffering agents include sodium or potassium salts of mono and dibasic organic acids. Finally, those skilled in the art will understand that electroless nickel plating solutions do not deposit pure elemental nickel since a reducing agent such as $H_2PO_2$ will naturally decompose into the electrolessly plated nickel. Therefore, those skilled in the art will understand that electrolessly plated nickel refers to a nickel compound that is mostly nickel but not pure elemental nickel.

Pad 416 includes an exposed nickel surface layer and therefore is catalytic to electroless nickel. Furthermore, adhesive 464 and encapsulant 468 are not catalytic to electroless nickel and therefore a plating mask is not necessary. Connection joint 466 plates on pad 416 and eventually contacts and electrically connects pad 416 and routing line 436 in through-hole 465. The electroless nickel plating operation continues until connection joint 466 is about 10 microns thick. Thereafter, the structure is removed from the electroless nickel plating solution and rinsed in distilled water.

Thereafter, insulative base 482 and contact terminal 486 are formed.

Semiconductor chip assembly 498 includes chip 410, routing line 436, adhesive 464, connection joint 466, encapsulant 468, metal pillar 470, insulative base 482 and contact terminal 486.

Figure 29A:
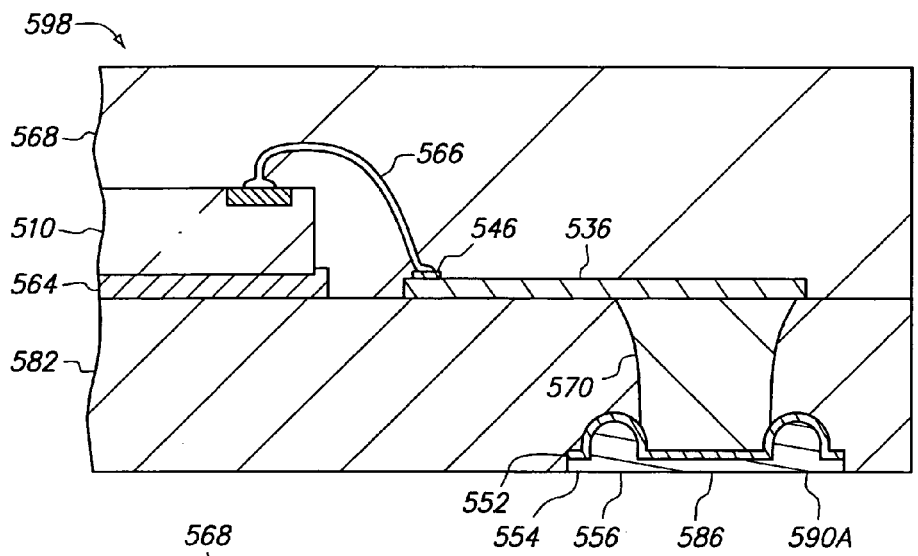
FIGS. 29A, 29B and 29C are cross-sectional, top and bottom views, respectively, of a semiconductor chip assembly in accordance with a fifth embodiment of the present invention.
Figure 29B:
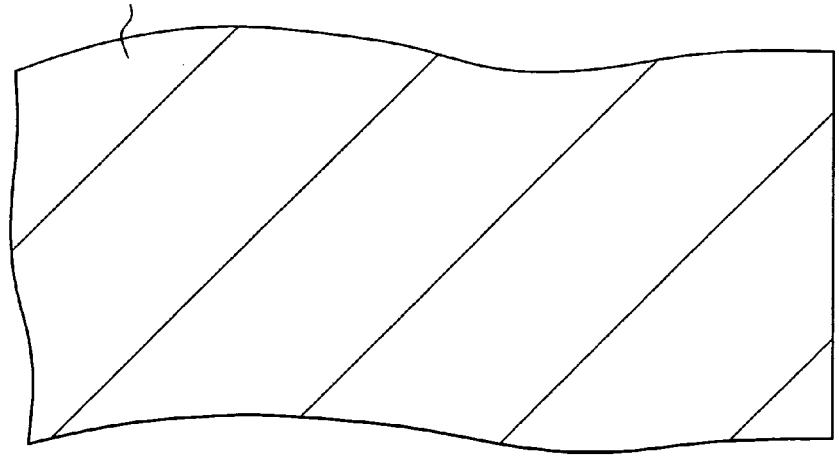
Figure 29C:
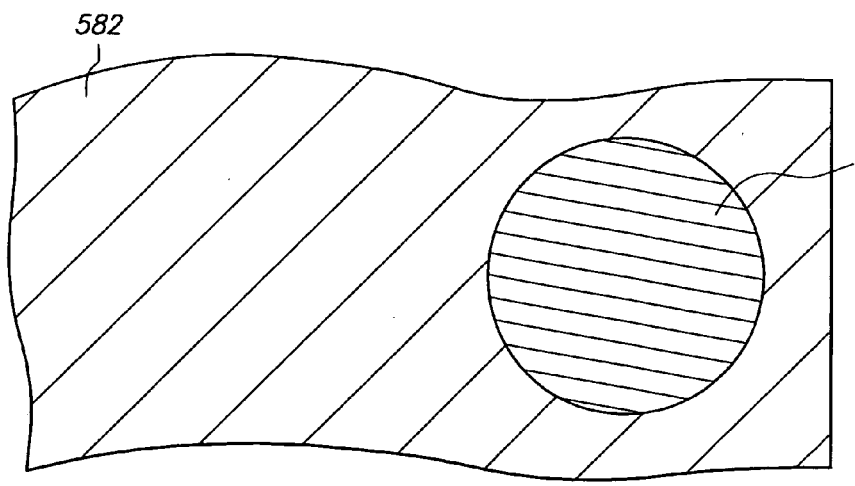

FIGS. 29A, 29B and 29C are cross-sectional, top and bottom views, respectively, of a semiconductor chip assembly in accordance with a fifth embodiment of the present invention. In the fifth embodiment, the pillar etch mask provides the contact terminal. For purposes of brevity, any description in the first embodiment is incorporated herein insofar as the same is applicable, and the same description need not be repeated. Likewise, elements of the fifth embodiment similar to those in the first embodiment have corresponding reference numerals indexed at five-hundred rather than one-hundred. For instance, chip 510 corresponds to chip 110, routing line 536 corresponds to routing line 136, etc.

The solder ball (corresponding to solder ball 184) is omitted, and therefore the solder layer (corresponding to solder layer 188) is also omitted. As a result, etch mask 556 provides contact terminal 586. Contact terminal 586 consists of metal layer 552 and solder layer 554, and insulative base 582 and contact terminal 586 and are laterally aligned with one another at a surface that faces downwardly. Thus, an exposed planarized horizontal surface that faces downwardly includes solder layer 554 and insulative base 582, and solder layer 554 provides solder surface 590A that is flat (rather than dome shaped). Furthermore, the conductive traces each include a laterally aligned (rather than downwardly protruding) contact terminal to provide a land grid array (LGA) package.

Semiconductor chip assembly 598 includes chip 510, routing line 536, plated contact 546, adhesive 564, connection joint 566, encapsulant 568, metal pillar 570, insulative base 582 and contact terminal 586.

Figure 30A:
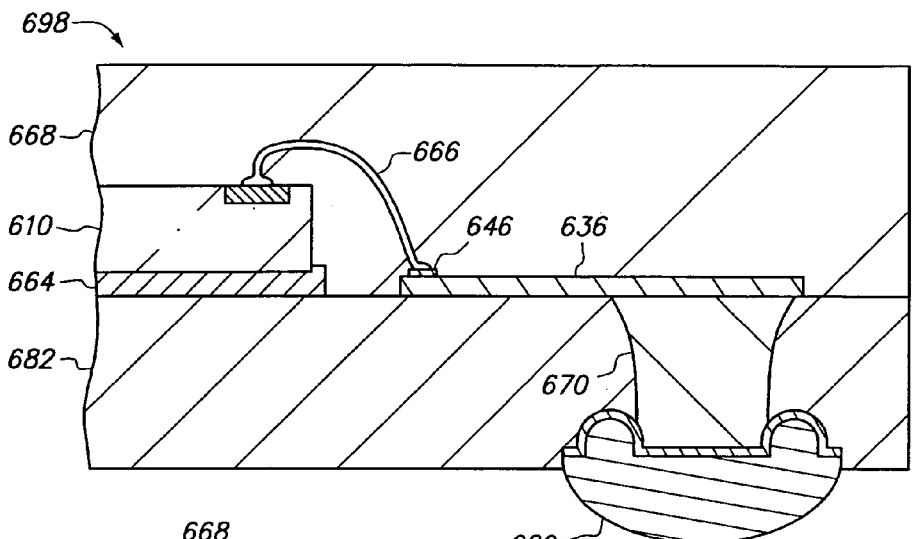
FIGS. 30A, 30B and 30C are cross-sectional, top and bottom views, respectively, of a semiconductor chip assembly in accordance with a sixth embodiment of the present invention.
Figure 30B:
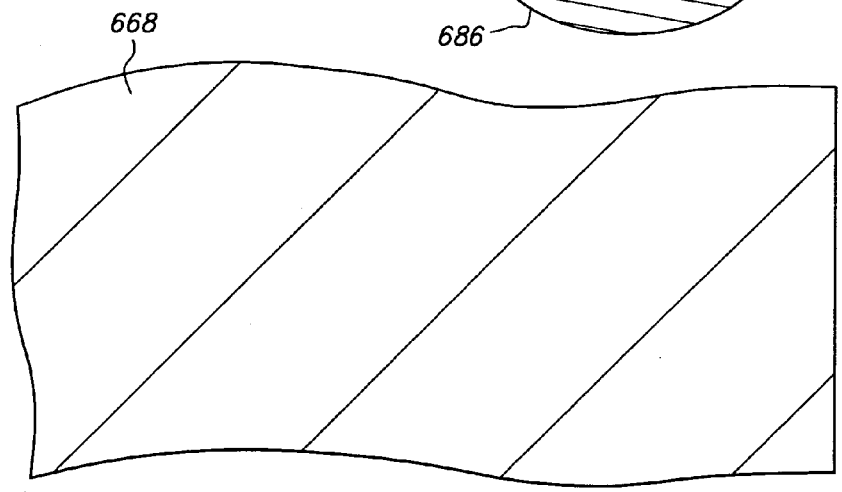
Figure 30C:
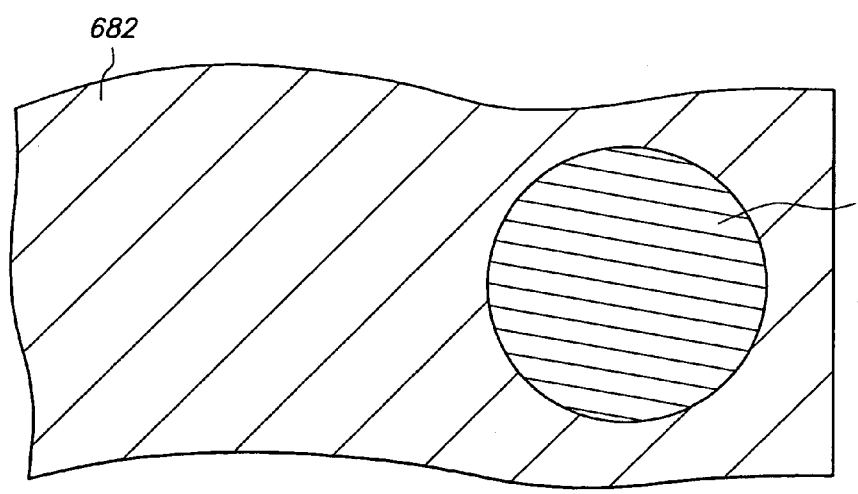

FIGS. 30A, 30B and 30C are cross-sectional, top and bottom views, respectively, of a semiconductor chip assembly in accordance with a sixth embodiment of the present invention. In the sixth embodiment, the contact terminal provides the pillar etch mask. For purposes of brevity, any description in the first embodiment is incorporated herein insofar as the same is applicable, and the same description need not be repeated. Likewise, elements of the sixth embodiment similar to those in the first embodiment have corresponding reference numerals indexed at six-hundred rather than one-hundred. For instance, chip 610 corresponds to chip 110, routing line 636 corresponds to routing line 136, etc.

The solder ball (corresponding to solder ball 184) is deposited on the etch mask (corresponding to etch mask 156) after encapsulant 668 is formed. Thereafter, the solder ball and the solder layer (corresponding to solder layer 154) are reflowed together to form contact terminal 686. Thereafter, the metal base (corresponding to metal base 120) is etched to form metal pillar 670.

Insulative base 682 is formed without a filler. As a result, insulative base 682 is more susceptible to plasma etching than insulative base 182. The grinding operation is omitted, and instead a blanket back-side plasma etch is applied to the structure. The plasma etch is highly selective of epoxy with respect to solder, and therefore, highly selective of insulative base 682 with respect to contact terminal 686. The plasma etch removes an 80 micron thick lower portion of insulative base 682. As a result, contact terminal 686 protrudes from and extends downwardly beyond insulative base 682, and insulative base 682 is recessed relative to contact terminal 686 in the downward direction. Furthermore, insulative base 682 extends downwardly beyond metal pillar 670, and metal pillar 670 remains unexposed.

Semiconductor chip assembly 698 includes chip 610, routing line 636, plated contact 646, adhesive 664, connection joint 666, encapsulant 668, metal pillar 670, insulative base 682 and contact terminal 686.

Figure 31A:
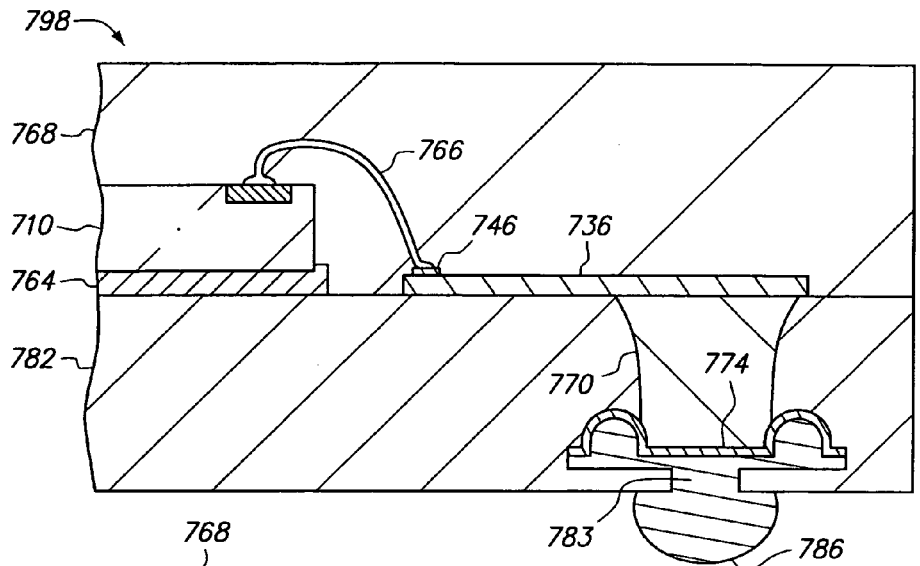
FIGS. 31A, 31B and 31C are cross-sectional, top and bottom views, respectively, of a semiconductor chip assembly in accordance with a seventh embodiment of the present invention.
Figure 31B:
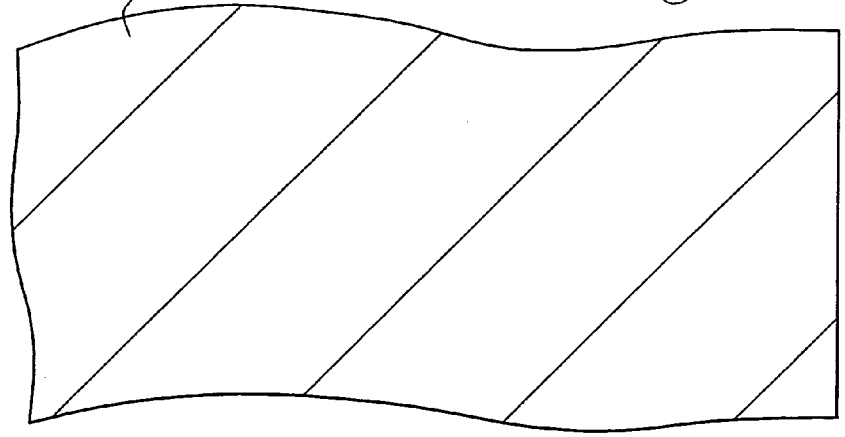
Figure 31C:
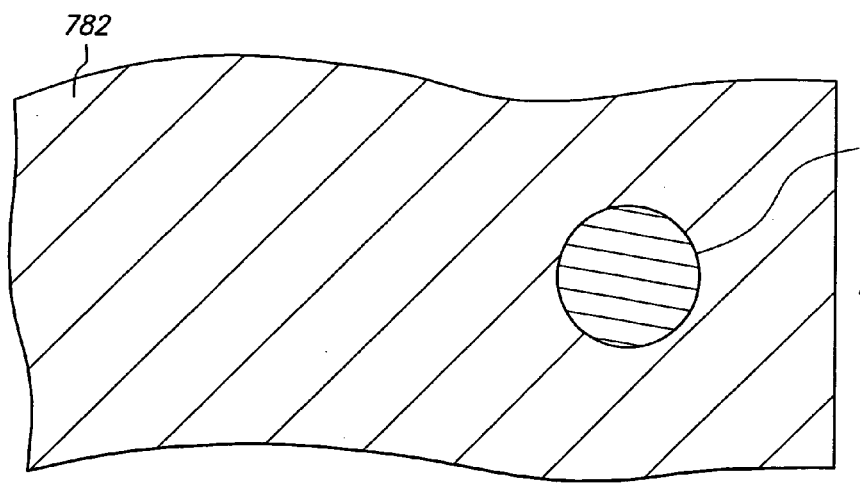

FIGS. 31A, 31B and 31C are cross-sectional, top and bottom views, respectively, of a semiconductor chip assembly in accordance with a seventh embodiment of the present invention. In the seventh embodiment, the portion of the insulative base is removed by laser ablation. For purposes of brevity, any description in the first embodiment is incorporated herein insofar as the same is applicable, and the same description need not be repeated. Likewise, elements of the seventh embodiment similar to those in the first embodiment have corresponding reference numerals indexed at seven-hundred rather than one-hundred. For instance, chip 710 corresponds to chip 110, routing line 736 corresponds to routing line 136, etc.

Insulative base 782 is formed without a filler. As a result, insulative base 782 is more susceptible to laser etching than insulative base 182. The grinding operation is omitted, and instead a selective TEA $CO_2$ laser etch is applied using multiple laser direct writes. The laser is directed at the etch mask (corresponding to etch mask 156). The laser has a spot size of 100 microns. Furthermore, the laser direct writes are offset relative to one another yet overlap so that the laser scans a central portion of the etch mask with a diameter of 150 microns. In this manner, the laser direct writes in combination are vertically aligned with and centered relative to the etch mask and metal pillar 770. As a result, the laser strikes the etch mask, a portion of insulative base 782 that overlaps the etch mask, and ablates insulative base 782.

The laser drills through and removes a portion of insulative base 782. However, a portion of insulative base 782 that extends across the periphery of the etch mask is outside the scope of the laser and remains intact. Thus, insulative base 782 continues to contact and overlap but no longer covers the etch mask.

Thereafter, a brief cleaning step can be applied to remove oxides and debris that may be present on the exposed portion of the etch mask. For instance, a brief oxygen plasma cleaning step can be applied to the structure. Alternatively, a brief wet chemical cleaning step using a solution containing potassium permanganate can be applied to the structure. In either case, the cleaning step cleans the exposed portion of the etch mask without damaging the structure.

Opening 783 is formed in and extends vertically into but not through insulative base 782, is disposed outside the periphery of chip 710, is vertically aligned with the etch mask and metal pillar 770, exposes the etch mask, is spaced from routing line 736, adhesive 764, encapsulant 768 and metal pillar 770 and has a diameter of 150 microns. Opening 783 is formed without damaging or extending into the etch mask.

Opening 783 may have a diameter that is slightly larger than 150 microns due to the beam angle of the laser, the thermal effects of the laser, and/or the isotropic nature of an oxygen plasma or wet chemical cleaning step. For convenience of explanation, this slight enlargement is ignored.

Thereafter, contact terminal 786 is formed. Contact terminal 786 extends within and outside and fills opening 783 and extends downwardly beyond insulative base 782. Insulative base 782 does not cover pillar tip 774 in the downward direction, however insulative base 782 overlaps pillar tip 774 in the downward direction and metal pillar 770 remains unexposed.

Semiconductor chip assembly 798 includes chip 710, routing line 736, plated contact 746, adhesive 764, connection joint 766, encapsulant 768, metal pillar 770, insulative base 782 and contact terminal 786.

Figure 32A:
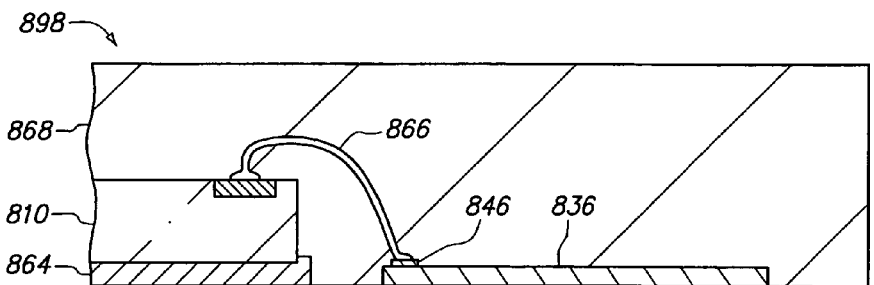
FIGS. 32A, 32B and 32C are cross-sectional, top and bottom views, respectively, of a semiconductor chip assembly in accordance with an eighth embodiment of the present invention.
Figure 32B:
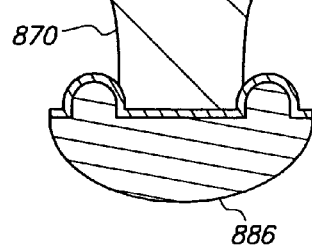
Figure 32C:
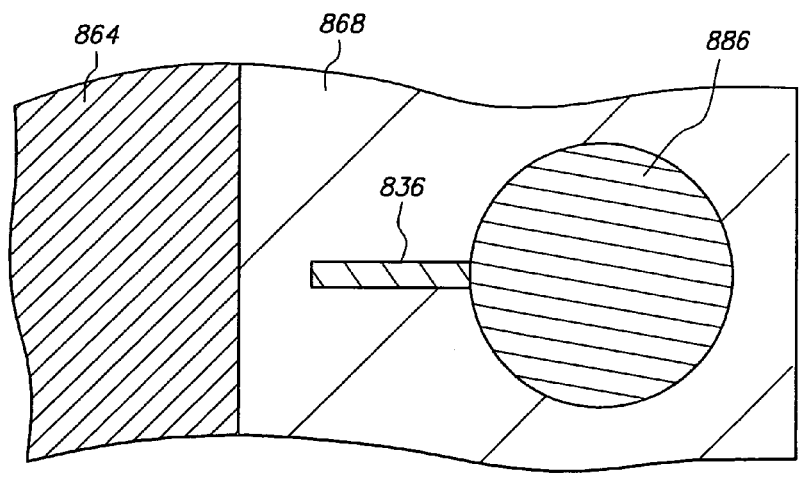

FIGS. 32A, 32B and 32C are cross-sectional, top and bottom views, respectively, of a semiconductor chip assembly in accordance with an eighth embodiment of the present invention. In the eighth embodiment, the insulative base is omitted. For purposes of brevity, any description in the first embodiment is incorporated herein insofar as the same is applicable, and the same description need not be repeated. Likewise, elements of the eighth embodiment similar to those in the first embodiment have corresponding reference numerals indexed at eight-hundred rather than one-hundred. For instance, chip 810 corresponds to chip 110, routing line 836 corresponds to routing line 136, etc.

The insulative base (corresponding to insulative base 182) is omitted, and therefore the grinding operation is unnecessary.

Semiconductor chip assembly 898 includes chip 810, routing line 836, plated contact 846, adhesive 864, connection joint 866, encapsulant 868, metal pillar 870 and contact terminal 886.

Figure 33A:
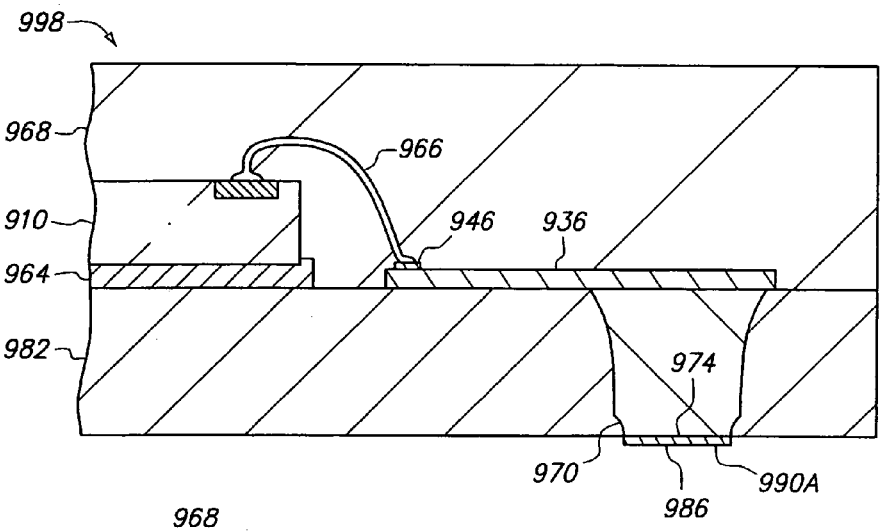
FIGS. 33A, 33B and 33C are cross-sectional, top and bottom views, respectively, of a semiconductor chip assembly in accordance with a ninth embodiment of the present invention.
Figure 33B:
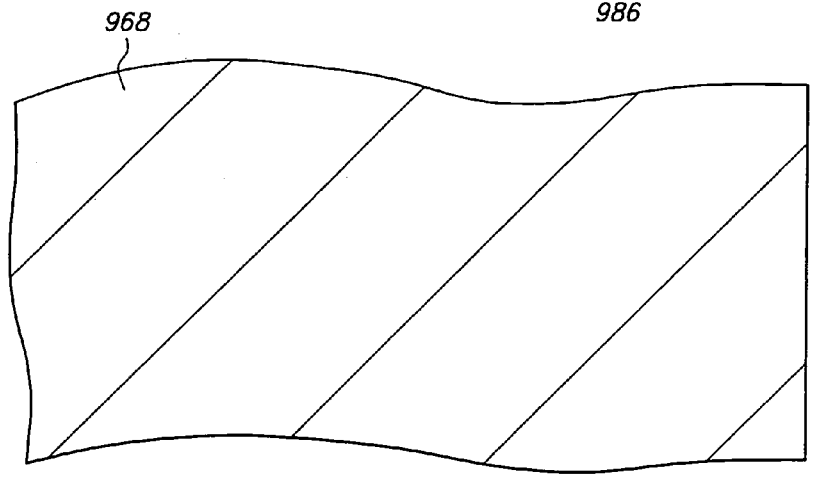
Figure 33C:
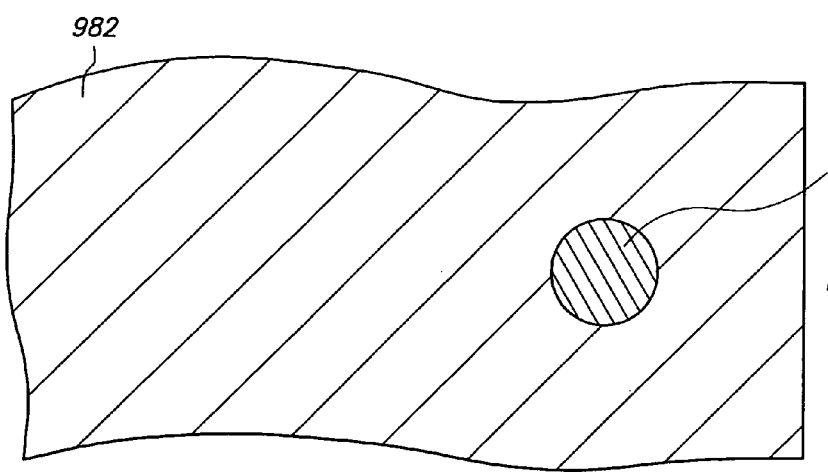

FIGS. 33A, 33B and 33C are cross-sectional, top and bottom views, respectively, of a semiconductor chip assembly in accordance with a ninth embodiment of the present invention. In the ninth embodiment, the pillar etch mask is removed. For purposes of brevity, any description in the first embodiment is incorporated herein insofar as the same is applicable, and the same description need not be repeated. Likewise, elements of the ninth embodiment similar to those in the first embodiment have corresponding reference numerals indexed at nine-hundred rather than one-hundred. For instance, chip 910 corresponds to chip 110, routing line 936 corresponds to routing line 136, etc.

Routing line 936 and the etch mask (corresponding to metal layer 152) are simultaneously formed during an electroplating operation. This is accomplished by a slight adjustment to the electroplating operation previously described for routing line 136. In particular, the photoresist layer (corresponding to photoresist layer 134) is patterned like the photoresist layer (corresponding to photoresist layer 150) for the metal layer (corresponding to metal layer 152). As a result, routing line 936 and the etch mask are each composed of a nickel layer electroplated on the metal base (corresponding to metal base 120) and a copper layer electroplated on the nickel layer. In both routing line 936 and the etch mask, the nickel layer contacts and is sandwiched between the metal base and the copper layer, is buried beneath the copper layer and has a thickness of 1 micron, and the copper layer contacts the nickel layer, is spaced from the metal base, is exposed and has a thickness of 19 microns. In addition, the photoresist layers (corresponding to photoresist layers 148 and 150) and related electroplating operation are omitted, and the subsequent solder paste deposition and reflow operations are omitted. As a result, the solder layer (corresponding to solder layer 154) is omitted.

Thereafter, adhesive 964 is formed on the metal base, chip 910 is mounted on adhesive 964, connection joint 966 is formed and then encapsulant 968 is formed.

Thereafter, metal pillar 970 is formed by applying a wet chemical etch in the same manner that metal pillar 170 is formed. The wet chemical etch is highly selective of copper with respect to nickel, polyimide and the molding compound, and therefore, highly selective of the metal base with respect to the nickel layer of routing line 936, the nickel layer of the etch mask, adhesive 964 and encapsulant 968. Furthermore, the nickel layer of routing line 936 protects the copper layer of routing line 936 from the wet chemical etch. Therefore, no appreciable amount of routing line 936, adhesive 964 or encapsulant 968 is removed. Although the wet chemical etch is highly selective of the copper layer of the etch mask and removes the copper layer of the etch mask, and the etch mask becomes much thinner, this is relatively unimportant since the nickel layer of the etch mask contacts the metal base and remains intact.

Thereafter, the etch mask is removed. The etch mask, which at this stage consists of a nickel layer, is removed by wet chemical etching using a nickel etching solution, such as a dilute mixture of nitric and hydrochloric acid, that is highly selective of nickel with respect to polyimide and the molding compound. The wet chemical etch also removes the exposed portion of the nickel layer of routing line 936 (that extends laterally beyond metal pillar 970 and downwardly beyond the copper layer of routing line 936), and the elongated routing portion of routing line 936 becomes slightly thinner. However, no appreciable amount of adhesive 964 or encapsulant 968 is removed.

Since the etch mask is extremely thin relative to metal pillar 970, and the structure is removed from the nickel etching solution soon after the etch mask is stripped, it is not critical that the nickel etching solution be highly selective of nickel with respect to copper. In fact, the nickel etching solution is also selective of copper. As a result, the nickel etching solution also removes a slight amount of the exposed copper surfaces. However, the nickel etching solution is not applied long enough to appreciably affect the copper features.

The nickel etching solution has no significant impact on routing line 936 or metal pillar 970. The optimal etch time for exposing the etch mask to the wet chemical etch in order to remove the etch mask without significantly impacting routing line 936 or metal pillar 970 can be established through trial and error.

The nickel etching solution converts routing line 936 from a flat, planar lead to an essentially flat, planar lead due to the slight recess (not shown) previously occupied by a portion of the nickel layer that extended laterally beyond metal pillar 970 and a lower portion of a portion of the copper layer that extended laterally beyond metal pillar 970. In addition, the nickel etching solution exposes pillar tip 974.

Thereafter, insulative base 982 is formed with a thickness of 220 microns (rather than 250 microns), and then the lower portion of insulative base 982 is removed by grinding. Initially, the diamond sand wheel grinds only insulative base 982. As the grinding continues, insulative base 982 becomes thinner as the grinded surface migrates upwardly. Eventually the diamond sand wheel contacts metal pillar 970, and as a result, begins to grind metal pillar 970 as well. As the grinding continues, metal pillar 970 and insulative base 982 become thinner as their grinded surfaces migrate upwardly. The grinding continues until metal pillar 970 and insulative base 982 have the desired thickness, and then halts before it reaches chip 910, routing line 936, plated contact 946, adhesive 964, connection joint 966 or encapsulant 968. Thereafter, the structure is rinsed in distilled water to remove contaminants.

The grinding removes a 10 micron thick lower portion of metal pillar 970 and a 30 micron thick lower portion of insulative base 982. As a result, chip 910 remains embedded in encapsulant 968, metal pillar 970 remains embedded in insulative base 982, routing line 936 remains unexposed and metal pillar 970 is exposed. Furthermore, metal pillar 970 and insulative base 982 are laterally aligned with one another at a surface that faces downwardly. Thus, an exposed planarized horizontal surface that faces downwardly includes metal pillar 970 and insulative base 982.

Contact terminal 986 is then electrolessly plated on metal pillar 970. Contact terminal 986 is composed of a nickel layer electrolessly plated on metal pillar 970 and a gold layer electrolessly plated on the nickel layer. The nickel layer contacts and is sandwiched between metal pillar 970 and the gold layer, and the gold layer is spaced from metal pillar 970 and exposed. For convenience of illustration, the nickel and gold layers are shown as a single layer.

The structure is dipped in an activator solution such as dilute palladium chloride of approximately 0.1 grams of palladium chloride and 5 cubic centimeters of hydrochloric acid per liter of water to render metal pillar 970 catalytic to electroless nickel, then the structure is rinsed in distilled water to remove the palladium from encapsulant 968 and insulative base 982.

The structure is then submerged in an electroless nickel plating solution such as Enthone Enplate NI-1424 at 85° C. Metal pillar 970 is catalytic to electroless nickel. Furthermore, encapsulant 968 and insulative base 982 are not catalytic to electroless nickel and therefore a plating mask is not necessary. As a result, contact terminal 986 plates on metal pillar 970.

The electroless nickel plating operation continues until contact terminal 986 is 4 microns thick. At this point, contact terminal 986 is primarily nickel and contain about 4 to 9 weight percentage phosphorus.

Thereafter, the structure is removed from the electroless nickel plating solution and briefly submerged in an electroless gold plating solution such as is MacDermid PLANAR™ at 70° C. Contact terminal 986 includes an exposed nickel surface layer and therefore is catalytic to electroless gold. Furthermore, encapsulant 968 and insulative base 982 are not catalytic to electroless gold and therefore a plating mask is not necessary. As a result, the gold deposits on the nickel surface layer. The gold electroless plating operation continues until the gold surface layer is 0.5 microns thick. Thereafter, the structure is removed from the electroless gold plating solution and rinsed in distilled water.

Contact terminal 986 contacts and is electrically connected to metal pillar 970 and extends downwardly beyond metal pillar 970 and insulative base 982. Thus, contact terminal 986 is spaced from and extends downwardly beyond chip 910, routing line 936, adhesive 964, connection joint 966 and encapsulant 968. Moreover, contact terminal 986 provides a robust, permanent electrical connection to metal pillar 970 that protrudes downwardly from metal pillar 970 and is exposed. Contact terminal 986 includes a buried nickel layer and a gold surface layer. The buried nickel layer provides the primary mechanical and electrical connection to metal pillar 970, and the gold surface layer provides a wettable surface to facilitate solder reflow. Contact terminal 986 has a circular shape with a diameter of 200 microns, includes a gold (rather than solder) surface 990A and lacks a flange (corresponding to flange 192).

The conductive traces each include a contact terminal with an exposed gold surface to provide a land grid array (LGA) package.

Semiconductor chip assembly 998 includes chip 910, routing line 936, plated contact 946, adhesive 964, connection joint 966, encapsulant 968, metal pillar 970, insulative base 982 and contact terminal 986.

Figure 34A:
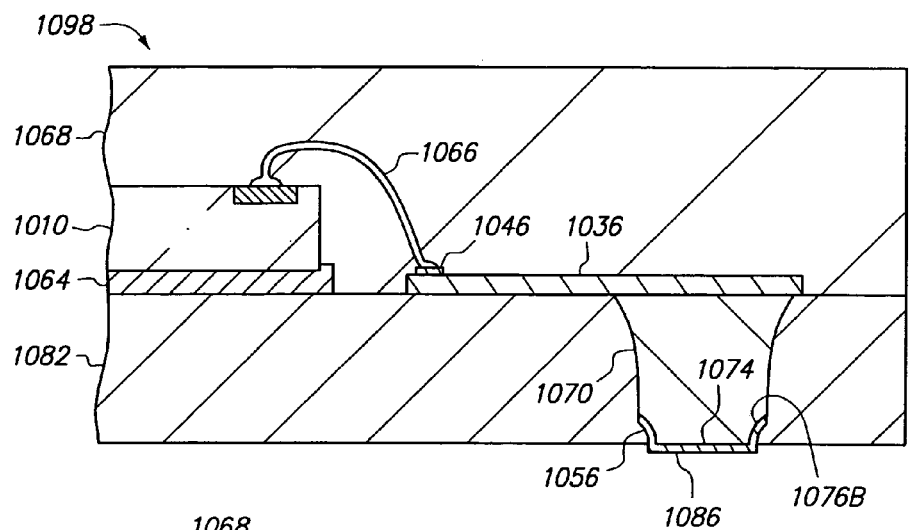
FIGS. 34A, 34B and 34C are cross-sectional, top and bottom views, respectively, of a semiconductor chip assembly in accordance with a tenth embodiment of the present invention.
Figure 34B:
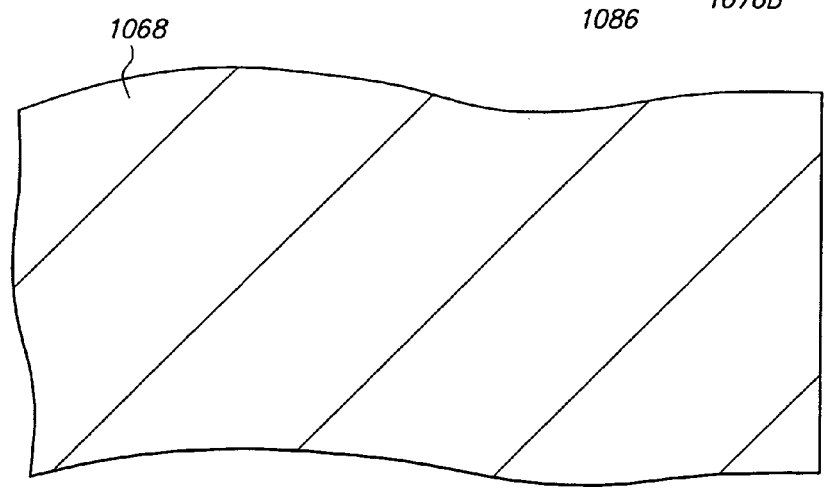
Figure 34C:
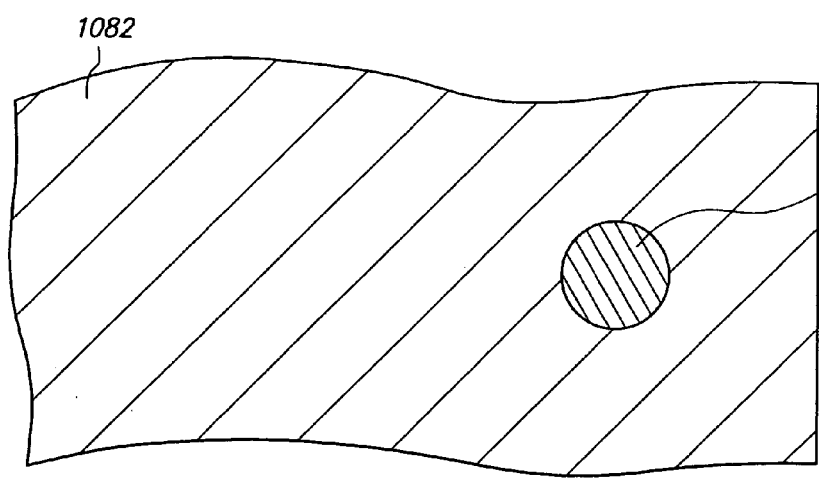

FIGS. 34A, 34B and 34C are cross-sectional, top and bottom views, respectively, of a semiconductor chip assembly in accordance with a tenth embodiment of the present invention. In the tenth embodiment, the pillar etch mask has its wing removed. For purposes of brevity, any description in the first embodiment is incorporated herein insofar as the same is applicable, and the same description need not be repeated. Likewise, elements of the tenth embodiment similar to those in the first embodiment have corresponding reference numerals indexed at one-thousand rather than one-hundred. For instance, chip 1010 corresponds to chip 110, routing line 1036 corresponds to routing line 136, etc.

Routing line 1036 and etch mask 1056 are formed in the same manner as routing line 936 and the corresponding etch mask, respectively. Thus, routing line 1036 and etch mask 1056 are simultaneously formed on the metal base (corresponding to metal base 120) during an electroplating operation, and the solder layer (corresponding to solder layer 154) is omitted.

Thereafter, adhesive 1064 is formed on the metal base, chip 1010 is mounted on adhesive 1064, connection joint 1066 is formed and then encapsulant 1068 is formed.

Thereafter, metal pillar 1070 is formed by applying a wet chemical etch in the same manner that metal pillar 970 is formed. As a result, the wet chemical etch removes the copper layer of etch mask 1056, and etch mask 1056 becomes much thinner.

Thereafter, etch mask 1056, which at this stage consists of a nickel layer, has its wing removed. The wing is the portion of etch mask 1056 that protrudes laterally from and does not contact metal pillar 1070. Thus, the wing is the portion of etch mask 1056 that is undercut by the wet chemical etch that forms metal pillar 1070. The wing includes a surface portion that corresponds to outer surface portion 192F, the remainder of etch mask 1056 includes a surface portion that corresponds to inner surface portion 192E, and the wing is separated from the remainder of etch mask 1056 at a boundary that corresponds to circular boundary 192G.

The wing is removed by rinsing the structure in distilled water during a cleaning step that follows the wet chemical etch. Since etch mask 1056 at this stage is extremely thin (1 micron), and the wing is not supported by metal pillar 1070, the boundary between the wing and the remainder of etch mask 1056 is relatively fragile. As a result, the water pressure from the distilled water rinse fractures etch mask 1056 at the boundary with the wing, thereby dislodging the wing from the remainder of etch mask 1056. However, the remainder of etch mask 1056 remains intact and continues to contact and cover pillar tip 1074 and tip sidewall portion 1076B.

Thereafter, insulative base 1082 is formed and grinded in the same manner as insulative base 982. As a result, chip 1010 remains embedded in encapsulant 1068, etch mask 1056 and metal pillar 1070 remain embedded in insulative base 1082, routing line 1036 remains unexposed and etch mask 1056 and metal pillar 1070 are exposed. In addition, etch mask 1056 is removed from pillar tip 1074 but continues to contact and cover tip sidewall portion 1076B. Furthermore, etch mask 1056, metal pillar 1070 and insulative base 1082 are laterally aligned with one another at a surface that faces downwardly. Thus, an exposed planarized horizontal surface that faces downwardly includes etch mask 1056, metal pillar 1070 and insulative base 1082.

Contact terminal 1086 is then electrolessly plated on etch mask 1056 and metal pillar 1070 in the same manner that contact terminal 986 is electrolessly plated on metal pillar 970.

The conductive traces each include a contact terminal with an exposed gold surface to provide a land grid array (LGA) package.

Semiconductor chip assembly 1098 includes chip 1010, routing line 1036, plated contact 1046, etch mask 1056, adhesive 1064, connection joint 1066, encapsulant 1068, metal pillar 1070, insulative base 1082 and contact terminal 1086.

Figure 35A:
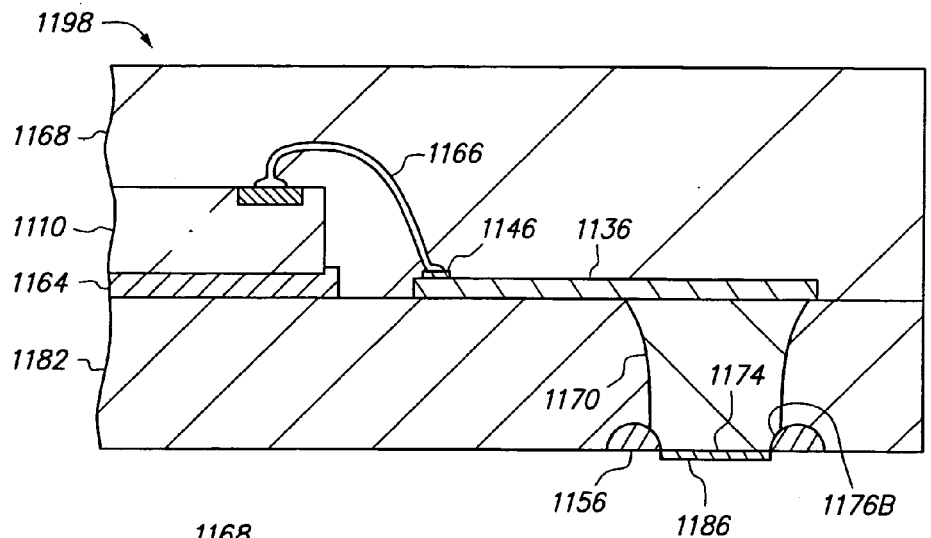
FIGS. 35A, 35B and 35C are cross-sectional, top and bottom views, respectively, of a semiconductor chip assembly in accordance with an eleventh embodiment of the present invention.
Figure 35B:
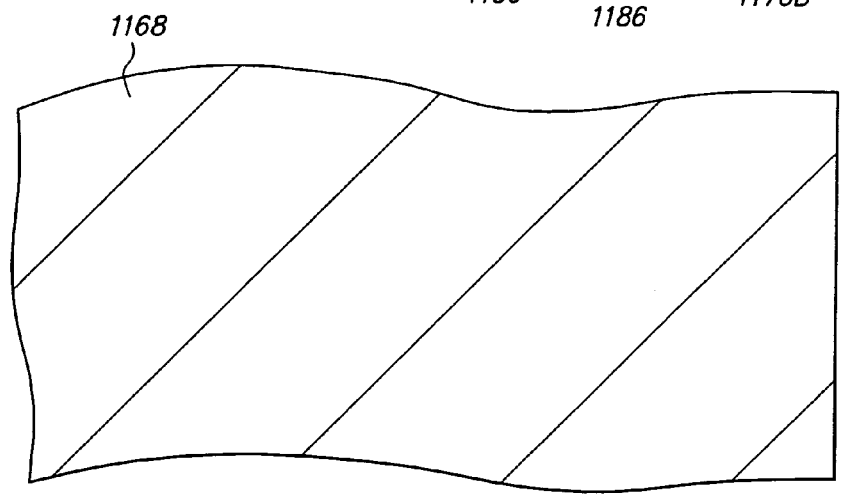
Figure 35C:
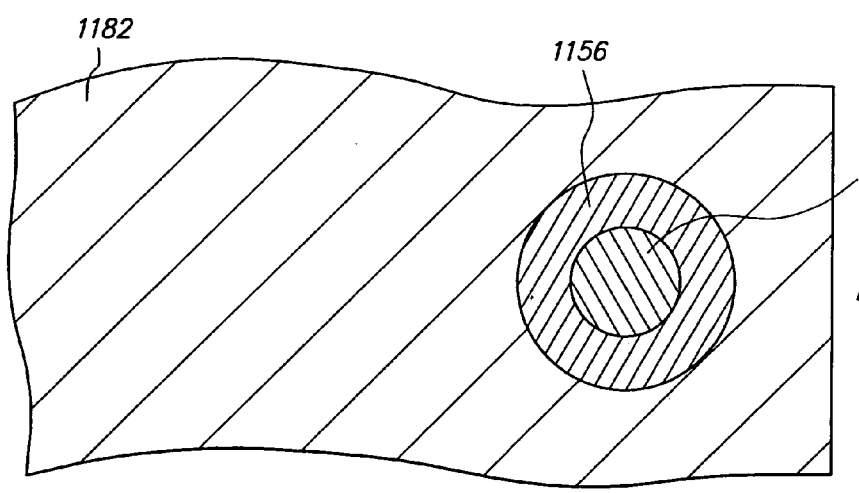

FIGS. 35A, 35B and 35C are cross-sectional, top and bottom views, respectively, of a semiconductor chip assembly in accordance with an eleventh embodiment of the present invention. In the eleventh embodiment, the pillar etch mask is epoxy. For purposes of brevity, any description in the first embodiment is incorporated herein insofar as the same is applicable, and the same description need not be repeated. Likewise, elements of the eleventh embodiment similar to those in the first embodiment have corresponding reference numerals indexed at eleven-hundred rather than one-hundred. For instance, chip 1110 corresponds to chip 110, routing line 1136 corresponds to routing line 136, etc.

The metal layer (corresponding to metal layer 152) and the solder layer (corresponding to solder layer 154) are omitted.

Etch mask 1156 is formed by depositing epoxy paste on the metal base (corresponding to metal base 120) and then curing. The epoxy paste is similar to that used for insulative base 182. The epoxy paste is deposited on the metal base using stencil printing. During the stencil printing process, a stencil (not shown) with a thickness of 100 microns is placed over the metal base, a stencil opening with a diameter of 450 microns is vertically aligned with the trench (corresponding to trench 130), and then a squeegee (not shown) pushes the epoxy paste along the surface of the stencil opposite the metal base, through the stencil opening, onto the metal base and into the trench. The epoxy paste is compliant enough at room temperature to conform to virtually any shape. As a result, the epoxy paste fills the trench and extends above the metal base in the stencil opening. Thereafter, the stencil is removed and the epoxy paste is cured or hardened at a relatively low temperature in the range of 100 to 250° C. to form a solid adherent insulator that provides etch mask 1156 with dimensions similar to etch mask 156.

Thereafter, adhesive 1164 is formed on the metal base, chip 1110 is mounted on adhesive 1164, connection joint 1166 is formed, encapsulant 1168 is formed and then metal pillar 1170 is formed.

Thereafter, insulative base 1182 is formed and grinded in the same manner as insulative base 982. As a result, chip 1110 remains embedded in encapsulant 1168, etch mask 1156 and metal pillar 1170 remain embedded in insulative base 1182, routing line 1136 remains unexposed and etch mask 1156 and metal pillar 1170 are exposed. In addition, etch mask 1156 is removed from pillar tip 1174 but continues to contact and cover tip sidewall portion 1176B. Furthermore, etch mask 1156, metal pillar 1170 and insulative base 1182 are laterally aligned with one another at a surface that faces downwardly. Thus, an exposed planarized horizontal surface that faces downwardly includes etch mask 1156, metal pillar 1170 and insulative base 1182.

Contact terminal 1186 is then electrolessly plated on metal pillar 1170 in the same manner that contact terminal 986 is electrolessly plated on metal pillar 970.

The conductive traces each include a contact terminal with an exposed gold surface to provide a land grid array (LGA) package.

Semiconductor chip assembly 1198 includes chip 1110, routing line 1136, plated contact 1146, etch mask 1156, adhesive 1164, connection joint 1166, encapsulant 1168, metal pillar 1170, insulative base 1182 and contact terminal 1186.

Figure 36A:
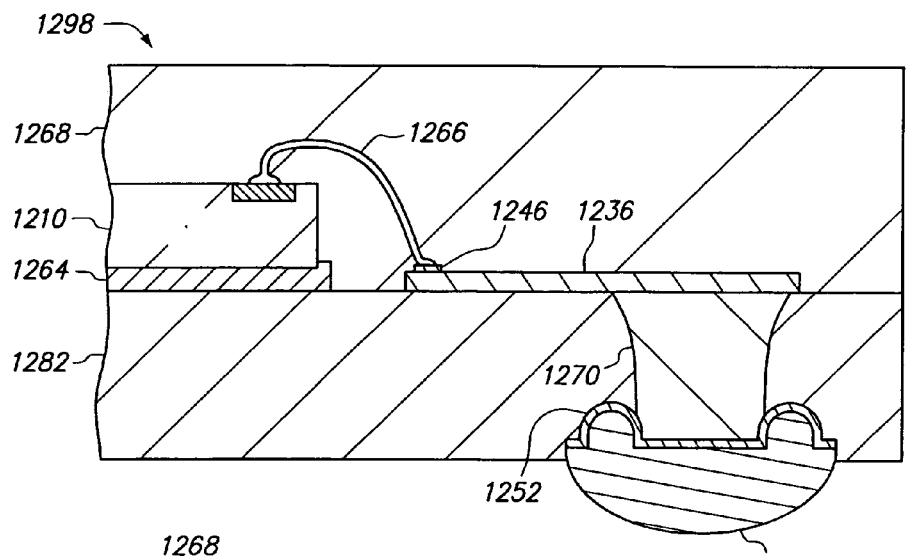
FIGS. 36A, 36B and 36C are cross-sectional, top and bottom views, respectively, of a semiconductor chip assembly in accordance with a twelfth embodiment of the present invention.
Figure 36B:
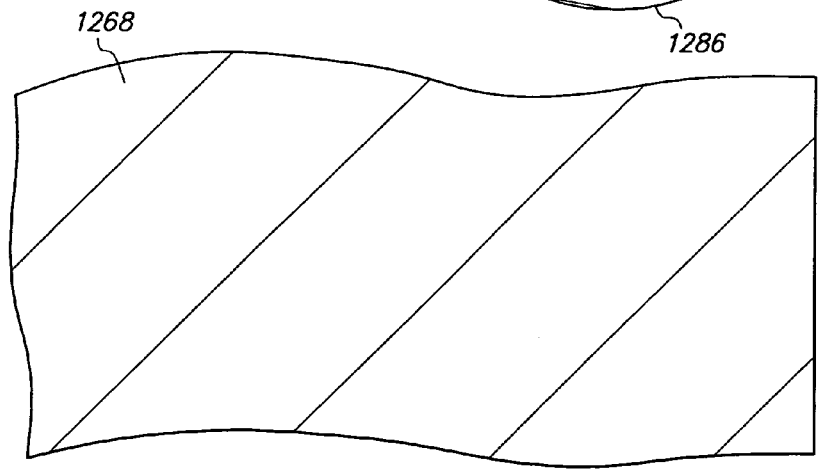
Figure 36C:
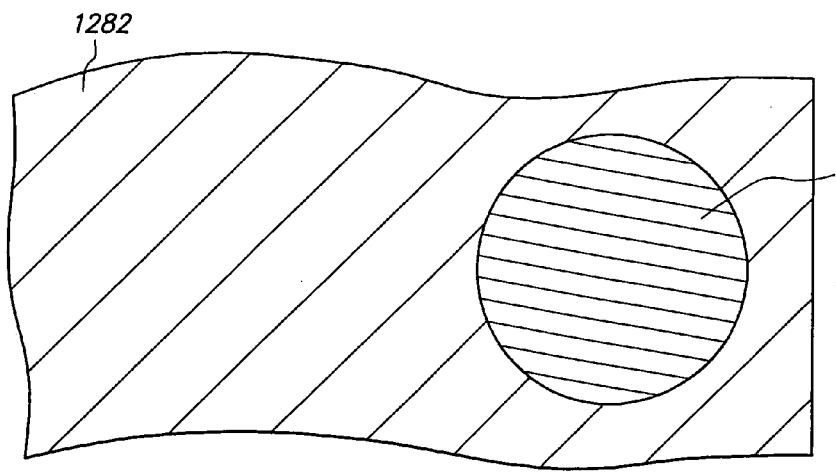

FIGS. 36A, 36B and 36C are cross-sectional, top and bottom views, respectively, of a semiconductor chip assembly in accordance with a twelfth embodiment of the present invention. In the twelfth embodiment, the plated contact and the metal layer are simultaneously formed. For purposes of brevity, any description in the first embodiment is incorporated herein insofar as the same is applicable, and the same description need not be repeated. Likewise, elements of the twelfth embodiment similar to those in the first embodiment have corresponding reference numerals indexed at twelve-hundred rather than one-hundred. For instance, chip 1210 corresponds to chip 110, routing line 1236 corresponds to routing line 136, etc.

Plated contact 1246 and metal layer 1252 are simultaneously formed during an electroplating operation. This is accomplished by a slight adjustment to the electroplating operation previously described for plated contact 146. In particular, the photoresist layer (corresponding to photoresist layer 144) is patterned like the photoresist layer (corresponding to photoresist layer 150) for metal layer 152. As a result, plated contact 1246 and metal layer 1252 are each composed of a nickel layer electroplated on a copper surface and a gold layer electroplated on the nickel layer. In plated contact 1246, the nickel layer is electroplated on the copper layer of routing line 1236, contacts and is sandwiched between routing line 1236 and the gold layer, is buried beneath the gold layer and has a thickness of 3 microns, and the gold layer contacts the nickel layer, is spaced from routing line 1236, is exposed and has a thickness of 0.5 microns. In metal layer 1252, the nickel layer is electroplated on the metal base (corresponding to metal base 120), contacts and is sandwiched between the metal base and the gold layer, is buried beneath the gold layer and has a thickness of 3 microns, and the gold layer contacts the nickel layer, is spaced from the metal base, is exposed and has a thickness of 0.5 microns. In addition, the photoresist layers (corresponding to photoresist layers 148 and 150) and related electroplating operation are omitted.

Thereafter, the solder layer (corresponding to solder layer 154) is formed. In metal layer 1252, the buried nickel layer provides the primary mechanical and electrical connection for the solder layer to the metal base, and the gold surface layer provides a wettable surface to facilitate solder reflow. Furthermore, the solder reflow is essentially confined to metal layer 1252.

Semiconductor chip assembly 1298 includes chip 1210, routing line 1236, plated contact 1246, adhesive 1264, connection joint 1266, encapsulant 1268, metal pillar 1270, insulative base 1282 and contact terminal 1286.

Figure 37A:
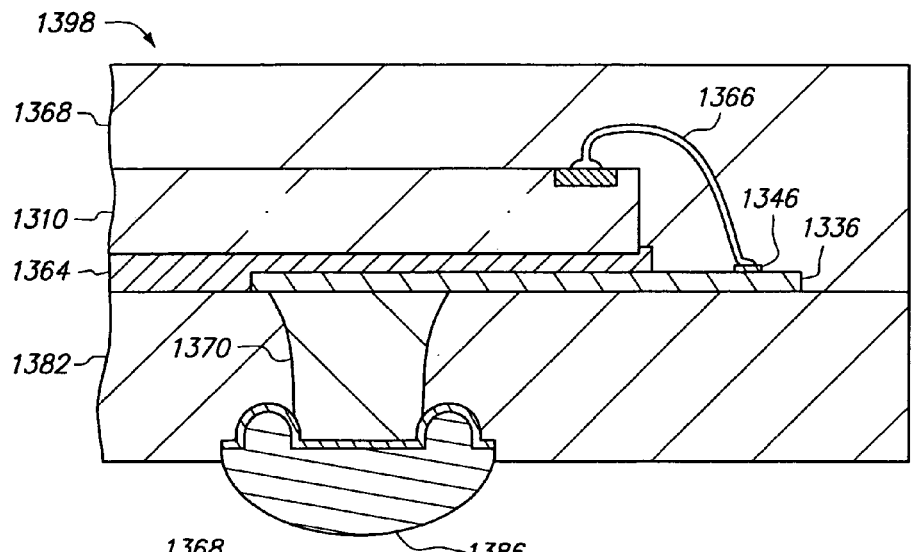
FIGS. 37A, 37B and 37C are cross-sectional, top and bottom views, respectively, of a semiconductor chip assembly in accordance with a thirteenth embodiment of the present invention.
Figure 37B:
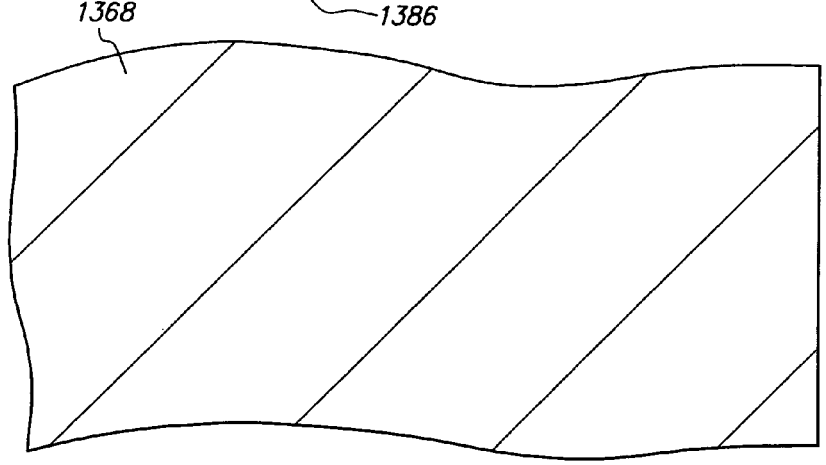
Figure 37C:
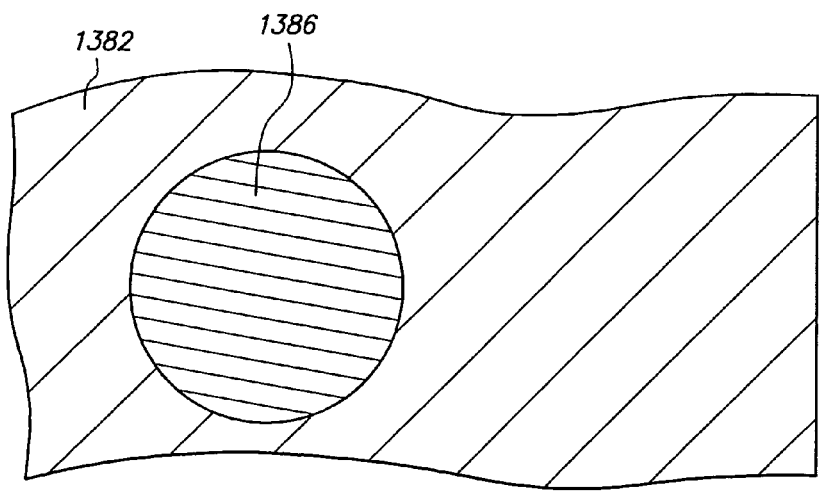

FIGS. 37A, 37B and 37C are cross-sectional, top and bottom views, respectively, of a semiconductor chip assembly in accordance with a thirteenth embodiment of the present invention. In the thirteenth embodiment, the metal pillar is disposed within the periphery of the chip. For purposes of brevity, any description in the first embodiment is incorporated herein insofar as the same is applicable, and the same description need not be repeated. Likewise, elements of the thirteenth embodiment similar to those in the first embodiment have corresponding reference numerals indexed at thirteen-hundred rather than one-hundred. For instance, chip 1310 corresponds to chip 110, routing line 1336 corresponds to routing line 136, etc.

Routing line 1336 extends within and outside the periphery of chip 1310, and metal pillar 1370 and contact terminal 1386 are disposed within the periphery of chip 1310. This is accomplished by a slight adjustment to the etching operation previously described for trench 130 and the electroplating operation previously described for routing line 136 and etch mask 156. In particular, the photoresist layer (corresponding to photoresist layer 128) is patterned to laterally shift the opening for the trench (corresponding to trench 130), and therefore the trench is laterally shifted relative to trench 130.

Thereafter, the photoresist layer (corresponding to photoresist layer 132) is patterned to reshape the opening for routing line 1336 and the photoresist layer (corresponding to photoresist layer 150) is patterned to laterally shift the opening for the etch mask (corresponding to etch mask 156), and therefore routing line 1336 is laterally shifted and rotated relative to routing line 136 and the etch mask is laterally shifted relative to etch mask 156. As a result, metal pillar 1370 and contact terminal 1386 are disposed within the periphery of chip 1310.

Semiconductor chip assembly 1398 includes chip 1310, routing line 1336, plated contact 1346, adhesive 1364, connection joint 1366, encapsulant 1368, metal pillar 1370, insulative base 1382 and contact terminal 1386.

Figure 38A:
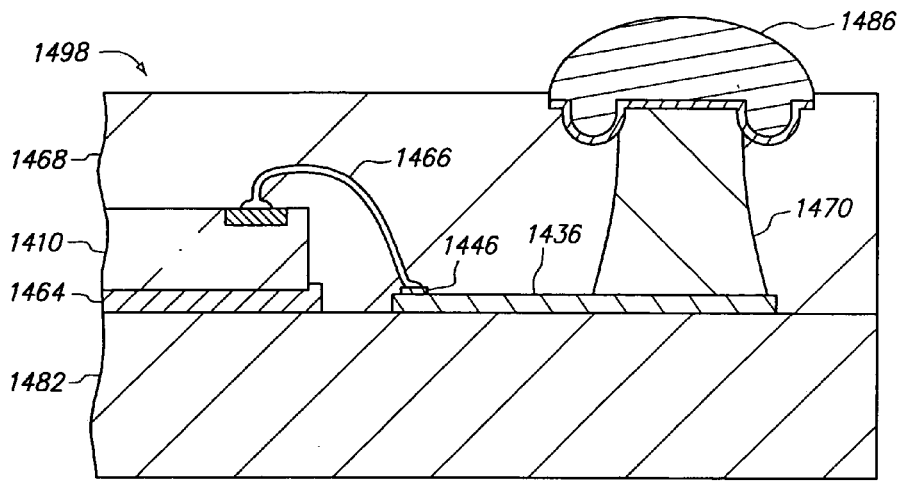
FIGS. 38A, 38B and 38C are cross-sectional, top and bottom views, respectively, of a semiconductor chip assembly in accordance with a fourteenth embodiment of the present invention.
Figure 38B:
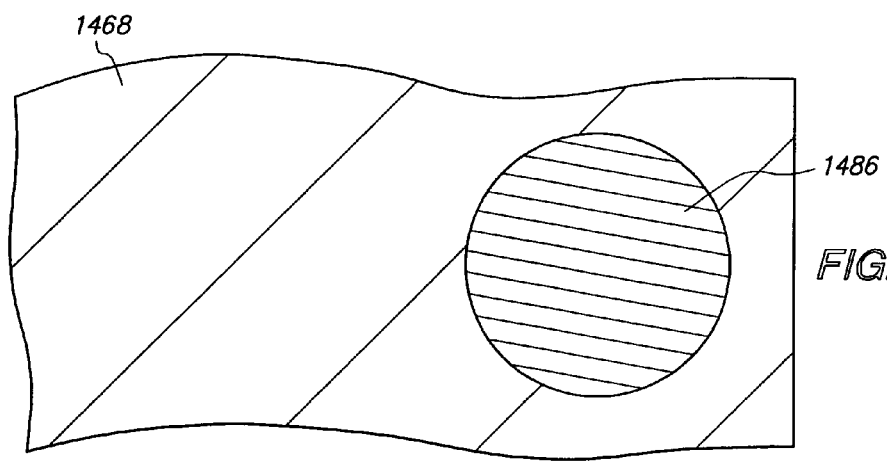
Figure 38C:
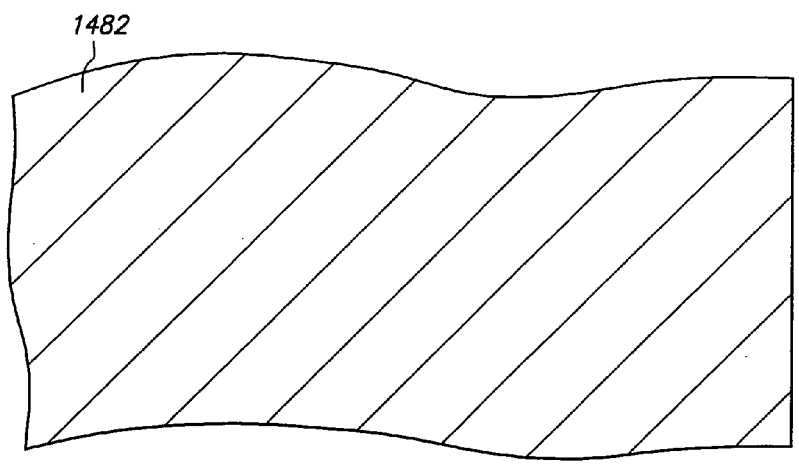

FIGS. 38A, 38B and 38C are cross-sectional, top and bottom views, respectively, of a semiconductor chip assembly in accordance with a fourteenth embodiment of the present invention. In the fourteenth embodiment, the metal pillar is inverted. For purposes of brevity, any description in the first embodiment is incorporated herein insofar as the same is applicable, and the same description need not be repeated. Likewise, elements of the fourteenth embodiment similar to those in the first embodiment have corresponding reference numerals indexed at fourteen-hundred rather than one-hundred. For instance, chip 1410 corresponds to chip 140, routing line 1436 corresponds to routing line 136, etc.

The metal base (corresponding to metal base 120) has a thickness of 500 microns (rather than 150 microns). Thereafter, routing line 1436 is formed on the downwardly facing surface (corresponding to surface 124) of the metal base, and the trench (corresponding to trench 130) and the etch mask (corresponding to etch mask 156) are formed on the upwardly facing surface (corresponding to surface 122) of the metal base.

Thereafter, insulative base 1482 is deposited on routing line 1436 and the metal base, and then insulative base 1482 is partially polymerized and forms a gel.

Thereafter, the structure is placed on a support (not shown) similar to metal base 120 such that insulative base 1482 contacts the support and is sandwiched between the metal base and the support and between routing line 1436 and the support while insulative base 1482 is a gel, and then insulative base 1482 is hardened.

Thereafter, metal pillar 1470 is formed, and then plated contact 1446 is formed.

Thereafter, adhesive 1464 is deposited on insulative base 1482, then chip 1410 is placed on adhesive 1464, and then adhesive 1464 is hardened. Metal pillar 1470 is not disposed downwardly beyond chip 1410, and instead extends upwardly and downwardly beyond and vertically across the thickness of chip 1410.

Thereafter, connection joint 1466 is formed, and then encapsulant 1468 is formed. Encapsulant 1468 is similar to insulative base 182 (rather than encapsulant 168) and has a thickness of 700 microns (rather than 400 microns). Accordingly, encapsulant 1468 is deposited on chip 1410, routing line 1436, adhesive 1464, connection joint 1466, metal pillar 1470 and insulative base 1482, and then encapsulant 1468 is hardened.

Thereafter, encapsulant 1468 is grinded to expose the etch mask, and then contact terminal 1486 is formed.

Semiconductor chip assembly 1498 includes chip 1410, routing line 1436, plated contact 1446, adhesive 1464, connection joint 1466, encapsulant 1468, metal pillar 1470, insulative base 1482 and contact terminal 1486.

Figure 39A:
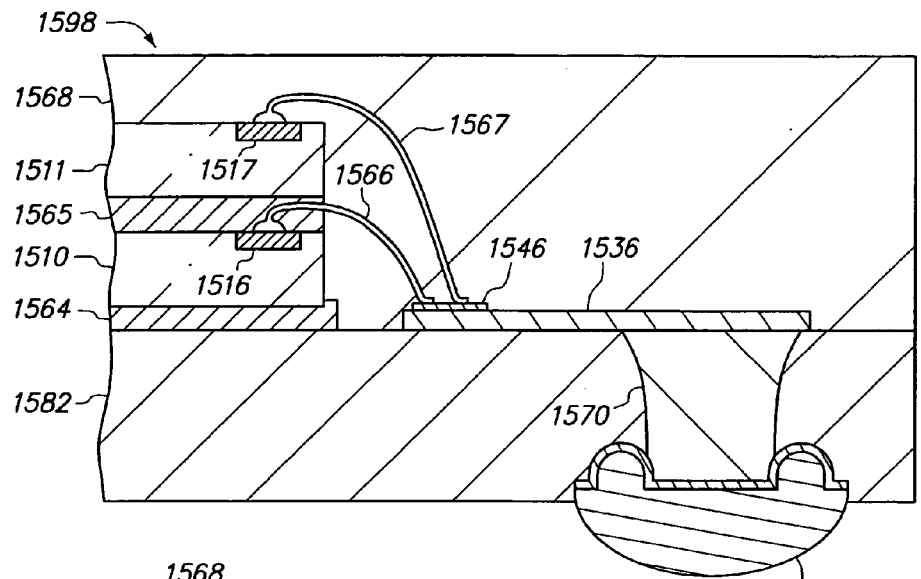
FIGS. 39A, 39B and 39C are cross-sectional, top and bottom views, respectively, of a semiconductor chip assembly in accordance with a fifteenth embodiment of the present invention.
Figure 39B:
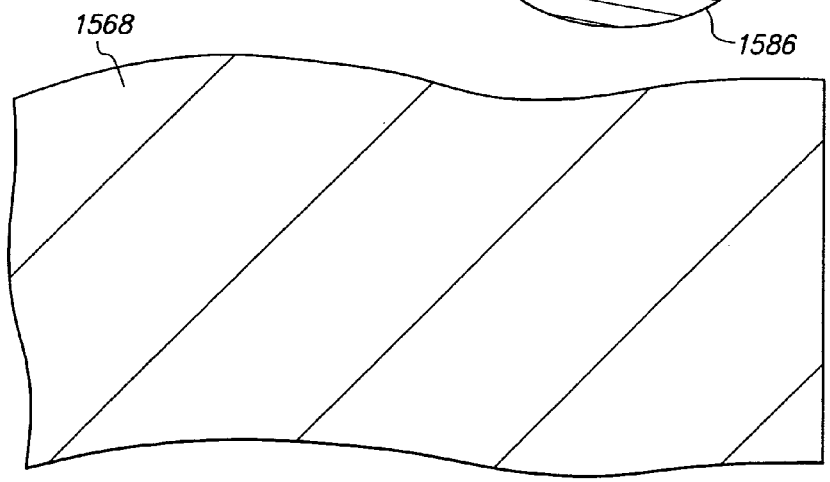
Figure 39C:
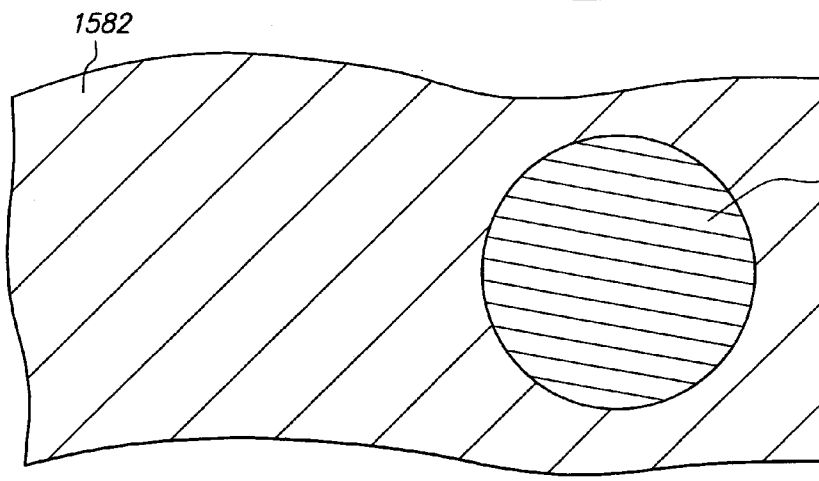
Figure 40:
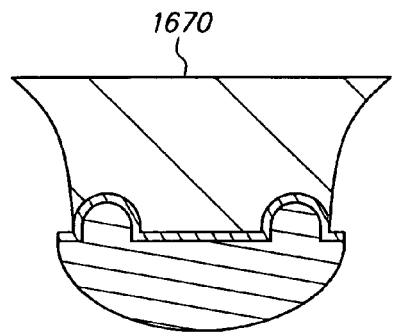
FIGS. 40–44 are cross-sectional views of metal pillars in accordance with a sixteenth to twentieth embodiment of the present invention.
Figure 41:
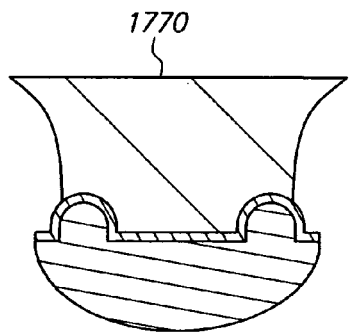
Figure 42:
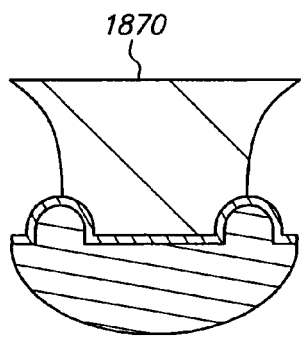
Figure 43:
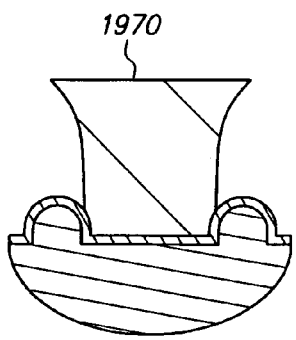
Figure 44:
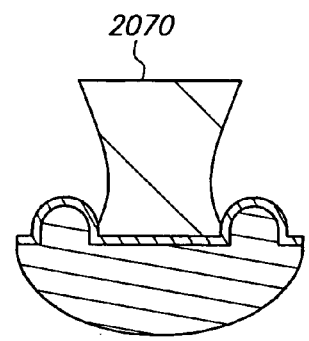

FIGS. 39A, 39B and 39C are cross-sectional, top and bottom views, respectively, of a semiconductor chip assembly in accordance with a fifteenth embodiment of the present invention. In the fifteenth embodiment, the assembly is a multi-chip package. For purposes of brevity, any description in the first embodiment is incorporated herein insofar as the same is applicable, and the same description need not be repeated. Likewise, elements of the fifteenth embodiment similar to those in the first embodiment have corresponding reference numerals indexed at fifteen-hundred rather than one-hundred. For instance, chip 1510 corresponds to chip 110, routing line 1536 corresponds to routing line 136, etc.

Plated contact 1546 is lengthened. This is accomplished by a slight adjustment to the electroplating operation previously described for plated contact 146. In particular, the photoresist layer (corresponding to photoresist layer 142) is patterned to lengthen the opening for plated contact 1546, and therefore plated contact 1546 is lengthened relative to plated contact 146.

Chip 1510 is mechanically attached to routing line 1536 by adhesive 1564 and electrically connected to routing line 1536 by connection joint 1566.

Thereafter, adhesive 1565 is deposited as a spacer paste that includes silicon spacers on chip 1510, then chip 1511 (which includes pad 1517 and is essentially identical to chip 1510) is placed on adhesive 1565 such that adhesive 1565 contacts and is sandwiched between chips 1510 and 1511, and then the structure is placed in an oven and adhesive 1565 is fully cured (C stage) at relatively low temperature in the range of 150 to 200° C. to form a solid adhesive insulative layer that mechanically attaches chips 1510 and 1511. Adhesive 1565 is 100 microns thick between chips 1510 and 1511, and chips 1510 and 1511 are spaced and separated from and vertically aligned with one another. A suitable spacer paste is Hysol QMI 500.

Thereafter, chip 1511 is electrically connected to routing line 1536 by connection joint 1567 in the same manner that chip 1510 is electrically connected to routing line 1536 by connection joint 1566.

Thereafter, encapsulant 1568 with a thickness of 700 microns (rather than 400 microns) is formed so that encapsulant 1568 contacts and covers chips 1510 and 1511, routing line 1536, plated contact 1546, adhesives 1564 and 1565 and connection joints 1566 and 1567, and then metal pillar 1570, insulative base 1582 and contact terminal 1586 are formed.

The semiconductor chip assembly is a multi-chip first-level package. Chips 1510 and 1511 are embedded in encapsulant 1568. Furthermore, an electrically conductive path between pad 1516 and metal pillar 1570 not only includes but also requires routing line 1536, and an electrically conductive path between pad 1517 and metal pillar 1570 not only includes but also requires routing line 1536. Thus, chips 1510 and 1511 are both embedded in encapsulant 1568 and electrically connected to metal pillar 1570 by an electrically conductive path that includes routing line 1536.

Semiconductor chip assembly 1598 includes chips 1510 and 1511, routing line 1536, plated contact 1546, adhesives 1564 and 1565, connection joints 1566 and 1567, encapsulant 1568, metal pillar 1570, insulative base 1582 and contact terminal 1586.

FIGS. 40, 41, 42, 43 and 44 are cross-sectional views of metal pillars 1670, 1770, 1870, 1970 and 2070, respectively, in accordance with a sixteenth to twentieth embodiment of the present invention.

Metal pillars 1670, 1770, 1870, 1970 and 2070 have increasingly narrow shape as the wet chemical etch that forms the metal pillar increasingly undercuts the flange, for instance by increasing the etch concentration or the etch time. Metal pillars 1670, 1770, 1870, 1970 and 2070 also have generally conical shapes with a diameter that substantially continuously decreases from the pillar base to the pillar tip as the metal pillar extends downwardly. Moreover, metal pillars 1670, 1770, 1870, 1970 and 2070 have identical pillar tips. That is, the pillar tips are unaffected by the wet chemical etch, and therefore the pillar tips are precisely-controlled despite variations in the wet chemical etch.

In metal pillars 1670 and 1770 the spike is located between the flange tip and the outer diameter of the flange, in metal pillar 1870 the spike is located at the flange tip, and in metal pillars 1970 and 2070 the spike is located between the flange tip and the inner diameter of the flange. Thus, the wet chemical etch that forms metal pillars 1670 and 1770 undercuts the outer diameter of the flange without undercutting the flange tip or the inner diameter of the flange, the wet chemical etch that forms metal pillar 1870 undercuts the outer diameter of the flange are reaches the flange tip without undercutting the inner diameter of the flange, and the wet chemical etch that forms metal pillars 1970 and 2070 undercuts the flange tip and the outer diameter of the flange without undercutting the inner diameter of the flange.

In metal pillars 1670, 1770, 1870, 1970 and 2070 the pillar base and the pillar tip face in opposite directions, the tapered sidewalls include base and tip sidewall portions that are adjacent to one another at the spike, the base sidewall portion is a concave arc that is adjacent to the pillar base, is spaced from the pillar tip, slants inwardly towards the pillar tip and extends upwardly beyond the tip sidewall portion, the tip sidewall portion is a concave arc that is adjacent to the pillar tip, is spaced from the pillar base, slants inwardly towards the pillar tip and extends downwardly beyond the base sidewall portion, and the spike protrudes laterally from the metal pillar, is spaced from the pillar base and the pillar tip, spans 360 degrees laterally around the metal pillar at a constant vertical distance from the pillar base and the pillar tip and provides an abrupt discontinuity between the base and tip sidewall portions. In addition, the pillar base and the pillar tip are flat and parallel to one another, the pillar tip is disposed within a surface area of the pillar base, and a surface area of the pillar base is at least 20 percent larger than a surface area of the pillar tip.

In metal pillars 1670, 1770, 1870, 1970 and 2070 the base sidewall portion extends vertically only upwardly beyond the spike. In metal pillars 1670, 1770, 1870 and 1970 the base sidewall portion has a maximum diameter at the pillar base and a minimum diameter at the spike and extends laterally only outwardly beyond the spike, whereas in metal pillar 2070 the base sidewall portion has a maximum diameter at the pillar base and a minimum diameter near but spaced from the spike and extends laterally inwardly and outwardly beyond the spike.

In metal pillars 1670, 1770, 1870, 1970 and 2070 the tip sidewall portion has a maximum diameter at the spike and a minimum diameter at the pillar tip and extends laterally only inwardly beyond the spike. In metal pillars 1870, 1970 and 2070 the tip sidewall portion extends vertically only downwardly beyond the spike, whereas in metal pillars 1670 and 1770 the tip sidewall portion extends vertically upwardly and downwardly beyond the spike.

The semiconductor chip assemblies described above are merely exemplary. Numerous other embodiments are contemplated. For instance, the plated contact and the insulative base can be omitted. In addition, the embodiments described above can generally be combined with one another. For instance, the flip-chip in the second embodiment and the plated connection joints in the third and fourth embodiments can be used in the other embodiments except for the multi-chip assembly in the twelfth embodiment since the chips are not inverted. Likewise, the contact terminals in the fifth and sixth embodiments can be used in the other embodiments except for the ninth, tenth and eleventh embodiments since other contact terminals are formed. Likewise, the omitted insulative base in the eighth embodiment can be used in the other embodiments. Likewise, the pillar etch masks removed from the pillar tips in the ninth, tenth and eleventh embodiments can be used in the other embodiments except for the fifth and sixth embodiments since the pillar etch masks provide the contact terminals. Likewise, the pillar etch mask in the twelfth embodiment and the metal pillars in the thirteenth and fourteenth embodiments can be used in the other embodiments. Likewise, the multi-chip assembly in the fifteenth embodiment can be used in the other embodiments except for the second to fourth embodiments since the chips are inverted. Likewise, the metal pillars in the sixteen, seventeen, eighteenth, nineteenth and twentieth embodiments can be used in the first to fifteenth embodiments. The embodiments described above can be mixed-and-matched with one another and with other embodiments depending on design and reliability considerations.

The metal base need not necessarily be removed within the periphery of the chip. For instance, a portion of the metal base that extends within the periphery of the chip and is spaced from the metal pillar can remain intact and provide a heat sink.

The pillar etch mask can be a wide variety of materials including copper, gold, nickel, palladium, tin, solder, photoresist, epoxy, and combinations thereof, can be a conductor or an insulator, can be formed by a wide variety of processes including electroplating, electroless plating, printing, reflowing, curing, and combinations thereof, and can have a wide variety of shapes and sizes. For instance, the pillar etch mask can formed by a single process such as electroplating, solder paste deposition and reflow or epoxy paste deposition and curing, or alternatively, multiple processes such as electroplating followed by solder paste deposition and reflow. Advantageously, an electroplated metal layer can provide a wettable surface and the solder paste deposition and reflow can form a solder layer more rapidly than electroplating the metal layer to the thickness of the solder layer, thereby improving manufacturing throughput. Furthermore, the metal layer (or exposed surface thereof can be various wettable metals including gold, tin and solder, particularly if solder reflow occurs thereon, or alternatively, the metal layer (or exposed surface thereof) can be various non-wettable metals, particularly if solder reflow does not occur thereon.

The pillar etch mask can be deposited on the metal base before, during or after the routing line is deposited on the metal base, before or after the chip is attached to the routing line, before or after the encapsulant is formed and before, during or after the connection joint is formed. For instance, an electroplated metal layer can be simultaneously formed with the routing line, the plated contact or the connection joint, thereby improving manufacturing throughput. In addition, the solder layer can be formed on the metal layer before or after the routing line is deposited on the metal base, before or after the chip is attached to the routing line, before or after the encapsulant is formed, before or after the connection joint is formed, before or after the metal pillar is formed and before or after the insulative base is formed. Likewise, the solder layer can be formed on the metal layer before or after the photoresist layer (corresponding to photoresist layer 150) that defines the metal layer is removed. For instance, the photoresist layer that defines the metal layer can remain intact during the solder paste deposition and reflow to assist with confining the solder layer to the metal layer.

The pillar etch mask can be a conductor that includes the metal layer. For instance, the pillar etch mask can be the metal layer and the solder layer, particularly if the pillar etch mask is not removed from the pillar tip after the metal pillar is formed, or alternatively, the pillar etch mask can be the metal layer, particularly if the pillar etch mask is removed from the pillar tip after the metal pillar is formed. The pillar etch mask can also be an insulator that excludes the metal layer. For instance, the pillar etch mask can be epoxy, particularly if the pillar etch mask is removed from the pillar tip after the metal pillar is formed.

The pillar etch mask can remain permanently attached to the metal pillar or be removed after the metal pillar is formed.

The pillar etch mask can be reshaped to conformally coat the pillar tip and the tip sidewall portion but remain spaced from the base sidewall portion, for instance by dislodging the wing by mechanical brushing, sand blasting, air blowing or water rinsing, or by reflowing a pillar etch mask composed of solder when the metal pillar does not provide a wettable surface. Alternatively, a pillar etch mask composed of solder can be reflowed to conformally coat the metal pillar (including the pillar tip, the tip sidewall portion and the base sidewall portion), for instance by depositing flux on the metal pillar so that the metal pillar provides a wettable surface before the solder reflow operation.

The routing line can be various conductive metals including copper, gold, nickel, silver, palladium, tin, combinations thereof, and alloys thereof. The preferred composition of the routing line will depend on the nature of the connection joint as well as design and reliability factors. Furthermore, those skilled in the art will understand that in the context of a semiconductor chip assembly, a copper material is typically a copper alloy that is mostly copper but not pure elemental copper, such copper-zirconium (99.9% copper), copper-silver-phosphorus-magnesium (99.7% copper), or copper-tin-iron-phosphorus (99.7% copper). Likewise, the routing line can fan-in as well as fan-out.

The routing line can be formed on the metal base by numerous deposition techniques including electroplating and electroless plating. In addition, the routing line can be deposited on the metal base as a single layer or multiple layers. For instance, the routing line can be a 10 micron layer of gold, or alternatively, a 9.5 micron layer of nickel electroplated on a 0.5 micron layer of gold electroplated on a copper base to reduce costs, or alternatively, a 9 micron layer of nickel electroplated on a 0.5 micron layer of gold electroplated on a 0.5 micron layer of tin electroplated on a copper base to reduce costs and avoid gold-copper alloys that may be difficult to remove when the copper base is etched. As another example, the routing line can consist of a non-copper layer electroplated on a copper base and a copper layer electroplated on the non-copper layer. Suitable non-copper layers include nickel, gold, palladium and silver. After the routing line is formed, a wet chemical etch can be applied that is highly selective of copper with respect to the non-copper layer to etch the copper base and expose the routing line without removing the copper or non-copper layers. The non-copper layer provides an etch stop that prevents the wet chemical etch from removing the copper layer. Furthermore, it is understood that in the context of the present invention, the routing line and the metal base are different metals (or metallic materials) even if a multi-layer routing line includes a single layer that is similar to the metal base (such as the example described above) or a single layer of a multi-layer metal base.

The routing line can also be formed by etching a metal layer attached to the metal base. For instance, a photoresist layer can be formed on the metal layer, the metal layer can be etched using the photoresist layer as an etch mask, and then the photoresist layer can be stripped. Alternatively, a photoresist layer can be formed on the metal layer, a plated metal can be selectively electroplated on the metal layer using the photoresist layer as a plating mask, the photoresist layer can be stripped, and then the metal layer can be etched using the plated metal as an etch mask. In this manner, the routing line can be formed semi-additively and include unetched portions of the metal layer and the plated metal. Likewise, the routing line can be formed subtractively from the metal layer, regardless of whether the plated metal etch mask remains attached to the routing line.

The routing line can be spot plated near the pad to make it compatible with receiving the connection joint. For instance, a copper routing line can be spot plated with nickel and then silver to make it compatible with a gold ball bond connection joint and avoid the formation of brittle silver-copper intermetallic compounds. Likewise, the pillar etch mask can be spot plated to make it compatible with receiving a solder material. For instance, a nickel pillar etch mask can be spot plated with gold to facilitate solder reflow.

The metal pillar can have a wide variety of shapes and sizes. For instance, the pillar base and the pillar tip can have a circular, rectangular or square shape. For example, the trench can have rectangular inner and outer peripheries so that the pillar etch mask, the pillar base and the pillar tip have rectangular shapes. In addition, the pillar base can have a diameter that is less than, equal to or greater than the diameter of the pillar tip and the outer periphery of the trench. For example, the pillar base and the enlarged circular portion of the routing line upon which the pillar base is mounted can have diameters that are at least 100 microns less than the outer periphery of the trench to facilitate high-density circuitry.

The metal pillar can be uncovered in the downward direction by the encapsulant, the insulative base or any other insulative material of the assembly. For instance, the metal pillar can be exposed in the downward direction, or alternatively, the metal pillar can be unexposed in the downward direction and the contact terminal that contacts and is overlapped by the metal pillar can be exposed in the downward direction, or alternatively, the metal pillar can be unexposed in the downward direction, a plated terminal that contacts and is overlapped by the metal pillar can be unexposed in the downward direction, and a solder terminal that contacts and is overlapped by the plated terminal and is spaced from and overlapped by the metal pillar can be exposed in the downward direction, or alternatively, the metal pillar can be covered in the downward direction by an insulative material external to the assembly such as another semiconductor chip assembly in a stacked arrangement. In every case, the metal pillar is not covered in the downward direction by the encapsulant, the insulative base or any other insulative material of the assembly.

Further details regarding a metal pillar that is etched from a metal base and contacts a routing line are disclosed in U.S. application Ser. No. 10/714,794 filed Nov. 17, 2003 by Chuen Rong Leu et al. entitled "Semiconductor Chip Assembly with Embedded Metal Pillar," U.S. application Ser. No. 10/994,604 filed Nov. 22, 2004 by Charles W. C Lin et al. entitled "Semiconductor Chip Assembly with Bumped Metal Pillar" and U.S. application Ser. No. 10/994,836 filed Nov. 22, 2004 by Charles W. C Lin et al. entitled "Semiconductor Chip Assembly with Carved Bumped Terminal" which are incorporated by reference.

The conductive trace can function as a signal, power or ground layer depending on the purpose of the associated chip pad.

The pad can have numerous shapes including a flat rectangular shape and a bumped shape. If desired, the pad can be treated to accommodate the connection joint.

Numerous adhesives can be applied to mechanically attach the chip to the routing line. For instance, the adhesive can be applied as a paste, a laminated layer, or a liquid applied by screen-printing, spin-on, or spray-on. The adhesive can be a single layer that is applied to the metal base or a solder mask and then contacted to the chip or a single layer that is applied to the chip and then contacted to the metal base or a solder mask. Similarly, the adhesive can be multiple layers with a first layer applied to the metal base or a solder mask, a second layer applied to the chip and then the layers contacted to one another. Thermosetting adhesive liquids and pastes such as epoxies are generally suitable. Likewise, thermoplastic adhesives such as an insulative thermoplastic polyimide film with a glass transition temperature (Tg) of 400° C. are also generally suitable. Silicone adhesives are also generally suitable.

The encapsulant can be deposited using a wide variety of techniques including printing and transfer molding. For instance, the encapsulant can be printed on the chip as an epoxy paste and then cured or hardened to form a solid adherent protective layer. The encapsulant can be any of the adhesives mentioned above. Moreover, the encapsulant need not necessarily contact the chip. For instance, a glob-top coating can be deposited on the chip after attaching the chip to the routing line, and then the encapsulant can be formed on the glob-top coating.

The insulative base may be rigid or flexible, and can be various dielectric films or prepregs formed from numerous organic or inorganic insulators such as tape (polyimide), epoxy, silicone, glass, aramid and ceramic. Organic insulators are preferred for low cost, high dielectric applications, whereas inorganic insulators are preferred when high thermal dissipation and a matched thermal coefficient of expansion are important. For instance, the insulative base can initially be an epoxy paste that includes an epoxy resin, a curing agent, an accelerator and a filler, that is subsequently cured or hardened to form a solid adherent insulative layer. The filler can be an inert material such as silica (powdered fused quartz) that improves thermal conductivity, thermal shock resistance and thermal coefficient of expansion matching. Organic fiber reinforcement may also be used in resins such as epoxy, cyanate ester, polyimide, PTFE and combinations thereof. Fibers that may be used include aramid, polyester, polyamide, poly-ether-ether-ketone, polyimide, polyetherimide and polysulfone. The fiber reinforcement can be woven fabric, woven glass, random microfiber glass, woven quartz, woven, aramid, non-woven fabric, non-woven aramid fiber or paper. Commercially available dielectric materials such as SPEEDBOARD C prepreg by W. L. Gore & Associates of Eau Claire, Wis. are suitable.

The insulative base can be deposited in numerous manners, including printing and transfer molding. Furthermore, the insulative base can be formed before or after attaching the chip to the routing line.

The insulative base can have its lower portion removed using a wide variety of techniques including grinding (including mechanical polishing and chemical-mechanical polishing), blanket laser ablation and blanket plasma etching. Likewise, the insulative base can have a selected portion below the metal pillar removed using a wide variety of techniques including selective laser ablation, selective plasma etching and photolithography.

The insulative base can be laterally aligned with the pillar etch mask along a downwardly facing surface that extends downwardly beyond the routing line and the metal pillar by grinding the insulative base without grinding the pillar etch mask, the metal pillar or the routing line, then grinding the insulative base and the pillar etch mask without grinding the metal pillar or the routing line, and then discontinuing the grinding before reaching the metal pillar. Likewise, the insulative base can be laterally aligned with the contact terminal along a downwardly facing surface that extends downwardly beyond the routing line and the metal pillar by grinding the insulative base without grinding the contact terminal, the metal pillar or the routing line, then grinding the insulative base and the contact terminal without grinding the metal pillar or the routing line, and then discontinuing the grinding before reaching the metal pillar. Likewise, the insulative base can be laterally aligned with the metal pillar along a downwardly facing surface that extends downwardly beyond the routing line by grinding the insulative base without grinding the metal pillar or the routing line, then grinding the insulative base and the metal pillar without grinding the routing line, and then discontinuing the grinding before reaching the routing line.

The connection joint can be formed from a wide variety of materials including copper, gold, nickel, palladium, tin, alloys thereof, and combinations thereof, can be formed by a wide variety of processes including electroplating, electroless plating, ball bonding, wire bonding, stud bumping, solder reflowing, conductive adhesive curing, and welding, and can have a wide variety of shapes and sizes. The shape and composition of the connection joint depends on the composition of the routing line as well as design and reliability considerations. Further details regarding an electroplated connection joint are disclosed in U.S. application Ser. No. 09/865,367 filed May 24, 2001 by Charles W. C. Lin entitled "Semiconductor Chip Assembly with Simultaneously Electroplated Contact Terminal and Connection Joint" which is incorporated by reference. Further details regarding an electrolessly plated connection joint are disclosed in U.S. application Ser. No. 09/864,555 filed May 24, 2001 by Charles W. C. Lin entitled "Semiconductor Chip Assembly with Simultaneously Electrolessly Plated Contact Terminal and Connection Joint" which is incorporated by reference. Further details regarding a ball bond connection joint are disclosed in U.S. Application Serial No. 09/864,773 filed May 24, 2001 by Charles W. C. Lin entitled "Semiconductor Chip Assembly with Ball Bond Connection Joint" which is incorporated by reference. Further details regarding a solder or conductive adhesive connection joint are disclosed in U.S. application Ser. No. 09/927,216 filed Aug. 10, 2001 by Charles W. C. Lin entitled "Semiconductor Chip Assembly with Hardened Connection Joint" which is incorporated by reference. Further details regarding a welded connection joint are disclosed in U.S. application Ser. No. 10/302,642 filed Nov. 23, 2002 by Cheng-Lien Chiang et al. entitled "Method of Connecting a Conductive Trace to a Semiconductor Chip Using Plasma Undercut Etching" which is incorporated by reference.

After the connection joint is formed, if a plating bus exists then it is disconnected from the conductive trace. The plating bus can be disconnected by mechanical sawing, laser cutting, chemical etching, and combinations thereof. If the plating bus is disposed about the periphery of the assembly but is not integral to the assembly, then the plating bus can be disconnected when the assembly is singulated from other assemblies. However, if the plating bus is integral to the assembly, or singulation has already occurred, then a photolithography step can be added to selectively cut related circuitry on the assembly that is dedicated to the plating bus since this circuitry would otherwise short the conductive traces together. Furthermore, the plating bus can be disconnected by etching the metal base.

A soldering material or solder ball can be deposited on the conductive trace by plating or printing or placement techniques if required for the next level assembly. However, the next level assembly may not require that the semiconductor chip assembly contain solder. For instance, in land grid array (LGA) packages, the soldering material is normally provided by the panel rather than the contact terminals on the semiconductor chip assembly.

Various cleaning steps, such as a brief oxygen plasma cleaning step, or a brief wet chemical cleaning step using a solution containing potassium permanganate, can be applied to the structure at various stages, such as immediately before forming the connection joint to clean the conductive trace and the pad.

It is understood that, in the context of the present invention, any chip embedded in the encapsulant is electrically connected to the metal pillar by an electrically conductive path that includes the routing line means that the routing line is in an electrically conductive path between the metal pillar and any chip embedded in the encapsulant. This is true regardless of whether a single chip is embedded in the encapsulant (in which case the chip is electrically connected to the metal pillar by an electrically conductive path that includes the routing line) or multiple chips are embedded in the encapsulant (in which case each of the chips is electrically connected to the metal pillar by an electrically conductive path that includes the routing line). This is also true regardless of whether the electrically conductive path includes or requires a connection joint and/or a plated contact between the routing line and the chip. This is also true regardless of whether the electrically conductive path includes or requires a passive component such as a capacitor or a resistor. This is also true regardless of whether multiple chips are electrically connected to the routing line by multiple connection joints, and the multiple connection joints are electrically connected to one another only by the routing line. This is also true regardless of whether multiple chips are electrically connected to the metal pillar by different electrically conductive paths (such as the multiple connection joint example described above) as long as each of the electrically conductive paths includes the routing line.

It is also understood that, in the context of the present invention, the wet chemical etch that forms the metal pillar need not begin to form the metal pillar. For instance, a first wet chemical etch can form the pillar tip and the tip sidewall portion, and a second wet chemical etch can form the pillar base and the base sidewall portion. In this instance, the second wet chemical etch completes formation of the metal pillar and thus forms the metal pillar.

It is also understood that, in the context of the present invention, the metal pillar can include tapered sidewalls that are adjacent to and extend between the pillar base and the pillar tip and slant inwardly even though the inward slant may not be constant. For instance, the tapered sidewalls can slant inwardly even if a portion of the tapered sidewalls adjacent to the spike slants outwardly as long as the pillar base has a larger diameter than the pillar tip and the tapered sidewalls mostly slant inwardly as they extend from the pillar base to the pillar tip. Likewise, the base sidewall portion can slant inwardly even though the inward slant may not be constant. For instance, the base sidewall portion can slant inwardly even if a portion of the base sidewall portion adjacent to the spike slants outwardly as long as the pillar base has a larger diameter than the spike and the base sidewall portion mostly slants inwardly as it extends from the pillar base to the spike. Likewise, the tip sidewall portion can slant inwardly even though the inward slant may not be constant. For instance, the tip sidewall portion can slant inwardly even if a portion of the tip sidewall portion adjacent to the pillar etch mask slants outwardly as long as the spike has a larger diameter than the pillar tip and the tip sidewall portion mostly slants inwardly as it extends from the spike to the pillar tip.

It is also understood that, in the context of the present invention, the spike can protrude laterally from the metal pillar even if the spike also protrudes in the upward or downward direction. For instance, the spike can protrude laterally from the metal pillar even if the spike protrudes 15, 30, 45, 60 or 75 degrees in the downward direction relative to the lateral plane.

It is also understood that, in the context of the present invention, the contact is terminal can include the flange of the pillar etch mask even though the flange may be altered between forming the pillar etch mask and forming the contact terminal. For instance, the shape of the flange may be slightly altered during intervening process steps such as the wet chemical etch that forms the metal pillar, the cure that forms the insulative base, the grinding that exposes the pillar etch mask and the solder reflow that forms the contact terminal. Likewise, the solder reflow that forms the contact terminal may reflow the flange and alter the composition of the flange. In each instance, the flange maintains essentially constant size, shape and location and therefore the contact terminal includes the flange. Similarly, the contact terminal includes the flange if the contact terminal is provided by the pillar etch mask.

The "upward" and "downward" vertical directions do not depend on the orientation of the assembly, as will be readily apparent to those skilled in the art. For instance, the encapsulant extends vertically beyond the routing line in the "upward" direction, the metal pillar extends vertically beyond the chip in the "downward" direction and the insulative base extends vertically beyond the encapsulant in the "downward" direction, regardless of whether the assembly is inverted and/or mounted on a printed circuit board. Likewise, the routing line extends "laterally" beyond the metal pillar regardless of whether the assembly is inverted, rotated or slated. Thus, the "upward" and "downward" directions are opposite one another and orthogonal to the "lateral" direction, and the "laterally aligned" surfaces are coplanar with one another in a lateral plane orthogonal to the upward and downward directions. Moreover, the chip is shown above the routing line, the metal pillar and the insulative base, and the encapsulant is shown above the chip, the routing line, the metal pillar and the insulative base with a single orientation throughout the drawings for ease of comparison between the figures, although the assembly and its components may be inverted at various manufacturing stages.

The working format for the semiconductor chip assembly can be a single assembly or multiple assemblies based on the manufacturing design. For instance, a single assembly that includes a single chip can be manufactured individually. Alternatively, numerous assemblies can be simultaneously batch manufactured on a single metal base with a single encapsulant and a single insulative base then separated from one another. For example, the trenches for multiple assemblies can be simultaneously etched in the metal base, then the metal layers for multiple assemblies can be simultaneously electroplated on the metal base and into the trenches, then the routing lines for multiple assemblies can be simultaneously electroplated on the metal base, then the plated contacts can be simultaneously electroplated on the corresponding routing lines, then separate spaced solder pastes for the respective etch masks can be selectively disposed on the corresponding metal layers, then the solder pastes can be simultaneously reflowed to form the solder layers and the pillar etch masks, then separate spaced adhesives for the respective assemblies can be selectively disposed on the metal base, then the chips can be disposed on the corresponding adhesives, then the adhesives can be simultaneously fully cured, then the connection joints can be formed on the corresponding plated contacts and pads, then the encapsulant can be formed, then the metal base can be etched to simultaneously form the metal pillars, then the insulative base can be formed, then the insulative base and the pillar etch masks can be simultaneously grinded, then separate spaced solder balls for the respective pillar etch masks can be selectively disposed on the corresponding solder layers, then the solder layers and solder balls can be simultaneously reflowed to form the contact terminals, and then the encapsulant and the insulative base can be cut, thereby separating the individual single chip-substrate assemblies.

The semiconductor chip assembly can have a wide variety of packaging formats as required by the next level assembly. For instance, the conductive traces can be configured so that the assembly is a grid array such as a ball grid array (BGA), column grid array (CGA), land grid array (LGA) or pin grid array (PGA).

The semiconductor chip assembly can be a first-level package that is a single-chip package (such as the first to fourteenth embodiments) or a multi-chip package (such as the fifteenth embodiment). Furthermore, a multi-chip first-level package can include chips that are stacked and vertically aligned with one another or are coplanar and laterally aligned with one another.

Advantageously, the semiconductor chip assembly of the present invention is reliable and inexpensive. The encapsulant and the insulative base can protect the chip from handling damage, provide a known dielectric barrier for the conductive trace and protect the assembly from contaminants and unwanted solder reflow during the next level assembly. The encapsulant can provide mechanical support for the conductive trace as the metal base is etched to form the metal pillar. In addition, the metal pillar can have a precision-formed pillar tip, thereby improving accuracy and microelectronic packaging density. What's more, the contact terminal can be interlocked to the metal pillar, thereby improving reliability. The mode of the connection can shift from the initial mechanical coupling to metallurgical coupling to assure sufficient metallurgical bond strength. Furthermore, the conductive trace can be mechanically and metallurgically coupled to the chip without wire bonding, TAB, solder or conductive adhesive, although the process is flexible enough to accommodate these techniques if desired. The process is highly versatile and permits a wide variety of mature connection joint technologies to be used in a unique and improved manner. Furthermore, the metal pillar is particularly well-suited for reducing thermal mismatch related stress in the next level assembly and yields enhanced reliability for the next level assembly that exceeds that of conventional BGA packages. As a result, the assembly of the present invention significantly enhances throughput, yield and performance characteristics compared to conventional packaging techniques. Moreover, the assembly of the present invention is well-suited for use with materials compatible with copper chip requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

We claim:

1. A semiconductor chip assembly, comprising:
   a semiconductor chip that includes first and second opposing surfaces, wherein the first surface of the chip includes a conductive pad;
   a conductive trace that includes a routing line, a metal pillar and a contact terminal, wherein
      the routing line extends laterally beyond the metal pillar and the contact terminal;
      the metal pillar includes first and second opposing surfaces and sidewalls therebetween, the first surface of the metal pillar faces in a first direction and contacts and is non-integral with the routing line, the second surface of the metal pillar faces in a second direction opposite the first direction, is spaced from the routing line and contacts and is non-integral with the contact terminal, the sidewalls include first and second sidewall portions that are adjacent to one another, the first sidewall portion is adjacent to the first surface of the metal pillar, is spaced from the second surface of the metal pillar and extends vertically beyond the second sidewall portion in the first direction, and the second sidewall portion is adjacent to the second surface of the metal pillar, is spaced from the first surface of the metal pillar and extends vertically beyond the first sidewall portion in the second direction; and
      the contact terminal includes a body and a flange and is spaced from the routing line, the first surface of the metal pillar and the first sidewall portion, the body contacts the second surface of the metal pillar, is spaced from the second sidewall portion, is adjacent to the flange, covers and extends vertically beyond the second surface of the metal pillar and the flange in the second direction and includes a solder surface that faces in the second direction, and the flange extends vertically beyond the body in the first direction, contacts and extends laterally beyond the second sidewall portion, is spaced from the second surface of the metal pillar and includes solder;
   a connection joint that electrically connects the routing line and the pad;
   an encapsulant; and
   an insulative base, wherein the chip is embedded in the encapsulant, the metal pillar is embedded in the insulative base and extends vertically beyond the routing line in the second direction, the body is not covered in the second direction by any material of the assembly, the encapsulant contacts the chip and extends vertically beyond the routing line, the metal pillar, the contact terminal, the connection joint and the insulative base in the first direction, and the insulative base contacts the routing line, the metal pillar and the contact terminal, is overlapped by the chip, extends vertically beyond the contact terminal in the first direction and extends vertically beyond the chip, the routing line, the metal pillar, the flange, the connection joint and the encapsulant in the second direction.

2. The assembly of claim 1, wherein the routing line is essentially flat and parallel to the first and second surfaces of the chip.

3. The assembly of claim 1, wherein the metal pillar has a generally conical shape with a diameter that substantially continuously decreases from the first surface of the metal pillar to the second surface of the metal pillar.

4. The assembly of claim 1, wherein the metal pillar excludes solder.

5. The assembly of claim 1, wherein the metal pillar is copper.

6. The assembly of claim 1, wherein the metal pillar is disposed vertically beyond the chip, the routing line, the connection joint and the encapsulant in the second direction.

7. The assembly of claim 1, wherein the metal pillar is a single-piece metal that excludes solder, the sidewalls consist of the first and second sidewall portions, the contact terminal contacts most or all of the second sidewall portion, and the insulative base contacts most or all of the first sidewall portion.

8. The assembly of claim 7, wherein the contact terminal contacts all of the second sidewall portion.

9. The assembly of claim 7, wherein the insulative base contacts all of the first sidewall portion.

10. The assembly of claim 7, wherein the insulative base contacts the body and the flange.

11. The assembly of claim 7, wherein the contact terminal contacts all of the second sidewall portion, and the insulative base contacts the body, the flange and all of the first sidewall portion.

12. The assembly of claim 1, wherein the first sidewall portion is a continuous concave arc, the second sidewall portion is a continuous concave arc, and the first and second sidewall portions are adjacent to one another at a spike in the metal pillar that protrudes laterally from and spans 360 degrees laterally around the metal pillar and is spaced from the first and second surfaces of the metal pillar.

13. The assembly of claim 1, wherein the second surface of the metal pillar is flat and parallel to the first and second surfaces of the chip, a surface area of the second surface of the metal pillar is disposed within a surface area of the first surface of the metal pillar, and the surface area of the first surface of the metal pillar is at least 20 percent larger than the surface area of the second surface of the metal pillar.

14. The assembly of claim 1, wherein the contact terminal is mostly but not entirely solder.

15. The assembly of claim 14, wherein the body is mostly but not entirely solder, and the flange is mostly but not entirely solder.

16. The assembly of claim 15, wherein the metal pillar is a single-piece metal that excludes solder.

17. The assembly of claim 1, wherein the contact terminal is solder.

18. The assembly of claim 1, wherein the contact terminal consists of a metal layer and a solder layer, the metal layer contacts and is sandwiched between the solder layer and the metal pillar, extends vertically beyond the solder layer in the first direction and has a different composition than the solder layer, and the solder layer is spaced from the metal pillar, extends vertically beyond the metal layer in the second direction and provides the solder surface and a portion of the flange.

19. The assembly of claim 18, wherein the metal layer is solder.

20. The assembly of claim 18, wherein the metal layer excludes solder.

21. The assembly of claim 1, wherein the solder surface is dome shaped.

22. The assembly of claim 1, wherein the solder surface is flat.

23. The assembly of claim 1, wherein the flange is proximate to a periphery of the body.

24. The assembly of claim 23, wherein the flange is adjacent to the periphery of the body.

25. The assembly of claim 23, wherein the flange is spaced from the periphery of the body by a flat lateral surface of the body and disposed within the periphery of the body.

26. The assembly of claim 1, wherein the flange spans 360 degrees laterally around the metal pillar.

27. The assembly of claim 1, wherein the flange has an annular shape in a lateral plane orthogonal to the first and second directions.

28. The assembly of claim 1, wherein the flange has a hemispherical cross-sectional shape in a vertical plane parallel to the first and second directions.

29. The assembly of claim 1, wherein the flange spans 360 degrees laterally around the metal pillar, has an annular shape in a lateral plane orthogonal to the first and second directions and has a hemispherical cross-sectional shape in a vertical plane parallel to the first and second directions.

30. The assembly of claim 1, wherein the flange has a donut shape.

31. The assembly of claim 1, wherein the flange includes an interlocking surface that faces in the first direction, extends laterally from an inner diameter of the flange to an outer diameter of the flange and contacts the metal pillar and the insulative base, and the inner and outer diameters are adjacent to the body.

32. The assembly of claim 31, wherein the interlocking surface is a convex arc with substantially constant curvature as the interlocking surface extends laterally from the inner diameter to the outer diameter.

33. The assembly of claim 31, wherein the interlocking surface contacts the metal pillar adjacent to the inner diameter and the insulative base adjacent to the outer diameter.

34. The assembly of claim 31, wherein the interlocking surface consists of inner and outer surface portions that are adjacent to one another, the inner surface portion is adjacent to the inner diameter and spaced from the outer diameter, the outer surface portion is adjacent to the outer diameter and spaced from the inner diameter, all of the inner surface portion contacts the metal pillar, and all of the outer surface portion contacts the insulative base.

35. The assembly of claim 31, wherein the interlocking surface is a convex arc with substantially constant curvature as the interlocking surface extends laterally from the inner diameter to the outer diameter, the interlocking surface contacts the metal pillar adjacent to the inner diameter and the insulative base adjacent to the outer diameter, the interlocking surface consists of inner and outer surface portions that are adjacent to one another, the inner surface portion is adjacent to the inner diameter and spaced from the outer diameter, the outer surface portion is adjacent to the outer diameter and spaced from the inner diameter, all of the inner surface portion contacts the metal pillar, and all of the outer surface portion contacts the insulative base.

36. The assembly of claim 1, wherein the flange protrudes in the first direction to a flange tip that is a first distance in the first direction from the first surface of the metal pillar and a second distance in the second direction from the second surface of the metal pillar, and the first distance is greater than the second distance.

37. The assembly of claim 36, wherein the first distance is at most four times the second distance.

38. The assembly of claim 36, wherein the first distance is about two times the second distance.

39. The assembly of claim 36, wherein the first and second distances are constant as the flange spans 360 degrees laterally around the metal pillar.

40. The assembly of claim 1, wherein the assembly is a first-level package.

41. A semiconductor chip assembly, comprising:
a semiconductor chip that includes first and second opposing surfaces, wherein the first surface of the chip includes a conductive pad;
a conductive trace that includes a routing line, a metal pillar and a contact terminal, wherein
the routing line extends laterally beyond the metal pillar and the contact terminal;
the metal pillar includes first and second opposing surfaces and sidewalls therebetween, the first surface of the metal pillar faces in a first direction and contacts and is non-integral with the routing line, the second surface of the metal pillar faces in a second direction opposite the first direction, is spaced from the routing line and contacts and is non-integral with the contact terminal, the sidewalls include first and second sidewall portions that are adjacent to one another, the first sidewall portion is adjacent to the first surface of the metal pillar, is spaced from the second surface of the metal pillar and extends vertically beyond the second sidewall portion in the first direction, and the second sidewall portion is adjacent to the second surface of the metal pillar, is spaced from the first surface of the metal pillar and extends vertically beyond the first sidewall portion in the second direction; and
the contact terminal includes a body and a flange, is spaced from the routing line, the first surface of the metal pillar and the first sidewall portion and is solder, the body contacts the second surface of the metal pillar, is spaced from the second sidewall portion, is adjacent to the flange, covers and extends vertically beyond the second surface of the metal pillar and the flange in the second direction and includes a solder surface that faces in the second direction, and the flange extends vertically beyond the body in the first direction, contacts and covers and extends laterally beyond the second sidewall portion, is spaced from the second surface of the metal pillar and spans 360 degrees laterally around the metal pillar;
a connection joint that electrically connects the routing line and the pad;
an encapsulant; and
an insulative base, wherein the chip is embedded in the encapsulant, the metal pillar is embedded in the insulative base and extends vertically beyond the routing line in the second direction, the body is not covered in the second direction by any material of the assembly, the encapsulant contacts the chip and extends vertically beyond the chip, the routing line, the metal pillar, the contact terminal, the connection joint and the insulative base in the first direction, and the insulative base contacts the routing line, the metal pillar, the body and the flange, is overlapped by the chip, extends vertically beyond the contact terminal in the first direction and extends vertically beyond the chip, the routing line, the metal pillar, the flange, the connection joint and the encapsulant in the second direction.

42. The assembly of claim 41, wherein the metal pillar has a generally conical shape with a diameter that substantially continuously decreases from the first surface of the metal pillar to the second surface of the metal pillar.

43. The assembly of claim 41, wherein the metal pillar is a single-piece metal that excludes solder, the sidewalls consist of the first and second sidewall portions, the contact terminal contacts all of the second sidewall portion, and the insulative base contacts all of the first sidewall portion.

44. The assembly of claim 41, wherein the first sidewall portion is a continuous concave arc, the second sidewall portion is a continuous concave arc, the first and second sidewall portions are adjacent to one another at a spike in the metal pillar that protrudes laterally from and spans 360 degrees laterally around the metal pillar and is spaced from the first and second surfaces of the metal pillar, the second surface of the metal pillar is flat and parallel to the first and second surfaces of the chip, a surface area of the second surface of the metal pillar is disposed within a surface area of the first surface of the metal pillar, and the surface area of the first surface of the metal pillar is at least 20 percent larger than the surface area of the second surface of the metal pillar.

45. The assembly of claim 41, wherein the contact terminal consists of first and second solder layers, the first solder layer contacts and is sandwiched between the second solder layer and the metal pillar, extends vertically beyond the second solder layer in the first direction and has a different composition than the second solder layer, and the second solder layer is spaced from the metal pillar, extends vertically beyond the first solder layer in the second direction, is substantially thicker than the first solder layer and provides the solder surface and a portion of the flange.

46. The assembly of claim 41, wherein the flange is spaced from a periphery of the body by a flat lateral surface of the body and disposed within the periphery of the body.

47. The assembly of claim 41, wherein the flange has an annular shape in a lateral plane orthogonal to the first and second directions and a hemispherical cross-sectional shape in a vertical plane parallel to the first and second directions.

48. The assembly of claim 41, wherein the flange includes an interlocking surface that faces in the first direction, extends laterally from an inner diameter of the flange to an outer diameter of the flange and contacts the metal pillar and the insulative base, the inner and outer diameters are adjacent to the body, the interlocking surface is a convex arc with substantially constant curvature as the interlocking surface extends laterally from the inner diameter to the outer diameter, the interlocking surface contacts the metal pillar adjacent to the inner diameter and the insulative base adjacent to the outer diameter, the interlocking surface consists of inner and outer surface portions that are adjacent to one another, the inner surface portion is adjacent to the inner diameter and spaced from the outer diameter, the outer surface portion is adjacent to the outer diameter and spaced from the inner diameter, all of the inner surface portion contacts the metal pillar, and all of the outer surface portion contacts the insulative base.

49. The assembly of claim 41, wherein the flange protrudes in the first direction to a flange tip that is a first distance in the first direction from the first surface of the metal pillar and a second distance in the second direction from the second surface of the metal pillar, and the first distance is greater than and at most four times the second distance.

50. The assembly of claim 41, wherein the flange includes an interlocking surface that faces in the first direction, extends laterally from an inner diameter of the flange to an outer diameter of the flange and contacts the metal pillar and the insulative base, the inner and outer diameters are adjacent to the body, the interlocking surface is a convex arc with substantially constant curvature as the interlocking surface extends laterally from the inner diameter to the outer diameter, the interlocking surface contacts the metal pillar adjacent to the inner diameter and the insulative base adjacent to the outer diameter, the interlocking surface consists of inner and outer surface portions that are adjacent to one another, the inner surface portion is adjacent to the inner diameter and spaced from the outer diameter, the outer surface portion is adjacent to the outer diameter and spaced from the inner diameter, all of the inner surface portion contacts the metal pillar, all of the outer surface portion contacts the insulative base, the flange protrudes in the first direction to a flange tip that is a first distance in the first direction from the first surface of the metal pillar and a second distance in the second direction from the second surface of the metal pillar, and the first distance is greater than and at most four times the second distance.

51. A semiconductor chip assembly, comprising:
a semiconductor chip that includes first and second opposing surfaces, wherein the first surface of the chip includes a conductive pad;
a conductive trace that includes a routing line, a metal pillar and a contact terminal, wherein
the routing line extends laterally beyond the metal pillar and the contact terminal;
the metal pillar includes first and second opposing surfaces and sidewalls therebetween, the first surface of the metal pillar faces in a first direction and contacts and is non-integral with the routing line, the second surface of the metal pillar faces in a second direction opposite the first direction, is spaced from the routing line and contacts and is non-integral with the contact terminal, the sidewalls include first and second sidewall portions that are adjacent to one another, the first sidewall portion is adjacent to the first surface of the metal pillar, is spaced from the second surface of the metal pillar and extends vertically beyond the second sidewall portion in the first direction, and the second sidewall portion is adjacent to the second surface of the metal pillar, is spaced from the first surface of the metal pillar and extends vertically beyond the first sidewall portion in the second direction; and
the contact terminal includes a body and a flange and is spaced from the routing line, the first surface of the metal pillar and the first sidewall portion, the body contacts the second surface of the metal pillar, is spaced from the second sidewall portion, is adjacent to the flange, covers and extends vertically beyond the second surface of the metal pillar and the flange in the second direction and includes a solder surface that faces in the second direction, the flange extends vertically beyond the body in the first direction, contacts and covers and extends laterally beyond the second sidewall portion, is spaced from the second surface of the metal pillar, includes solder and spans 360 degrees laterally around the metal pillar, the contact terminal consists of a metal layer and a solder layer, the metal layer contacts and is sandwiched between the solder layer and the metal pillar, extends vertically beyond the solder layer in the first direction and excludes solder, and the solder layer is spaced from the metal pillar, extends vertically beyond the metal layer in the second direction and provides the solder surface and a portion of the flange;

a connection joint that electrically connects the routing line and the pad;

an encapsulant; and an insulative base, wherein the chip is embedded in the encapsulant, the metal pillar is embedded in the insulative base and extends vertically beyond the routing line in the second direction, the body is not covered in the second direction by any material of the assembly, the encapsulant contacts the chip and extends vertically beyond the chip, the routing line, the metal pillar, the contact terminal, the connection joint and the insulative base in the first direction, and the insulative base contacts the routing line, the metal pillar, the body and the flange, is overlapped by the chip, extends vertically beyond the contact terminal in the first direction and extends vertically beyond the chip, the routing line, the metal pillar, the flange, the connection joint and the encapsulant in the second direction.

52. The assembly of claim 51, wherein the metal pillar has a generally conical shape with a diameter that substantially continuously decreases from the first surface of the metal pillar to the second surface of the metal pillar.

53. The assembly of claim 51, wherein the metal pillar is a single-piece metal that excludes solder, the sidewalls consist of the first and second sidewall portions, the contact terminal contacts all of the second sidewall portion, and the insulative base contacts all of the first sidewall portion.

54. The assembly of claim 51, wherein the first sidewall portion is a continuous concave arc, the second sidewall portion is a continuous concave arc, the first and second sidewall portions are adjacent to one another at a spike in the metal pillar that protrudes laterally from and spans 360 degrees laterally around the metal pillar and is spaced from the first and second surfaces of the metal pillar, the second surface of the metal pillar is flat and parallel to the first and second surfaces of the chip, a surface area of the second surface of the metal pillar is disposed within a surface area of the first surface of the metal pillar, and the surface area of the first surface of the metal pillar is at least 20 percent larger than the surface area of the second surface of the metal pillar.

55. The assembly of claim 51, wherein the solder layer is substantially thicker than the metal layer.

56. The assembly of claim 51, wherein the flange is spaced from a periphery of the body by a flat lateral surface of the body and disposed within the periphery of the body.

57. The assembly of claim 51, wherein the flange has an annular shape in a lateral plane orthogonal to the first and second directions and a hemispherical cross-sectional shape in a vertical plane parallel to the first and second directions.

58. The assembly of claim 51, wherein the flange includes an interlocking surface that faces in the first direction, extends laterally from an inner diameter of the flange to an outer diameter of the flange and contacts the metal pillar and the insulative base, the inner and outer diameters are adjacent to the body, the interlocking surface is a convex arc with substantially constant curvature as the interlocking surface extends laterally from the inner diameter to the outer diameter, the interlocking surface contacts the metal pillar adjacent to the inner diameter and the insulative base adjacent to the outer diameter, the interlocking surface consists of inner and outer surface portions that are adjacent to one another, the inner surface portion is adjacent to the inner diameter and spaced from the outer diameter, the outer surface portion is adjacent to the outer diameter and spaced from the inner diameter, all of the inner surface portion contacts the metal pillar, and all of the outer surface portion contacts the insulative base.

59. The assembly of claim 51, wherein the flange protrudes in the first direction to a flange tip that is a first distance in the first direction from the first surface of the metal pillar and a second distance in the second direction from the second surface of the metal pillar, and the first distance is greater than and at most four times the second distance.

60. The assembly of claim 51, wherein the flange includes an interlocking surface that faces in the first direction, extends laterally from an inner diameter of the flange to an outer diameter of the flange and contacts the metal pillar and the insulative base, the inner and outer diameters are adjacent to the body, the interlocking surface is a convex arc with substantially constant curvature as the interlocking surface extends laterally from the inner diameter to the outer diameter, the interlocking surface contacts the metal pillar adjacent to the inner diameter and the insulative base adjacent to the outer diameter, the interlocking surface consists of inner and outer surface portions that are adjacent to one another, the inner surface portion is adjacent to the inner diameter and spaced from the outer diameter, the outer surface portion is adjacent to the outer diameter and spaced from the inner diameter, all of the inner surface portion contacts the metal pillar, all of the outer surface portion contacts the insulative base, the flange protrudes in the first direction to a flange tip that is a first distance in the first direction from the first surface of the metal pillar and a second distance in the second direction from the second surface of the metal pillar, and the first distance is greater than and at most four times the second distance.

* * * * *